(12) United States Patent
Zurbuchen

(10) Patent No.: US 7,713,640 B2
(45) Date of Patent: May 11, 2010

(54) EPITAXIAL LAYER STRUCTURES, PRECURSORS FOR TOPOTACTIC ANION EXCHANGE FILMS

(76) Inventor: Mark A. Zurbuchen, 3606 Kanawha St. NW., Washington, DC (US) 20015

( * ) Notice: Subject to any disclaimer, the term of this patent is extended or adjusted under 35 U.S.C. 154(b) by 881 days.

(21) Appl. No.: 11/425,406

(22) Filed: Jun. 21, 2006

(65) Prior Publication Data

US 2006/0234066 A1    Oct. 19, 2006

Related U.S. Application Data

(62) Division of application No. 10/997,014, filed on Nov. 24, 2004, now Pat. No. 7,208,044.

(51) Int. Cl.
  *B32B 9/04* (2006.01)
(52) U.S. Cl. .................. 428/704; 428/688; 428/689; 428/697; 428/699; 428/700; 428/701; 428/702
(58) Field of Classification Search .......... 428/688, 428/689, 697, 698, 699, 700, 701, 702, 704
  See application file for complete search history.

(56) References Cited

U.S. PATENT DOCUMENTS

| 3,980,763 | A | 9/1976 | Mullhaupt |
| 5,262,347 | A | 11/1993 | Sands |
| 5,589,284 | A | 12/1996 | Summerfelt et al. |
| 5,801,105 | A | 9/1998 | Yano et al. |
| 6,013,553 | A | 1/2000 | Wallace et al. |
| 6,045,626 | A | 4/2000 | Yano et al. |
| 6,258,459 | B1 | 7/2001 | Noguchi et al. |
| 6,291,866 | B1 | 9/2001 | Wallace et al. |
| 6,436,801 | B1 | 8/2002 | Wilk et al. |
| 6,573,209 | B1 | 6/2003 | Sambasivan et al. |
| 6,642,539 | B2 | 11/2003 | Ramesh et al. |
| 6,645,639 | B1 | 11/2003 | Sambasivan et al. |
| 6,784,139 | B1 | 8/2004 | Sankar et al. |
| 2004/0011280 | A1 | 1/2004 | Takamitsu et al. |

FOREIGN PATENT DOCUMENTS

WO    WO 9303880    4/1993

OTHER PUBLICATIONS

Krusin-Elbaum, et al., "Oxidation Kinetics of ZrN Thin Films," 1983, pp. 111-117, Electronics and Optics, Elsevier Sequoia, The Netherlands.

Sleight, et al., "Crystal Chemistry of the Rare Earth Sesquisulfides," Nov. 1968, pp. 2282-2288, Inorganic Chemistry, vol. 7, No. 11.

(Continued)

*Primary Examiner*—Gwendolyn Blackwell
(74) *Attorney, Agent, or Firm*—Ryndak & Suri LLP

(57) ABSTRACT

This invention disclosure describes methods for the fabrication of metal oxide films on surfaces by topotactic anion exchange, and laminate structures enabled by the method. A precursor metal-nonmetal film is deposited on the surface, and is subsequently oxidized via topotactic anion exchange to yield a topotactic metal-oxide product film. The structures include a metal-oxide layer(s) and/or a metal-nonmetal layer(s).

52 Claims, 22 Drawing Sheets

OTHER PUBLICATIONS

López-Cartes, et al., "In situ transmission electron microscopy investigation of Ce(iv) and Pr(iv) reducibility in a Rh (1%))/Ce$_{0.8}$Pr$_{0.2}$O$_{2-x}$ catalyst," 2003, pp. 644-645, Chem Comm Communication.

Schleid, "The Influence of Light Anions (O$^{2-}$, N$^{3-}$and F$^{31}$) on the Crystal Chemistry of Rare-Earth Metal Trichlorides and Sesquisulfides," 1999, pp. 163-168, Materials Science Forum vols. 315-317, Trans Tech Publications, Switzerland.

Hyde, et al., "On the Praseodymium + Oxygen System," May 19, 1966, pp. 583-614, Philosophical Transactions of the Royal Society of London, Series A, vol. 259, The Royal Society, London.

Thomas, "Review Lecture Topography and Topology in Solid-State Chemistry," Nov. 14, 1974, pp. 251-286, Philosophical Transactions of the Royal Society of London, Series A, vol. 277, The Royal Society, London.

Sawyer, et al., "Fluorite-Related Homologous Series in the Rare Earth Oxides," pp. 1190-1199, Colloque International Du C.N.R.S.

Tallman, et al., "Electrical Properties and Defect Structure of Y$_2$O$_3$," Aug. 21, 1966, pp. 401-404, Journal of the American Ceramic Society, vol. 49, No. 8.

Cheng, et al., "Role of Anion Vacancies in Nitrogen-Stabilized Zirconia," Mar. 1993, pp. 683-688, Journal of the American Ceramic Society, vol. 76, No. 3.

Manabe, et al., "Topotaxy of Corundum-Type Tetramagnesium Diniobate and Ditantalate Layers on Rock-Salt-Type Magnesium Oxide Substrates," Aug. 1999, pp. 2061-2065, Journal of the American Ceramic Society, vol. 82, No. 8.

Stanek, et al., "Prediction of Rare-Earth A$_2$Hf$_2$O$_7$ Pyrochlore Phases," Aug. 2002, pp. 2139-2141, Communications of the American Ceramic Society, vol. 85, No. 8.

López-Cartes, et al., "Rare-earth oxides with fluorite-related structures: their systematic investigation using HREM images, image simulations and electron diffraction pattern simulations," 1999, pp. 19-39, Ultramicroscopy 80, Elsevier Science B.V.

Schwab, et al., "Beiträge zur Untersuchung der Halbleitung in den Europiumsesquioxiden," 1968, pp. 1549-1554, Halbleitung in den Europiumsesquioxiden.

Amberg, et al., "Metastable cubic and tetragonal zirconium dioxide, prepared by thermal oxidation of the dichalcogenides," 1996, pp. 313-321, Solid State Ionics 84, Elsevier Science B.V.

Linares, "Growth and Properties of CeO$_2$ and ThO$_2$ Single Cyrstals," 1967, pp. 1285-1291, J. Phys. Chem. Solids, vol. 28, Pergamon Press, Great Britain.

Walker, et al., "Thin-Film Perovskites—Ferroelectric Materials for Integrated Optics," 1996, pp. 221-227, NanoStructured Materials, vol. 7, Nos. 1/2, Elsevier Science Ltd., USA.

Fievet, et al., "Preparation and Study by Electron Microscopy of the Development of Texture with Temperature of a Porous Exhydroxide Nickel Oxide," 1975, pp. 350-356, Academic Press, Inc.

Caillet, et al., "Étude de la Corrosion de Revêtements Réfractaires sur le Zirconium, I. Oxydation par L'Oxygène de Revêtements de Nitrure de Zirconium," 1977, pp. 305-322, Journal of the Less-Common Metals, 51, Elsevier Sequoia S.A., Lausanne, The Netherlands, Summary Only.

Caillet, et al., "Étude de la Corrosion de Revêtements Réfractaires sur le Zirconium, II. Oxydation par L'Oxygène de Revêtements de Carbonitrure de Zirconium," 1977, pp. 323-331, Journal of the Less-Common Metals, 51, Elsevier Sequoia S.A., Lausanne, The Netherlands, Summary Only.

Caillet, et al., "Étude de la Corrosion de Revêtements Réfractaires sur le Zirconium, III. Oxydation par la Vapeur D'eau de Revêtements de Nitrure et de Carbonitrure de Zirconium," 1978, pp. 37-46, Journal of the Less-Common Metals, 58, Elsevier Sequoia S.A., Lausanne, The Netherlands, Summary Only.

Borchardt, "On the Oxidation of Yttrium," 1964, pp. 711-719, J. Inorg. Nucl. Chem., vol. 26, Pergamon Press Ltd., Northern Ireland.

Klemm, et al., "Lanthanoxyfluorid," 1941, pp. 167-171, Zeitschrift für anorganische und allgemeine Chemie, Band 248.

Bevan, et al., "The crystal structures of some Vernier phases in the yttrium oxide-fluoride system," 1990, pp. 451-465, Eur. J. Solid State Inorg. Chem., t. 27, Gauthier-Villars.

Kohlschütter, "Uber den graphitischen Kohlenstoff," 1918, pp. 35-68, Anorganisches Laboratorium der Universität.

Hartmanova, et al., "Characterization of yttria-stabilized zirconia thin films deposited by electron beam evaporation on silicon substrates," 1998, pp. 969-975, Journal of Materials Science 33, Chapman & Hall.

Andersson, "Aspects on the problems of synthesis and structure of some oxide or oxide-like compounds formed by the transition elements in the groups 4, 5 and 6 of the period table," 1967, pp. 521-538, Arkiv för Kemi Band 26 nr 44, Almqvist & Wiksells Boktryckeri AB.

Figlarz, et al., "Topotaxy, Nucleation and Growth," 1990, pp. 143-170, Solid State Ionics 43, Elsevier Science Publishers B.V, North-Holland.

Wakatsuki, et al., "Topotaxial and Some Other Characters of the Tiansformation from Hexagonal to Wurtzitic BN," 1986, pp. 256-258, Physica 139 & 140B, Elsevier Science Publishers B.V., Amsterdam.

McCarthy, et al., "Crystal Chemistry and Compound Formation in the Systems Rare Earth Sesquioxide-WO$_3$," Jul. 1972, pp. 397-411, National Bureau of Standards Special Publication 364.

Ban, et al., "Defects and Mass Transport in Reduced CeO$_2$ Single Crystals," Jul. 1972, pp. 353-365, National Bureau of Standards Special Publication 364.

Lowenstein, et al., "Growth and X-ray Studies of Single Crystals of Higher Oxides of Praseodymium and Terbium," Jul. 1972, pp. 343-351, National Bureau of Standards Special Publication 364.

Hultman, et al., "Mg—Ti—spinel formation at the TiN/MgO interface by solid state reaction: Confirmation by high-resolution electron microscopy," Aug. 1991, pp. 1744-1749, J. Mater. Res., vol. 6, No. 8, Materials Research Society.

Kennedy, On crystallography of topotaxy and transformation in the system MnO—Mn$_3$O$_4$ and the ferrite (Mn, Co$_1$)$_3$O$_4$, 1974, pp. 1557-1559, Journal of Materials Science 9, Chapman and Hall Ltd.

Schmid, et al., "Synthesis and Structure of a Compositely Modulated Solid Solution in the Zirconium Nitride Oxide Fluoride System," 1994, pp. 391-400, Journal of Solid State Chemistry 109, Academic Press, Inc.

Carter, et al., "Thin-Film Reactions," 1986, pp. 676-680, Ber. Bunsenges. Phys. Chem. 90, VCH Verlagsgesellschaft mbH.

Subba Rao, et al., "Electrical Transport in Rare-Earth Oxides," 1970, pp. 377-384, Journal of Solid State Chemistry 2.

Gerand, et al., "A New Tungsten Trioxide Hydrate, WO$_3$ ⅓H$_2$O: Preparation, Characterization, and Crystallographic Study," 1981, pp. 312-320, Journal of Solid State Chemistry 38, Academic Press, Inc.

Boulesteix, et al., "Domain Formation and Interfaces in Praseodymium and Terbium Oxides Obtained by Reduction of PrO$_2$ and TbO$_2$: A Comparison with Group Theory Predictions," 1987, pp. 125-135, Journal of Solid State Chemistry 66, Academic Press, Inc.

Voitovich, et al., "High-Temperature Oxidation of the Nitrides of the Group IV Transition Metals, II. Oxidation of Zirconium and Hafnium Nitrides," 1976, pp. 747-750, Institute of Materials Science, Academy of Sciences of the Ukrainian SSR, Plenum Publishing Corporation, New York.

Feng, et al., "Topotactic Preparation of Preferentially Oriented BaTiO$_3$ and TiO$_2$ Thin Films on Polycrystalline Substrate," 2003, pp. 48-49, Chemistry Letters vol. 32, No. 1, The Chemical Society of Japan.

Asayama, et al., "Growth of (103) fiber-textured SrBi$_2$Nb$_2$O$_9$ films on Pt-coated silicon," Apr. 1, 2002, pp. 2371-2373, Applied Physics Letters, vol. 80, No. 13, American Institute of Physics.

Sambasivan, et al., "New approach to depositing yttria-stabilized zirconia buffer layers for coated conductors," Apr. 2003, pp. 919-928, J. Mater. Res., vol. 18, No. 4, Materials Research Society.

Kondo, et al., "Epitaxial Ferroelectric Thin Films on Silicon Substrates for Future Electronic Devices," Jun. 2002, pp. 46-53, Fujitsu Sci. Tech. J., 38, 1.

Ramesh, et al., "Orienting Ferroelectric Films," Jun. 14, 2002, pp. 1975-1976, Science vol. 296.

Hubbard, et al., "Thermodynamic stability of binary oxides in contact with silicon," Nov. 1996, pp. 2757-2776, J. Mater. Res., vol. 11, No. 11, Materials Research Society.

Wiame, et al., "Thermal Oxidation Under Oxygen of Zirconium Nitride Studied by XPS, DRIFTS, TG-MS," pp. 1293-1299, Great Britain.

Zacate, et al., "Defect cluster formation in $M_2O_3$-doped cubic $ZrO_2$," 2000, pp. 243-254, Solid State Ionics 128, Elsevier Science B.V.

Clarke, et al., "Structure of $Zr_2ON_2$ by Neutron Powder Diffraction: The Absence of Nitride-Oxide Ordering," 1999, pp. 399-405, Journal of Solid State Chemistry, Academic Press.

Hesse, "The submicroscopic structure of reaction fronts in solid-solid reactions and its correlation with reaction mechanism and kinetics," 1997, pp. 1-15, Solid State Ionics 95, Elsevier Science B.V.

Barnett, et al., "Stability of Nanometer—Thick Layers in Hard Coatings," Mar. 2003, pp. 169-172, MRS Bulletin.

Schlom, et al., "A Thermodynamic Approach to Selecting Alternative Gate Dielectrics," Mar. 2002, pp. 198-204, MRS Bulletin.

Mannhart, et al., "The value of seeing nothing," 2004, pp. 620-621, Nature Publishing Group.

Sleight, et al., "Crystal Chemistry of the Rare Earth Sesquisulfides," May 16, 1968, pp. 2282-2288, Inorganic Chemistry.

Lissner, et al., "Ein neues Samariumnitridsulfid: $Sm_4N_2S_3$," 1994, pp. 2003-2007, Z. anorg. allg. Chem. 620, Johann Ambrosius Barth, Abstract Only.

Graff, et al., "Structure of the Topotaxial $Mg_2SnO_4$/MgO Solid Reaction Front," 1998, pp. 117-128, Zeitschrift für Physikalische Chemie, Bd. 206, R. Oldenbourg Verlag, München.

Hayward, et al., "Sodium Hydride as a Powerful Reducing Agent for Topotactic Oxide Deintercalation: Synthesis and Characterization of the Nickel(I) Oxide $LaNiO_2$," 1999, pp. 8843-8854, J. Am. Chem. Soc., vol. 121, No. 38, American Chemical Society.

Revcolevschi, et al., "Crystallographically aligned metal-oxide composite made by reduction of a directionally solidified oxide-oxide eutectic," Jul. 1985, pp. 335-336, Nature vol. 316.

Seeger, et al., "Synthesis and Structure of $Ba[Zrn_2]$ and $Ba_2[NbN_3]$," 1994, pp. 2008-2013, Z. anorg. allg. Chem. 620.

Lu, et al., "Porous Single-Crystalline TaON and $Ta_3N_5$ Particles," May 4, 2004, pp. 1603-1605, Chemistry of Materials, vol. 16, No. 9, American Chemical Society.

Zachariasen, "Crystal Chemical Studies of the 5f-Series of Elements. XIV. Oxyfluorides, XOF," Oct. 13, 1950, pp. 231-236.

Bonev, "On the Terminology of the Phenomena of Mutual Crystal Orientation," 1972, pp. 508-512, Acta Cryst., A28.

Katz, "The Topotaxy of the Solid-State Crystal Growth of the Spinel $MgGa_2O_4$ from Its Constituent Oxides," 1975, pp. 654-660, Acta Cryst., A31.

Withers, et al., "A Composite Modulated Structure Approach to the Lanthanide Oxide Fluoride, Uranium Nitride Fluoride and Zirconium Nitride Fluoride Solid-Solution Fields," 1993, pp. 941-951, Acta Cryst., B49, International Union of Crystallography, Great Britain.

Liu, et al., "Epitaxial La-doped $SrTiO_3$ on silicon: A conductive template for epitaxial ferroelectrics on silicon," Jun. 24, 2002, pp. 4801-4803, Applied Physics Letters, vol. 80, No. 25, American Institute of Physics.

Guha, et al., "Lattice-matched, epitaxial, silicon-insulating lanthanum yttrium oxide heterostructures," Feb. 4, 2002, pp. 766-768, Applied Physics Letters, vol. 80, No. 5, American Institute of Physics.

Muller, et al., "Atomic-scale imaging of nanoengineered oxygen vacancy profiles in $SrTiO_3$," Aug. 5, 2004, pp. 657-661, Nature, vol. 430.

Corbett, et al., "A Photoelectron Spectroscopic Study of the Zirconium Monohalide Hydrides and Zirconium Dihydride. Classification of Metal Hydrides as Conventional Compounds," 1983, pp. 3194-3202, Inorg. Chem. 22, American Chemical Society.

Seaverson, et al., "Synthesis and Characterization of Oxide Interstitial Derivatives of Zirconium Monochloride and Monobromide," 1983, pp. 3202-3210, Inorg. Chem. 22, American Chemical Society.

Eick, "The Preparation, Lattice Parameters and Some Chemical Properties of the Rare Earth Mono-thio Oxides," Jan. 5, 1958, pp. 43-44, Chemical Properties of Rare Earth Mono-thio Oxides, vol. 80.

Felmlee et al., "On the Ternary System Samarium-Nitrogen-Oxygen and the Question of Lower Oxides of Samarium," Apr. 1968, pp. 660-666, Inorganic Chemistry, vol. 7, No. 4.

Kodenkandath, et al., "Assembly of Metal—Anion Arrays within a Perovskite Host. Low-Temperature Synthesis of New Layered Copper—Oxyhalides, $(CuX)LaNb_2O_7$, X=Cl, Br," 1999, pp. 10743-10746, J. Am. Chem. Soc., 121, American Chemical Society.

Srikant, et al., "Mosaic structure in epitaxial thin films having large lattice mismatch," Nov. 1, 1997, pp. 4286-4295, J. Appl. Phys. 82 (9), American Institute of Physics.

Kwo, et al., "Properties of high K gate dielectrics $Gd_2O_3$ and $Y_2O_3$ for Si," Apr. 1, 2001, pp. 3920-3927, Journal of Applied Physics, vol. 89, No. 7, American Institute of Physics.

Jeon, et al., "Effect of hygroscopic nature on the electrical characteristics of lanthanide oxides ($Pr_2O_3$, $Sm_2O_3$, $Gd_2O_3$, and $Dy_2O_3$)," May 15, 2003, pp. 6393-6395, Journal of Applied Physics, vol. 93, No. 10, American Institute of Physics.

Titcomb, et al., "A neutron diffraction study of the hydrides of the early lanthanide elements at room temperature," 1974, pp. 2409-2416, J. Phys. C: Solid State Phys., vol. 7, Great Britain.

Bok Lee, et al., "Formation and Characterization of Epitaxial $TiO_2$ and $BaTiO_3/TiO_2$ Films on Si Substrate," Feb. 1995, pp. 808-811, Jpn. J. Appl. Phys., vol. 34, Part 1, No. 2B.

Horii, et al., "HF and Hydrazine Monohydrate Solution Treatment for Suppressing Oxidation of ZrN Film Surface," Sep. 15, 2001, pp. L976-L979, Jpn. J. Appl. Phys., vol. 40, Part 2, No. 9A/B.

Schmid, et al., "A Composite Modulated Structure Refinement of $Zr_9(N,O,F)_{20}$," 1995, pp. 746-753, Acta Crystallographica Section B, International Union of Crystallography, Great Britain.

Lettieri, et al., "Critical issues in the heteroepitaxial growth of alkaline-earth oxides on silicon," Jul./Aug. 2002, pp. 1332-1340, J. Vac. Sci. Technol. A20(4), American Vacuum Society.

Hesse, "Formation of ceramic thin films by solid-state interface reactions," Jul./Aug. 1987, pp. 1696-1702, J. Vac. Sci. Technol. A5(4), American Vacuum Society.

Yu, et al., "Epitaxial pervoskite thin films grown on silicon by molecular beam epitaxy," May/Jun. 2000, pp. 1653-1657, J. Vac. Sci. Technol. B 18(3), American Vacuum Society.

Jones, et al., "Epitaxial silicon grown on $CeO_2$/Si(111) structure by molecular beam epitaxy," Sep./Oct. 1998, pp. 2686-2689, J. Vac. Sci. Technol. B 16(5), American Vacuum Society.

Tersoff, et al., "Competing Relaxation Mechanisms in Strained Layers," May 30, 1994, pp. 3570-3573, Physical Review Letters, vol. 72, No. 22, The American Physical Society.

Osten, et al., "Growth of crystalline praseodymium oxide on silicon," 2002, pp. 229-234, Journal of Crystal Growth 235, Elsevier Science B.V.

Yamaguchi, et al., "Preparation of (111)-Oriented Epitaxial $Fe_{3-x}O_4$ Films on $\alpha$-$Al_2O_3$ (0001) Substrates by Coating-Pyrolysis Process Using Postepitaxial Topotaxy via (0001)-Oriented $\alpha$-$Fe_2O_3$," 2002, pp. 239-247, Journal of Solid State Chemistry 163, Elsevier Science.

Osten, et al., "Epitaxial growth of praseodymium oxide on silicon," 2001, pp. 297-302, Materials Science and Engineering B87, Elsevier Science B.V.

Pirzada, et al., "Oxygen migration in $A_2B_2O_7$ pyrochlores," 2001, pp. 201-208, Solid State Ionics 140, Elsevier Science B.V.

Englert, et al., "Reversible Topotactic Hydration and Dehydration of an Europium Complex [1]," 1998, pp. 970-974, Z. anorg. allg. Chem. 624.

Belousov, et al., "Growth of $YBa_2Cu_3O_{7-x}$ thin films on silicon buffered by $CoSi_2$ layers," 2001, pp. 29-33, Physica C 351, Elsevier Science B.V.

Lowenstein, et al., "Growth and X-ray Studies of Single Crystals of Higher Oxides of Praseodymium and Terbium," 1971, pp. 84-95, Proceedings of the 9th Rare Earth Research Conference, vol. I, Sessions A-H, Virginia Polytechnic Institute and State University, Virginia.

Tuller, et al., "Defect Structure and Electrical Properties of Nonstoichiometric $CeO_2$ Single Crystals," Feb. 1979, pp. 209-217, J. Electrochem. Soc.: Electrochemical Science and Technology, vol. 126, No. 2.

Wyckoff, "Chapter V: Structures of Complex Binary Compounds $R_nX_m$," pp. 1-13, Crystal Structures Second Edition, vol. 2, Interscience Publishers.

Roth, et al., "II. Carbides and Nitrides with Oxides," pp. 306-307, Phase Diagrams for Ceramists vol. V, The American Ceramic Society, USA.

Samsonov, "Carbides of the Rare-Earth Metals," 1965, pp. 101-143, High-Temperature Compounds of Rare Earth Metals with Nonmetals, Consultants Bureau, New York.

Bloss, "Structural Variations, Composition, and Stability," pp. 284-342, Crystallography and Crystal Chemistry, Holt, Rinehart and Winston, Inc.

Libowitz, et al., "Chapter 26: Hydrides," 1979, pp. 299-337, Handbook on the Physics and Chemistry of Rare Earths vol. 3—Non-Metallic Compounds, North-Holland Publishing Company.

Eyring, "Chapter 27: The Binary Rare Earth Oxides," 1979, pp. 337-399, Handbook on the Physics and Chemistry of Rare Earths vol. 3—Non-Metallic Compounds, North-Holland Publishing Company.

Bevan, et al., "Chapter 28: Mixed Rare Earth Oxides," 1979, pp. 401-523, Handbook on the Physics and Chemistry of Rare Earths vol. 3—Non-Metallic Compounds, North-Holland Publishing Company.

Khattak, et al., "Chapter 29: Perovskites and Garnets," 1979, pp. 525-607, Handbook on the Physics and Chemistry of Rare Earths vol. 3—Non-Metallic Compounds, North-Holland Publishing Company.

Flahaut, "Chapter 31: Sulfides, Selenides and Tellurides," 1979, pp. 1-89, Handbook on the Physics and Chemistry of Rare Earths vol. 4—Non-Metallic Compounds—II, North-Holland Publishing Company.

Haschke, "Chapter 32: Halides," 1979, pp. 89-151, Handbook on the Physics and Chemistry of Rare Earths vol. 4—Non-Metallic Compounds—II, North-Holland Publishing Company.

Hulliger, "Chapter 33: Rare Earth Pnictides," 1979, pp. 153-237, Handbook on the Physics and Chemistry of Rare Earths vol. 4—Non-Metallic Compounds—II, North-Holland Publishing Company.

Greis, et al., "Chapter 45: Rare Earth Fluorides," 1982, pp. 387-461, Handbook on the Physics and Chemistry of Rare Earths vol. 5, North-Holland Publishing Company.

"International Centre for Diffraction Data," 2003, 153 pages.

Definition of Topotaxy, Robert D. Shannon and Ronald C. Rossi, Nature Search Journal, Nature Publishing Group, Jun. 6, 1964.

Epitaxial Growth and Magnetic Properties of EuO on (001) Si by Molecular-Beam Epitaxy, Applied Physics Letters, vol. 83, No. 5, Aug. 4, 2003.

Written Opinion of the International Searching Authority in PCT/US2005/040923 dated May 11, 2006.

Vaithyanathan, Venu, et al. Epitaxial. Growth of a Half-Metallic Oxide on Silicon: EuO / Si (001), American Physical Society, Annual APS Mar. Meeting 2003, Abstract #K31.007.

FIG. 22

EPITAXIAL LAYER STRUCTURES, PRECURSORS FOR TOPOTACTIC ANION EXCHANGE FILMS

CROSS-REFERENCE TO RELATED APPLICATIONS

This application is a divisional of U.S. application Ser. No. 10/997,014, filed on Nov. 24, 2004, and now pending, the entire disclosure of which is incorporated herein by reference. Priority to this application is claimed.

FEDERALLY SPONSORED RESEARCH OR DEVELOPMENT

Not applicable.

TECHNICAL FIELD

This invention relates generally to barrier layers used in electromagnetic and other device structures and methods of forming such, and more specifically to the provision of epitaxial, textured, crystalline, or polycrystalline oxide layers on surfaces for which it may be difficult to fabricate such layers.

BACKGROUND OF THE INVENTION

The manufacture of a great variety of electromagnetic and optical devices is based upon thin film technology. A succession of layers having various functionality are deposited on a planar substrate surface, one on top of another. Each is patterned in some manner, resulting in a complex three-dimensional device such as an integrated circuit. It is this technology, called metal-oxide-semiconductor (MOS) in the case of its use on doped silicon, that has enabled the computer revolution of the late 20th century, which continues today. Another example of thin film technology is the current effort to develop superconducting power transmission cables, using the coated-conductor technique. Thin films are also useful on substrates that are non-planar surfaces, such as their use as templates for oxide environmental barriers on three-dimensional objects.

There exists a wide array of crystalline oxide materials that have special or exceptional properties, and that are highly desirable as functional layers in thin-film devices. These properties include colossal magnetoresistance, ferroelectricity, superconductivity, very low thermal conductivity, and high dielectric constant, and many others.

Two major difficulties exist with the integration of these materials. First, most of these functional materials are oxides. And, as it turns out, the materials commonly or most conveniently used as a flat substrate surface are often sensitive to reaction with oxygen, such as silicon, gallium arsenide, nickel, or copper. The functional material components may be reactive with the substrate in other manners as well. Thus, it is extremely difficult to deposit highly-desirable functional oxides directly on these substrate surfaces. Barrier layers, used to block oxygen or other ionic interaction with the substrate, are used in many instances with success, although they are often complicated. Therefore more economical solutions are desirable.

The second difficulty is the need for crystalline templating. A large proportion of these functional oxides are most preferably deposited as a single-crystal-like film. That is, the crystalline material of the having a particular crystalline orientation and texture. The substrates used for deposition are frequently monocrystalline (e.g., silicon) or monocrystal-like (epitaxial, fiber-textured platinum, biaxially textured nickel), although polycrystalline surfaces are also frequently employed. If it was possible to deposit functional oxides directly on substrates, this substrate crystallinity could be used to encourage their growth in a single-crystal-like form, i.e., epitaxial growth. Epitaxial growth of functional oxides is routinely conducted, but usually only on oxide surfaces. Due to oxidation sensitivity of non-oxide substrates, epitaxial growth is prohibited in all cases but those with the most stringent growth conditions, and then for only a few specific systems.

These two difficulties can be addressed individually with reasonable success, but a method that addresses both of these difficulties concurrently is elusive. Barrier layers can be used, but are typically not single-crystal-like, being either amorphous (glassy) or polycrystalline. The growth of single-crystalline oxides directly on these substrates is exceedingly difficult.

This invention addresses this problem directly. It discloses a method, compositions, and the resulting devices for the fabrication of single-crystal-like oxide layers on oxidation-sensitive substrates, whether fabricated by the disclosed method or another. Moreover, the method is straightforward, and can be performed with far less difficulty than that encountered in direct growth of oxides on such substrates. Devices, optimally fabricated by the method, and using compositions optimal for an application, provide a templating surface that can be treated in essentially the same manner as a crystalline oxide surface. Templating is transmitted from the substrate to the film surface, and oxygen interaction with the substrate is blocked. Thus, the growth of functional oxides is made straightforward, which then can be conducted in essentially the same manner as is routinely used for their deposition on monocrystalline oxide substrates.

As an added benefit, an oxide film that the use of this method provides may also be a functional oxide in and of itself. In cases such as this, the complexity of the fabrication process is further reduced.

SUMMARY OF THE INVENTION

In one embodiment of the present invention, a method of fabricating a metal oxide film upon a surface is provided. A substrate having a surface is provided. A crystalline metal-nonmetal precursor film is deposited on the surface via a physical vapor deposition method. The precursor film comprises metal and nonmetal constituents. The metal constituents of the precursor film are selected from the group consisting of the lanthanide elements (Ln): Sc, Y, La, Ce, Pr, Nd, Sm, Eu, Gd, Tb, Dy, Ho, Er, Tm, Yb, and Lu, and combinations, alloys, and doped substituents thereof. The nonmetal constituents of the precursor film are selected from the group consisting of: H, C, N, F, P, S, Cl, Se, Br, Te, and combinations thereof. The precursor film is oxidized to yield a metal-oxide product film by heating to a temperature between 0 and 1000° C. in a controlled environment and introducing an oxidizing agent into the environment. The metal constituents of the product film are those of the precursor film. A majority of the nonmetal constituents of the precursor film are exchanged for oxygen to yield the product film. The product film is topotactic with the precursor film.

In another embodiment of the present invention, a functional laminate structure is provided. The structure includes a substrate having a surface, a crystalline metal-nonmetal layer, and a crystalline metal-oxide layer. The metal-nonmetal is selected from the group consisting of $AX_{0.3}$, $AX$, $AX_2$, $AX_3$, and compounds consisting of combinations of said materials.

The metal-oxide layer is topotactic with said metal-nonmetal layer. The metal constituents of the metal-oxide layer are those of the metal-nonmetal layer. The metal-nonmetal layer is located between the surface and the metal-oxide layer.

In yet another embodiment of the present invention, a functional laminate structure is provided. The structure includes a substrate having a surface, a crystalline metal-nonmetal layer, and a crystalline metal-oxide layer. The metal-nonmetal is selected from the group consisting of: $ABX_3$, $A_{n+1}B_nX_{3n+1}$, doped substituents thereof, anion-deficient versions thereof, and anion-excess versions thereof. The metal-oxide layer is topotactic with said metal-nonmetal layer. The metal constituents of the metal-oxide layer are those of the metal-nonmetal layer. The metal-oxide is selected from the group consisting of $ABO_3$, $A_{n+1}B_nO_{3n+1}$, doped substituents thereof, anion-deficient versions thereof, and anion-excess versions thereof. The metal-nonmetal layer is located between the surface and the metal-oxide layer.

BRIEF DESCRIPTION OF THE DRAWINGS

FIG. 22 are exemplary descriptions of device structures. A lanthanide salt precursor can be deposited on a surface that is epitaxial, biaxially textured, fiber textured, amorphous, or polycrystalline. The precursor can be partially or fully converted, or an oxide-salt alloy can be deposited and either converted or used as deposited. The cationic constituents can be lanthanide(s), or a mixture of lanthanide(s) with other metal(s). Abbreviations in the figure are as follows: amorph—amorphous, biax—biaxially textured, epi—epitaxial, fiber—fiber textured, Ln—lanthanide or lanthanides, M—metal or metals, polyx—polycrystalline, single xtal—monocrystalline, topo—topotactic, X—nonmetal constituent or anion or anions, xtal—crystalline.

DETAILED DESCRIPTION

Figure 1:
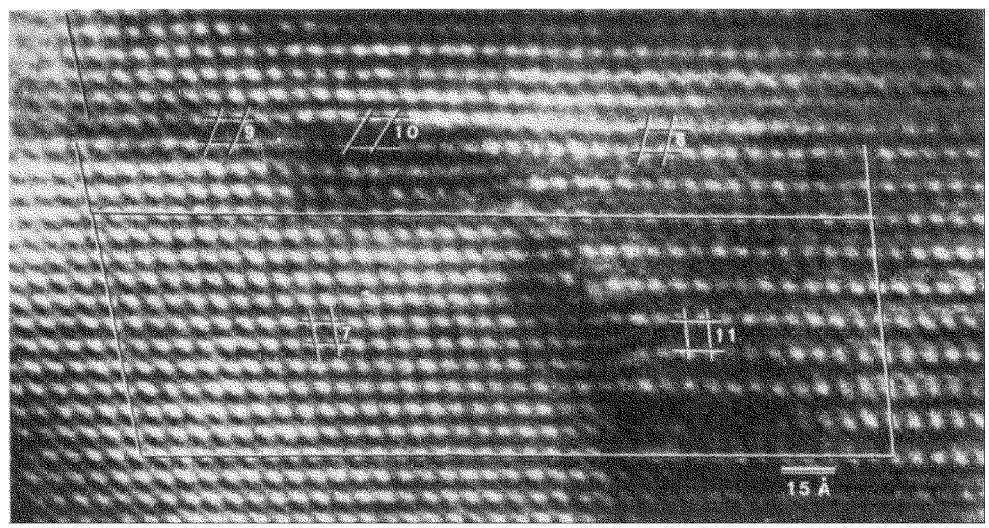
FIG. 1 is a high-resolution transmission electron microscope image of a $TbO_z$ crystal down the $[211]_F$ axis, demonstrating the coexistence and topotactic compatibility of the different-m members of the homologous series $Ln_mO_{2n-2m}$.
Figure 2A:
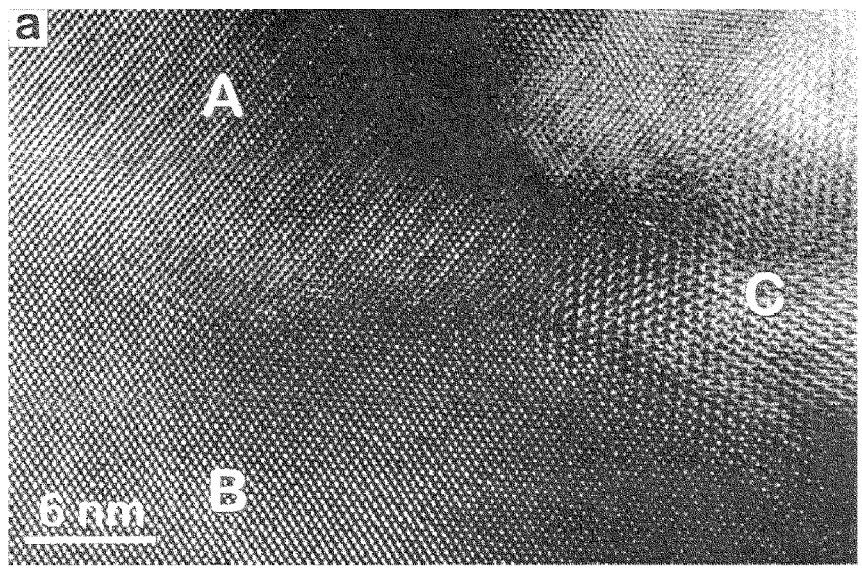
FIG. 2A is a high-resolution transmission electron microscope image of a $PrO_z$ crystal, demonstrating the coexistence and topotactic compatibility of the different-m members of the homologous series $Ln_mO_{2n-2m}$.
Figures 2B, 2C:
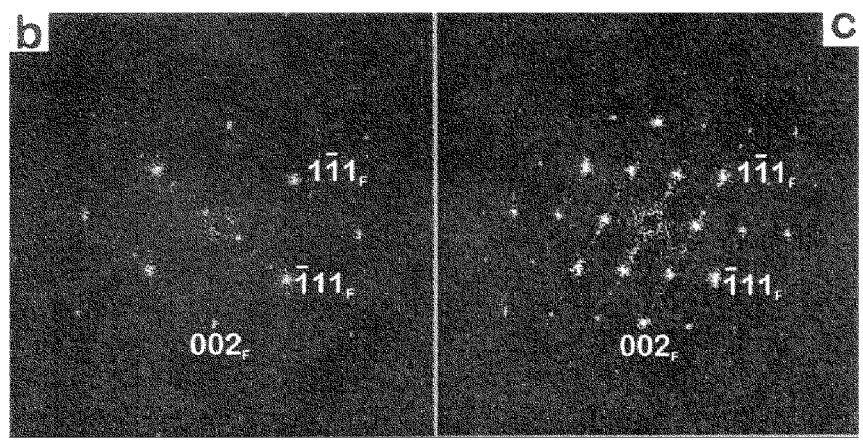
FIG. 2B is a digital diffraction pattern of a $PrO_z$ crystal of the single phase area labeled A in FIG. 2A, showing a common $<110>_F$ sublattice with the same orientation.
FIG. 2C is a digital diffraction pattern of a $PrO_z$ crystal of the single phase area labeled B in FIG. 2B, showing a common $<110>_F$ sublattice with the same orientation.
Figures 2D, 2E:
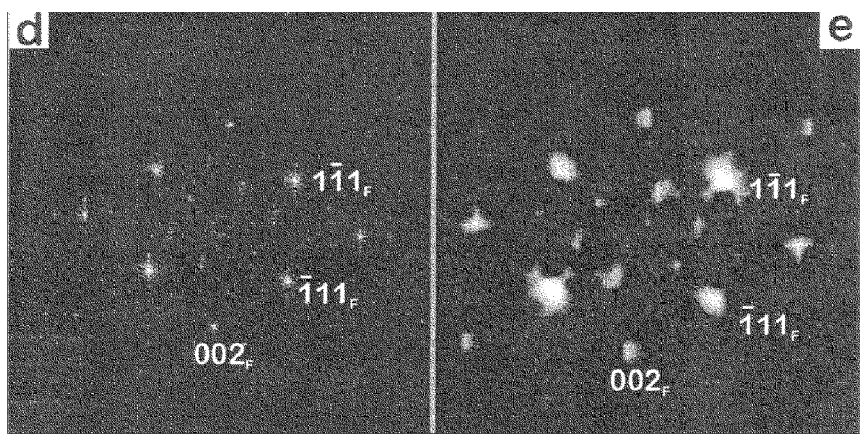
FIG. 2D is a digital diffraction pattern of a $PrO_z$ crystal of the single phase area labeled C in FIG. 2C, showing a common $<110>_F$ sublattice with the same orientation.
FIG. 2E is a digital diffraction pattern of a $PrO_z$ crystal taken from a small region of the phase area labeled B in FIG. 2C.

Headings in the detailed description are meant solely as a guide for the reader in finding sections of interest, and are not meant to characterize or to limit the invention in any way.

The focus of this disclosure is lanthanide oxide and lanthanide-containing oxide thin films, preferably as formed by the method of topotactic anion exchange. Device fabrication by this method is not known in the art and is demonstrated below. The method enables fabrication of many new devices. This method and devices fabricated thereby find use as epitaxial oxide templates, barrier layers, and various functional oxide layers.

Lanthanide salts (lanthanide metal-nonmetal compounds) and lanthanide-containing salts have a specific type of crystal structure for which the nonmetal components can be exchanged for oxygen with no disruption of crystalline texture—the cation lattice is undisturbed by the anion exchange, such that the "product crystals have inherited their orientations from the reagent crystals." That is, the product lanthanide-oxide is topotactic with the precursor lanthanide-nonmetal; it has an orientation reproducibly related to that of the precursor, regardless of whether the precursor is completely or partially converted to the oxide. The phenomenon is termed topotactic anion exchange.

Topotactic anion exchange functions in basically the same manner for lanthanide-containing thin films as for single crystals, but with additional advantages over single crystals. Lanthanide-containing salts and oxides exhibiting a face-centered cubic (FCC) cation sublattice are the most suitable materials for a topotactic anion exchange process for the fabrication of oxide thin films. Although two isolated, serendipitous observations of topotactic anion exchange in transition metal oxide thin film systems are available in the art, such systems are not suitable for the fabrication of devices having a high degree of crystalline and microstructural perfection, and none containing lanthanides have been reported or proposed. Indeed, others in the art consider the two mentioned examples as unique systems. The reduced physical dimension of thin films and the physical constraint of topotaxy and enhance the stability of topotactically converted materials, such that the range of compositions for which the method is applicable is greater than that for bulk and single crystalline systems, and an infinite variety of alloyed compositions is possible, enabling tailoring of lattice dimension and other properties for any given application.

A. Overview

This invention concerns primarily oriented and epitaxial oxide films on substrates, particularly on substrates that are sensitive to reaction with elemental constituents of the film. It consists of a method and numerous devices which are enabled by the method. The most significant application for this method is the use of these oxide films as epitaxial oxide template layers, for the subsequent growth of other oxide layers on the oxide-templated surface of oxidation-sensitive substrates, the sensitivity being such that it is impossible or very difficult and expensive to deposit epitaxial oxides directly on the surface of the substrate.

A critical aspect of the method is that the precursor to the barrier layer is chosen to be effectively stable in contact with the substrate surface at the time of its deposition. It is subsequent to the deposition (or at least after the initial stage of its deposition) that the layer is oxidized to yield a layer that is effectively stable with oriented films deposited thereon, which can additionally act as an oxide template to control the orientation of films deposited thereon.

The template films consist of lanthanide oxides, or crystalline phases with a major component being a lanthanide oxide. These template oxide films are fabricated by first depositing heteroepitaxial precursor films comprising an R-Zr family metal (scandium, yttrium, zirconium, hafnium, and the proper lanthanide elements (La, Ce, Pr, Nd, Sm, Eu, Gd, Tb, Dy, Ho, Er, Tm, Yb, and Lu), or some combination thereof, with or without other elements as major constituents). As a matter of notation, the R-Zr family of metals is hereafter referred to as a group as "lanthanides" or by "Ln," or nonexclusively as "cations" or "metal" in the context of compound constituents, and "nonmetal constituents" or "anions" (H, C, (OH), O, N, F, P, S, Cl, Se, and Br; and Te, or some combination thereof), are hereafter referred to as a group as the "anions," "X," or the "nonmetal" component, to yield a composition $LnX_y$ indicates the stoichiometry of X relative to Ln). The substrate surface may be single crystalline (e.g., a silicon crystal or an epitaxial film on a crystal), biaxially textured (e.g., nickel), fiber textured (e.g., platinum), polycrystalline, or amorphous. The deposited $LnX_y$ phase has a rigid cation sublattice, preferably face-centered cubic (FCC), which is rigid at temperatures below ~1200° C., enabling high mobilities of anionic species concurrent with retention of crystalline integrity, texture, and orientation. The $LnX_y$ film is subsequently exposed at an elevated temperature to an oxidizing agent, such that the anionic species are replaced through evaporation and in-diffusion of oxygen, to yield an epitaxial $LnO_z$ film (z indicates the stoichiometry of oxygen relative to Ln). The exchange is diffusionally topotactic, that is, the crystalline lattice is maintained, specifically the cation sublattice, such that the resulting epitaxial $LnO_z$ film has an orientation and texture related to that of the precursor $LnX_y$ film.

Oxide films may then be deposited under normal conditions directly on the $LnO_z$ template film surface, as they would on any other oxide substrate. Any subsequent oxidation of the substrate, by oxygen diffusing through the $LnO_z$ during subsequent depositions on its surface may result in a slight, even, and insignificant oxidation of the underlying substrate, but because the orientation and texture of the film is established prior to this, orientation of the oxide template and film are unaffected, having already established templating by the $LnO_z$ surface presented by the template layer. Numerous devices employing $LnO_z$ as an epitaxial oxide template layer or as a functional material are possible.

While the product $LnO_z$ film will typically be a rocksalt-structure-based or fluorite-structure-based phase (fluorite, bixbyite, pyrochlore, scheelite, etc.), it is important to note that the precursor film may also contain oxygen as a component, typically in solution with other anions, to the degree that films can be deposited without undesirable reaction with the underlying substrate and its surface. This consideration can reduce the oxygen partial pressure required for deposition of a templated barrier layer significantly. It is also important to note that an FCC cation sublattice is preferred but not necessary for the method. Other oxide phases, such as those with face-centered or close-packed slab layers, or with BCC cation sublattice, having lanthanide(s) as a major component, may also be possible by the method.

Heteroepitaxial growth, the growth of one phase on a surface of another, is widely used to produce films of many compositions. Heteroepitaxial growth of non-metal films is typically performed using the same or similar anion species in both substrate and film, for example $YBa_2Cu_3O_7$ films grown on $SrTiO_3$. Difficulty is encountered in attempts to deposit films on substrates having differing components. Both kinetic and thermodynamic limitations exist. Elevated temperatures are needed to provide sufficient thermal excitation of metallic and cationic species to achieve high-quality epitaxial films, approximately in the range of 300-1200° C. At elevated temperatures, anionic species are highly mobile, which can lead to intermixing and other issues. The thermodynamic conditions necessary for the formation of the desired phase in the film are often such that the elemental constituents of the film will react with the substrate as well. That is, the substrate is sensitive.

It is not possible to overcome directly thermodynamic limitations, but it is possible to side-step the limitation by avoiding direct deposition, frequently pursued in the form of barrier layers. Many complicated layering schemes have been devised for various combinations of substrate and film composition, for which each layer is stable in contact with the layer directly underlying it. Such an approach can be cumbersome. Multiple depositions incur added expense for processes that would potentially incorporate such schemes, and the use of many different and possibly incompatible schemes increases process complexity. A simpler method is desirable.

The method of this disclosure employs only a single deposition of a barrier layer that is chemically stable in contact with the substrate at the time of barrier-layer deposition, and after a brief oxidation anneal, is chemically stable in contact with any epitaxial oxide film deposited thereon at the time of its deposition. Preferred embodiment devices consist of a film, containing lanthanide species as (a) major component(s), present on a crystalline substrate that confers crystalline orientation and surface mesh characteristics to its surface, and which can act as an intermediate layer to prevent reaction of the substrate with the environment or with subsequent film layers. In a preferred embodiment, the film has been partially converted from the precursor such that the region in contact with the substrate remains stable in contact with the substrate, and the free surface is an oxide, suitable for the deposition of other oxide films. The device is used either as a functional layer in a device, or as a surface used for the deposition of oxide films having other compositions which are functional layers in a device.

The invention relies on the well-known behavior of lanthanide oxides to have a rigid cation structure at all temperatures below their melting point, around 2000° C., which is exceptional among oxides. The basal lattice parameter of lanthanide ionic salts (lanthanide metal-nonmetal compounds) and oxides are similar. The crystalline lattice is not controlled by oxygen packing, but by a combination of anion and cation packing. Several lanthanides also have multiple oxidation states, and therefore several possible oxide compositions. The majority of the many different oxide structures for single lanthanides are based upon the fluorite and rocksalt crystal structures, but with differences in oxygen content, oxygen vacancy ordering, and slight (i.e., insignificant with respect to epitaxy) shifts in the atomic positions of the cations. These phases also have appreciable oxygen diffusivities. But for all of these oxides in the solid state, the cations remain in a rigid face-centered cubic (FCC) structure, with positions and coordination essentially constant. The majority of multi-component lanthanide oxides are also FCC-based and behave in the same manner. Some multi-component lanthanide oxides have a body-centered cubic (BCC) structure, for which the cation lattice is also rigid. The cation sublattice in the differently structured lanthanide oxides of A-type, and B-type structures is also rigid, although not FCC.

Lanthanide oxides are not the only materials to exhibit this behavior. Many $LnX_y$ have structures having an FCC cation sublattice, with rocksalt-based or fluorite-based crystal structures, and frequently several. These exhibit the same type of behavior described above for oxides. The structures consist of a rigid FCC cation sublattice, with anions distributed in various manners in the FCC cation lattice, and anion diffusion rates are frequently appreciable. Alloy mixtures of many of these compounds are known.

The commonality between these two types of lanthanide compounds—fluorite/rocksalt-based oxides, and rocksalt/fluorite-based salts—is that the cation lattice is FCC and is rigid. It is the same in both cases. (Minor position distortions occur, but the FCC cation coordination remains.) Solid solutions between these materials are also well known, such that substitution for one or several different lanthanides in a single phase, or of several anions in a single phase, or even a solution consisting of several different lanthanides and several different anions, are possible.

It is possible to exchange the anionic component of a $LnX_y$ crystal for oxygen. The pure oxide is frequently the most chemically stable of the compositions, so exchange of other anions for oxygen is energetically preferred and straightforward. Also due to the high anion diffusivities, this exchange does not disrupt the quality of the crystal. No cation diffusion is required. This sort of chemical exchange results in topotaxy, more specifically it is a topotactic anion exchange reaction. Individual crystals of the product oxide have an orientation reproducibly related to that of the precursor. This type of reaction can occur under more limited conditions for lanthanide phases having a BCC cation sublattice, and under other limited conditions for A-type, B-type, and hexagonal phases as well.

In many cases, it is much easier to deposit an $LnX_y$ film of the desired orientation on a particular substrate than it is to deposit an $LnO_z$ film. This is in large part a result of the oxidation sensitivity of the substrate, precluding the deposition of an oxide directly on its surface, as such deposition typically requires the presence of an oxygen-bearing gas and elevated temperatures.

It should be pointed out that, depending upon the diffusional characteristics of the $LnO_z$ film, the underlying substrate may be oxidized at a later time, due to an in-diffusion of oxygen through the template layer. This may in some cases cause difficulties, as functional structures that are entirely epitaxial may in some cases be very desirable, but in many cases it will not. Interface oxidation below the layer may be irrelevant. Additionally, it is possible to use several layers or a graded structure for the layer hereby produced. Such structures can be designed to avoid post-conversion substrate oxidation, if such is desirable.

An $LnO_z$ surface presents an oxide template that is amenable to the (locally) epitaxial deposition of a large number of technologically significant oxide materials. For heteroepitaxial film deposition on these surfaces, the $LnO_z$ epitaxial oxide template films present a cation surface corresponding to the FCC cation arrangement, on which oxygens can stably adopt an arrangement corresponding to their arrangement in either fluorite-based or rocksalt-based phases. For a basal surface, that is either a square surface net with a period equal to 1/SQRT(2) of the FCC sublattice dimension, or a close-packed surface net, with a period equal to the FCC sublattice dimension, depending on conditions such as temperature and oxygen partial pressure. For example, numerous perovskite-based materials are technologically important. The (100) surface of an oxide perovskite presents a surface net that matches both the cation surface net, and the oxygen surface net of fluorite-based lanthanide oxides, $Ln_2O_3$, so epitaxy is readily achieved for such films grown on $LnO_z$. Additionally, many of $LnO_z$ phases are tolerant to some proportion of oxygen vacancies, thus the interface structure must not necessarily match exactly, and a single atomic layer of intermediate oxygen coordination can exist between the $LnO_z$ template and the desired epitaxial oxide film.

Potential uses of such layers primarily include enabling the economical growth of epitaxial or oriented layers that provide specific functionality, although such layers may themselves be functional. A few examples of structures enabled by this method and device include (1) the growth of silicon on an insulating layer on silicon, for dielectric isolation of silicon-on-insulator devices, (2) ferroelectric oxides on silicon for use in capacitor elements or field-effect devices, (3) growth of superconductors on textured nickel for coated conductor power transmission cables, and (4) the deposition of a high-dielectric-constant material on silicon for use in field-effect and capacitive devices.

B. Thin Film Technology

The manufacture of a great variety of electromagnetic and optical devices is based upon thin film technology. A succession of layers having various functionality are deposited on a planar substrate surface, one on top of another. Each is patterned in some manner, resulting in a complex three-dimensional device such as an integrated circuit. It is this technology, called metal-oxide-semiconductor (MOS) in the case of its use on doped silicon, that has enabled the computer revolution of the late 20th century, which continues today. Another example of thin film technology is the current effort to develop superconducting power transmission cables, using metal ribbons as substrates. Thin films are also useful on non-planar surfaces, such as their use as environmental barrier devices on three-dimensional objects.

There exists a wide array of crystalline materials that have special or exceptional properties, and that are highly desirable as functional layers in thin-film devices. These materials include colossal magnetoresistive materials, ferroelectrics, superconductors, and high-k dielectrics, piezoelectrics, insulators, and many others.

Two major difficulties exist with the integration of these materials. First, most of these functional materials are oxides, but the materials commonly or most conveniently used as a substrate surface for deposition are often very sensitive to reaction with oxygen, such as silicon, nickel, gallium arsenide, or copper. Second, crystalline templating is frequently needed to yield films having a specific orientation or texture. Oxidation of a substrate surface during the initial stages of film deposition can destroy this templating.

C. Barrier Layers

Barrier layers are frequently used in thin film fabrication processes to prevent chemical interaction or interdiffusion of the chemical species in separate layers. Many various and often complicated layering schemes have been devised for various combinations of substrate and film composition, for which each layer is stable in contact with the layer directly underlying it. Such an approach can be cumbersome. Multiple depositions incur added expense for processes that would potentially incorporate such schemes, and the use of many different and possibly incompatible schemes increases process complexity.

One example barrier layer architecture is that of an amorphous $(Hf,Zr)N_x$ layer on silicon, and an amorphous $(Hf,Zr)(O,N)_x$ or $(Hf,Zr,Si)(O,N)_x$ layer on silicon, used as the gate oxide in a field-effect transistor device, with a conductive metal thereon, used as a method for the fabrication of a field-effect transistor. A simpler method is desirable.

Barrier layer architectures introduce further problems which must also be addressed in addition to the stability issue. For example, lack of adhesion is commonly encountered. This results in further increasing complexity in design of the barrier layer architecture. For example, a design in the art addresses this problem through the addition of extra layers designed to promote similar chemical bonding and adhesion between layers. The structure consists of a metal top electrode on a functional oxide perovskite layer on a Ru or Ir-containing perovskite layer on a $RuO_2$ or $IrO_2$ layer on a metal Ir or Ru layer on a substrate. Such a structure, six layers, increases costs significantly. A simple single layer is preferred for a barrier layer.

D. Epitaxy

There exists a large variety of oxide materials with useful properties, which have many different uses. For example, for the semiconductor industry, integrating various oxide insulators, dielectrics, ferroelectrics, superconductors, magnetoelectrics, and other materials with existing semiconductor fabrication processes is an extremely attractive and desperately needed goal. Some superconducting power transmission cable technology is based upon the use of metal ribbons, intended to be used as a substrate for the deposition of epitaxial (c-axis) $YBa_2Cu_3O_7$ superconductor using appropriate buffer layers. Some turbines require the deposition of barrier layers to prevent excessive oxidation in hot spots.

In all of these cases, in addition to substrate-oxidation issues, deposition of functional epitaxial oxides are desirable. Deposition of textured or epitaxial films can increase the range of oxide films that can be integrated in a useful manner. For example, many oxides are highly anisotropic, and therefore must be grown in a specific epitaxial orientation to be useful. Many substrates are single crystalline, making them suitable for epitaxial film growth. Many substrates are biaxially textured, fiber textured, or polycrystalline, and epitaxial film growth on such surfaces, in which grains are locally epitaxial to individual grains of the surface, results in a film having similar texture. In addition to textured substrates, there are numerous cases where an oxide barrier is desirable on polycrystalline or amorphous substrates. Cases exist for which both textured and polycrystalline oxide template layers are desirable.

Because these cases involve local epitaxy of the deposited film, the term "epitaxial" will be frequently be used to describe both situations in the context of film growth. Even growth on a polycrystalline substrate can be locally epitaxial. A topotactic anion exchange reaction enables texture retention regardless of precursor texture.

There have been recent demonstrations of epitaxial film growth directly on oxidation-sensitive substrates, but this is possible only for a small subset of useful oxides, or under stringent conditions, and the processes expensive, making an alternative solution preferable, and only in specific orientations. For example, although some $LnO_z$ can be deposited epitaxially on silicon, only (110) orientation is observed, and special conditions must be employed to obtain single-domain growth of that single orientation.

1. Epitaxial Barrier Layers

Thus, it is clear that a desperate need exists for an oxide template barrier layer for many different applications and chemical systems, especially in epitaxial systems. Isolated specific examples of epitaxial barrier layers exist in the art, but these typically increase process complexity significantly.

For example, a previously described epitaxial barrier layer stack strategy to provide a specific type of epitaxial oxide surface on silicon consists of either a wurtzite-type oxide on a R-Zr oxide on a lanthanide manganite layer on an aluminum oxide layer on silicon, or of a wurtzite-type oxide on a R-Zr oxide on a lanthanide manganite layer on an aluminum oxide layer on a tantalum nitride, titanium nitride, or niobium nitride layer on silicon.

The above-described layer structure relies on a manganite layer, which is likely to be magnetic, and could introduce problems in an electromagnetic device. Additionally, the layer structure is one that is likely to be unstable over time, as tantalum and niobium nitride layers are known to form extensive porosity upon exposure to oxygen and elevated temperatures. The deposition of any oxide layers on this structure would result in such oxidation, and would be destructive to the physical integrity of the stack. Furthermore, the wurtzite surface layer of such a structure is hexagonal, and on a typical (100) silicon surface will consist of many domains, the walls between which are fast diffusion paths for impurities. In contrast, this disclosure describes an oxide barrier layer that can consist of only a single layer to be deposited, or multiple layers if appropriate or desired.

Another epitaxial oxide template and barrier device consists of a structure comprised of a metal oxide layer comprised of an $ABO_3$ perovskite material deposited directly on a single crystalline silicon surface, with further layers of functional oxides. This type of deposition requires an exceptional degree of finesse, because the thermodynamic conditions (temperature, partial pressure of constituent gases) for deposition are very close to those resulting in oxidation of the substrate, silicon in this case. In fact, silicon will oxidize before the elemental constituents of may perovskite compositions, effectively preventing successful use of this approach.

E. Topotaxy

An alternative to the direct deposition of oxides on sensitive substrates for the fabrication of epitaxial template and barrier layers is highly desirable. Topotaxy offers this alternative method by enabling the deposition of a precursor of desired crystalline texture that is thermodynamically or kinetically stable in contact with the substrate at the time of deposition, and which is stable in contact with materials later deposited thereon at the time of their deposition. In other words, a precursor layer is transformed to an oxide template barrier layer subsequent to deposition on the oxidation-sensitive substrate.

The method of this disclosure relies on the phenomenon of topotaxy, specifically the topotactic exchange of anions in inorganic, lanthanide-containing systems, as detailed below.

1. Definition

Topotaxy indicates that "the product crystals have inherited their orientations from the reagent crystals," characterized by "a definite and reproducible crystallographic orientation relationship between the two," and which also involves a change in composition (presumably through out-diffusion or in-diffusion of one or more constituent species). Reactions resulting in topotaxy are referred to as topotactic reactions.

Topotactic solid-state reactions occur in systems for which one of the components has a very high mobility in the solid, while the other is a rigid or constrained, over some specific range of temperatures. If such a material is exposed to a source of some other component elements, for which a compound with the non-diffusing species is more energetically preferred, and for which the source component also has a high mobility in the material, then a topotactic reaction can occur. A topotactic reaction results in a product phase that is distinct from the parent phase.

2. Types

Topotaxy has been known for almost a century, and topotaxy in metallic (Widmanstatten reactions) and organic systems is widely known, but will not be addressed here. For inorganic systems, four types of topotactic reactions exist.

a. Persistent Slab—Intercalation/Deintercalation

Persistent slab topotactic synthesis and exchange methods are different from the process in this disclosure. These involve layered or sheet-like compounds (e.g., graphite, clays, or Ruddlesden-Popper phases), and the cation exchange in these systems is more properly referred to as topochemical, or an intercalation/deintercalation reaction. A rigid slab of the parent phase, for example a perovskite double layer of a layered perovskite phase, remains unchanged, while the components between the slabs are exchanged.

An example of persistent slab topotaxy is the incorporation of CuCl or CuBr into the n=2 Dion-Jacobson phase (layered perovskite) $RbLaNb_2O7$. A parent phase is annealed at 325° C. for seven days in the presence of $CuCl_2$ or $CuBr_2$. The very large size of the Rb atoms, which lie between the double-perovskite sheets enables the exchange. Such an exchange results in the disintegration of a single crystal or bulk parent phase upon reaction, as the lattice expands by 6.4% in the c direction upon conversion.

Some topotactic work has been carried out in a manner referred to as soft chemistry or exfoliation. In these processes, a parent phase having a structure composed of rigid and chemically stable slab layers alternating with alkali or alkaline earth layer is used. The alkali or alkaline earth is removed through solution chemistry processes, resulting in an exfoliation process. The slabs, floating in a solution, can be caught and manipulated in various manners, such as layer-by-layer assembly techniques. This has been used as a method to produce textured $TiO_2$ and $BaTiO_3$ films from a $Ti_{1.73}O_4H_{1.08}$ precursor.

b. Cation Exchange (Persistent Anion Sublattice)

Persistent anion sublattice topotactic reactions are the most widely studied in oxides. Systems are typically transition metal oxides, for which the oxygen sublattice is close-packed, and cations are mobile enough to allow for exchange. Most examples involve the formation of spinels or the breakdown of some hydrated silicates. Similar reactions have been reported in organic systems. In both parent and product, the oxygen lattice is close-packed.

The reaction of SnO vapor with MgO yields a topotactic layer of $Mg_2SnO_4$ spinel on MgO. Very high temperatures, 1200-1300° C., are required to achieve sufficient mobilities for this reaction to occur. A similar topotactic reaction occurs for solid-solid reaction of the $TiO_2$-MgO system to yield $Mg_2TiO_3$ and $Mg_2TiO_4$ spinel. The $NiO-Al_2O_3$ system undergoes the same type of transformation, with the {111}-type $Ni_2AlO_4$ planes parallel to the (0001) $Al_2O_3$ (hexagonal) planes. Solid-solid reaction of MgO and $Nb_2O_5$ or $Ta_2O_5$ at 800° C. forms corundum-type-structured $Mg_4Nb_2O_9$ or $Mg_4Ta_2O_9$. $\beta$-Ni(OH)$_2$ transforms to $\beta$-NiOOH upon heating to evolve hydrogen.

c. Anion Exchange (Persistent Cation Sublattice)

Anion-exchange topotaxy is much less widely known, and is the focus of this disclosure. In this case, the cation lattice is rigid and persistent, and anions have high mobility. Numerous lanthanide inorganic phases fit these two criteria.

Taking for example the oxides, $LnO_z$, the anion substructure "melts" far below the physical melting point of the solids. The metal substructure, on the other hand, is rigid up to the melting points of approximately 2500° C., and significant cation mobility is not observed below ~1300° C., although the oxygen in such compounds is highly mobile by 300° C. Indeed, lanthanide oxides are among the most thermally stable materials known.

Materials with fluorite-based structures are "notorious" for the high mobility of the non-metal constituents. All $LnO_z$ take at least one fluorite-based form, including fluorite, defect fluorite, pyrochlore, bixbyite, scheelite, inverse sphalerite, and many others. Thus, these materials are prime candidates for use in topotactic anion-exchange fabrication of single-crystal-like epitaxial, fiber-textured, and biaxially textured films, and generally for the formation of oxide films of any texture.

Many examples of anion exchange involve a change in oxygen stoichiometry. Lanthanide oxides have been observed to transform topotactically from one form to another as early as 1978, by high-resolution transmission electron microscopy. Other examples are in lanthanide-containing phases, such as the transformation of perovskite-based $LaNiO_3$ to the metastable $LaNiO_2$.

d. Constrained Particle

Physical constraint has been demonstrated to hinder atomic rearrangement sufficiently to result in topotactic reduction of an oxide to a metal in a system for which topotactic anion exchange is not observed in the bulk.

A three-dimensionally constrained NiO fibrous intergrowth in $ZrO_2$ was reported to reduce topotactically to Ni, the nickel cation lattice being constrained in three dimensions by the $ZrO_2$ lattice. The small size (layers ~1000 nm in width) of the fibral intergrowths is believed to have enabled stabilization of the nickel lattice by sufficiently increasing the kinetic barrier to cation reorganization. Such a reaction would not be expected to occur for nickel that is not constrained in this manner.

For thin films, and especially unrelaxed ultra-thin films, the physical constraint of epitaxy similarly restrains cationic rearrangement, but to a lesser extent. Epitaxial strain also shifts phase transition temperatures, and can thus stabilize phases not otherwise stable at room temperature. The constraint of epitaxy can stabilize $LnO_z$ thin film systems, transformed from FCC cation-lattice $LnX_y$ precursors, which otherwise undergo a reconstructive transformation upon anion exchange, to yield high-quality $LnO_z$ films.

3. Diffusional vs Reconstructive

Many topotactic reactions do not require atomic rearrangement of the cation and anion lattice at the reaction interface, and topotaxy does not imply a reaction mechanism, i.e., reconstructive topotactic reactions can occur. In some cases, significant rearrangement occurs, and the actual process can be viewed more as decomposition followed by reconstructive growth.

For the method of this disclosure, however, gross rearrangement of the rigid FCC cation lattice does not occur. Thus, it is referred to as a diffusional topotactic reaction.

4. Bulk Lanthanide Systems

It has long been known that single crystals of certain lanthanide oxides can be topotactically transformed from one oxide composition to another with minimal change to the texture of the crystal. This is known to occur readily for $LnO_z$ C-type and fluorite-based crystal structures, which have an FCC-based cation sublattice, and particularly for $PrO_z$ and $CeO_z$. Single crystals of up to 1.45 mm in thickness are readily transformed topotactically from z=2 to fluorite-based phases z=1.833 and 1.67, respectively, and back to z=2 at about 350° C. The textural quality of the single crystals is maintained. The utility of rapid oxygen exchange in $LnO_z$ has been previously recognized, such as bulk $(Ce,Pr)O_x$ which has been used as a reversible, active material for oxygen separation from air, with use in the temperature range of ~380-600° C. Yttrium metal, having an oxidized surface, has a greater oxidation resistance than any other elemental metal, due to its protective oxide scale which owes its adherency in part to near lattice match between metal and oxide.

Several $LnO_z$ phases of different oxygen content can coexist in the same single crystal, as demonstrated and known for $TbO_z$ and $PrO_z$ in FIGS. 1, 2A, 2B, 2C, 2D and 2E. Some $LnO_z$ such as $CeO_{1.714}$, have been demonstrated to oxidize at room temperature, thus demonstrating their high oxygen mobility, which in turn would imply that the orientational variants of homologous series $LnO_z$ can renucleate new domains at room temperature.

Figure 3:
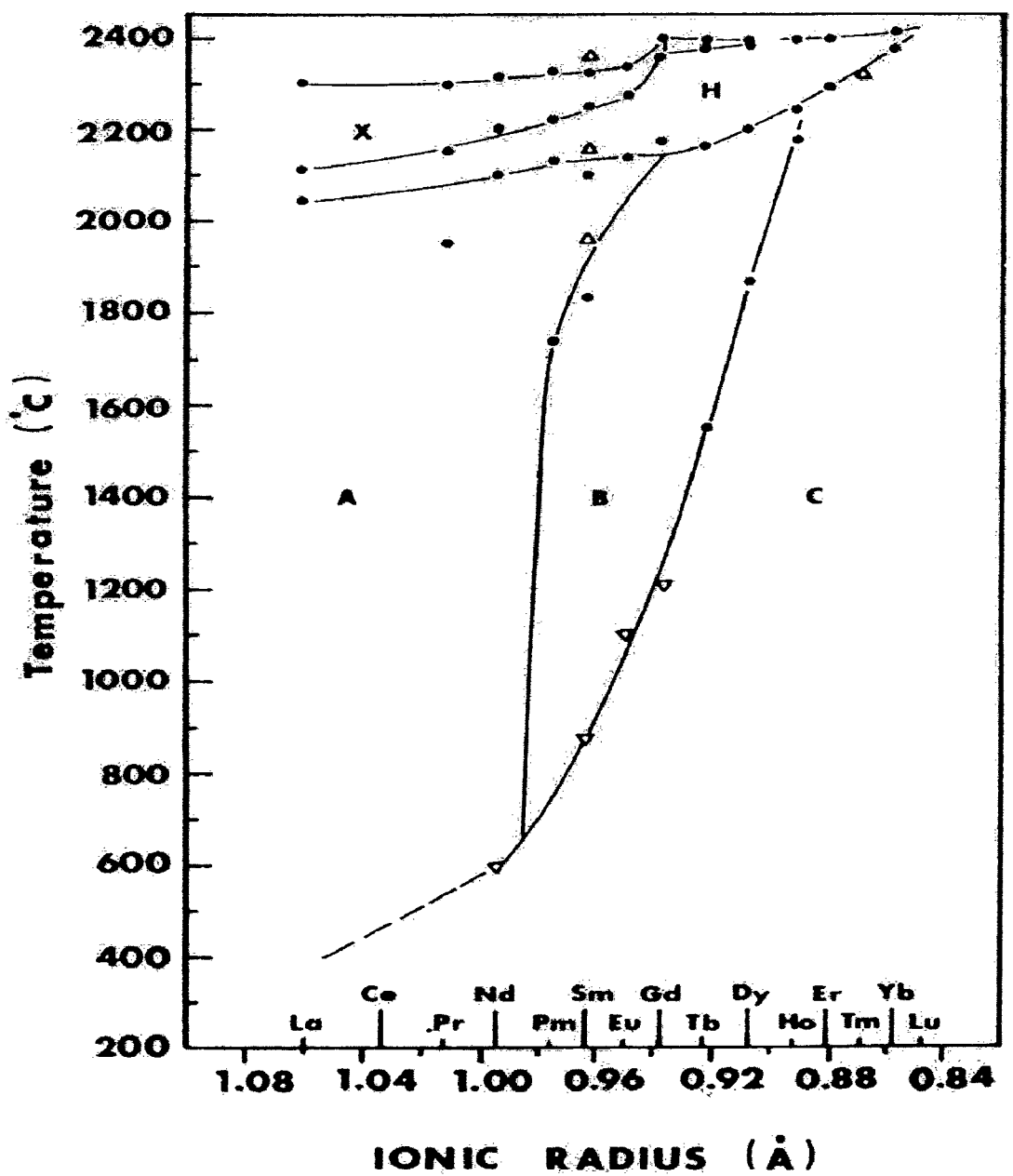
FIG. 3 is a stability diagram for polymorphic forms of $Ln_2O_3$, showing that the C-type form is observed at room temperature for all $Ln_2O_3$.

Although complete transformation of some pure $LnO_z$ phases can result in material failure, different thermal conditions or anion doping can help to stabilize low-oxygen-content compositions in an FCC cation lattice-based structure, or to stabilize a cubic fully-oxidized form. For example, although $CeO_2$ crystals transformed to $CeO_{1.5}$ at 800° C. become polycrystalline, due to a reconstructive transformation to the non-fluorite A-type phase, as is known, transformation below 600° C. results in the preferred stability of the C-type phase (see FIG. 3, a known stability diagram for polymorphic forms of $Ln_2O_3$), which has an FCC cation sublattice and therefore remains single crystalline. Similar conditions apply for other $LnO_z$ as well.

Nitrogen can stabilize the fluorite-type lattice of $LnO_z$ at low oxygen content. Single crystals of $PrO_2$ with a C-type structure can be topotactically reduced to fluorite-based $PrO_{1.833}$ (the β-phase) by a hydrothermal technique using nitric acid as a solutant. All previous attempts to reduce A-type $Pr_2O_3$, in the absence of nitrogen, had resulted in single crystals shattering, due to the reconstructive nature of transformation for pure oxide. Similar effects have been observed in attempts to reduce $CeO_2$ and $ThO_2$ single crystals.

Topotactic anion exchange is demonstrated also for some lanthanide-containing systems having a BCC cation sublattice. $LaNiO_3$, a perovskite, can be topotactically converted to $LaNiO_2$, through the use of annealing in the presence of solid hydrides such as NaH. The oxygens residing between the lanthanum ions in the lattice are removed by the process. This is a true topotactic anion exchange process, but involves only changing the stoichiometry of the single anionic component of the system, oxygen. More complex anion exchange scenarios are possible.

5. Thin Film Systems

Topotactic anion exchange to produce heteroepitaxial barrier layers of some transition metals (Tr) is reported in the literature. The transformation in these materials is of poor quality, which is reasonable when they are considered from a crystal chemical perspective. It will be shown in later sections that lanthanides are most suitable for topotactic anion exchange (Sec. 0).

Figure 4:
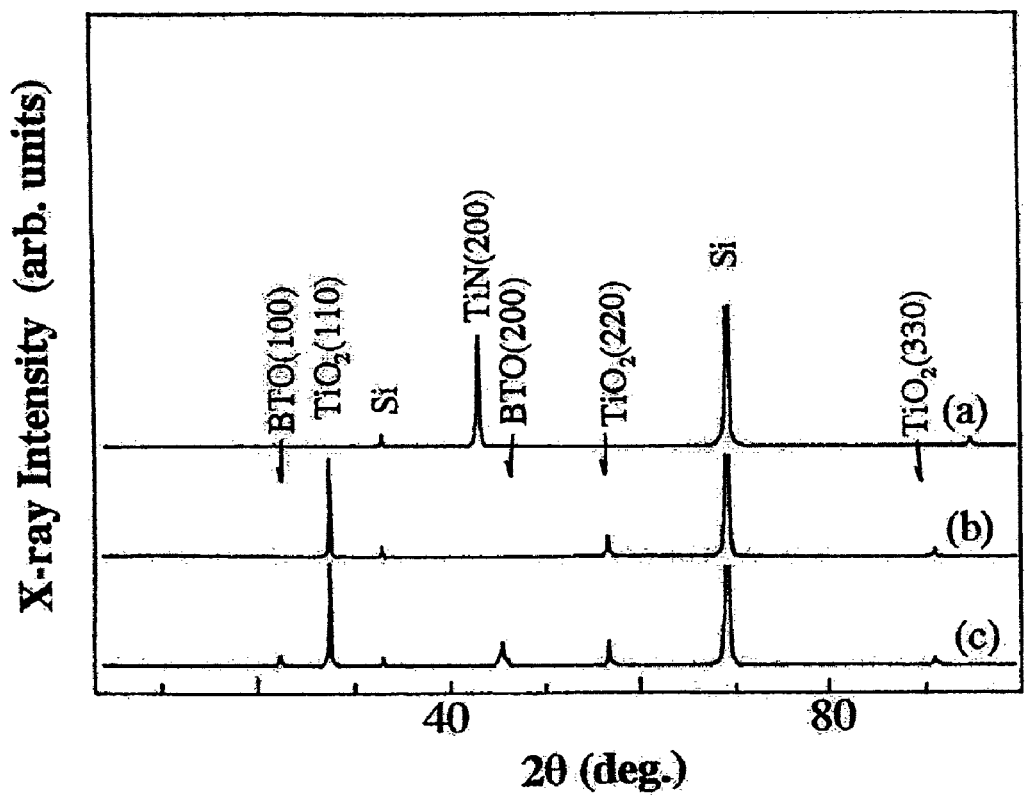
FIG. 4 is x-ray diffraction data showing topotactic transformation of (100) TiN/(100) Si to (110) $TiO_2$/(100) Si with low texture quality. The θ-2θ pattern demonstrates the presence of only the described orientations and phases in the same film before and after transformation, and the pole figures demonstrate the textural quality of the $TiO_2$ film, which is poor due to the mosaic and porosity caused by the change in lattice dimension upon anion exchange, but is still topotactic.
Figure 4:
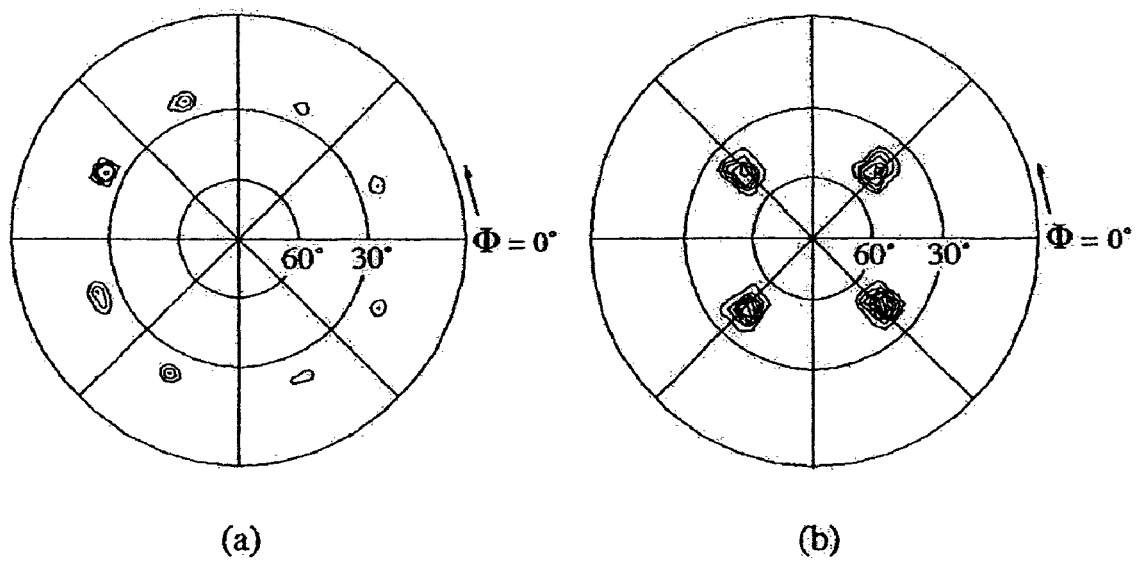

Topotactic anion exchange from TiN to a $TiO_2$ barrier layer, has been demonstrated and is known, but excessive porosity and roughness associated with the reconstructive conversion preclude its use in this manner. Growth of epitaxial $TiO_2$ directly on silicon is difficult or impossible, due to excessive interface oxidation during growth. A 120 nm-thick TiN deposited by pulsed laser deposition was converted to epitaxial $TiO_2$ by exposure to 5 mTorr of oxygen at 780° C., yielding a (110) rutile $TiO_2$/(100) Si film with a two-domain morphology due to in-plane twinning. X-ray diffraction θ-2θ (FIG. 4) and rocking curve scans indicated an epitaxial film, with 1.7° FWHM texture for the TiN and 2.3° for the $TiO_2$. A $TiO_2$ {101} pole figure from the prior art, shown in FIG. 4, demonstrates that the $TiO_2$ is epitaxial. This film was used as a barrier template for the subsequent growth of $BaTiO_3$. In a second experiment, deposition of $BaTiO_3$ directly on TiN resulted in a $BaTiO_3$/$TiO_2$/TiN/Si epitaxial heterostructure. In both of these demonstrations, although the texture was acceptable, the conversion also introduced ~70% porosity into the $TiO_2$ film, a completely unacceptable amount. Severe surface roughening was also observed. This is not surprising, based on the near doubling of molar volume upon transformation, or a 19% isotropic linear lattice expansion. The $TiO_2$ film had a high electrical leakage, indicating a high density of electronic and/or microstructural defects.

Figure 5:
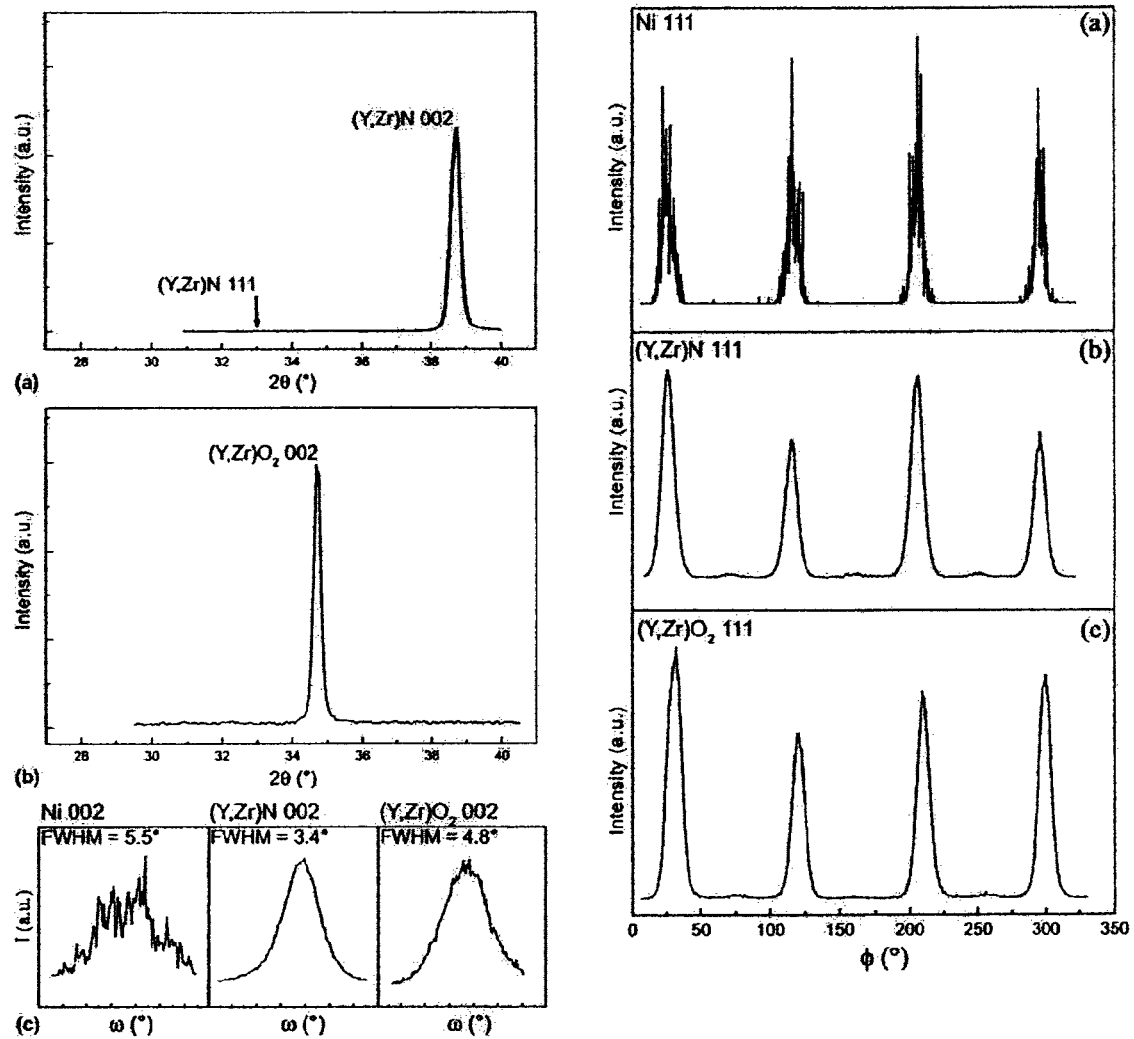
FIG. 5 is x-ray diffraction data showing topotactic transformation of (100) (Zr,Y)N/($^{100}$)$_{biax}$ Ni to (100) (Zr,Y)$O_2$/($^{100}$)$_{biax}$ Ni with low texture quality. The scans show only the presence of 001-oriented material. Transformation-induced mosaic texture of the (Zr,Y)$O_2$ film is 4.8° out-of-plane, and 11° in-plane.
Figures 6A, 6B:
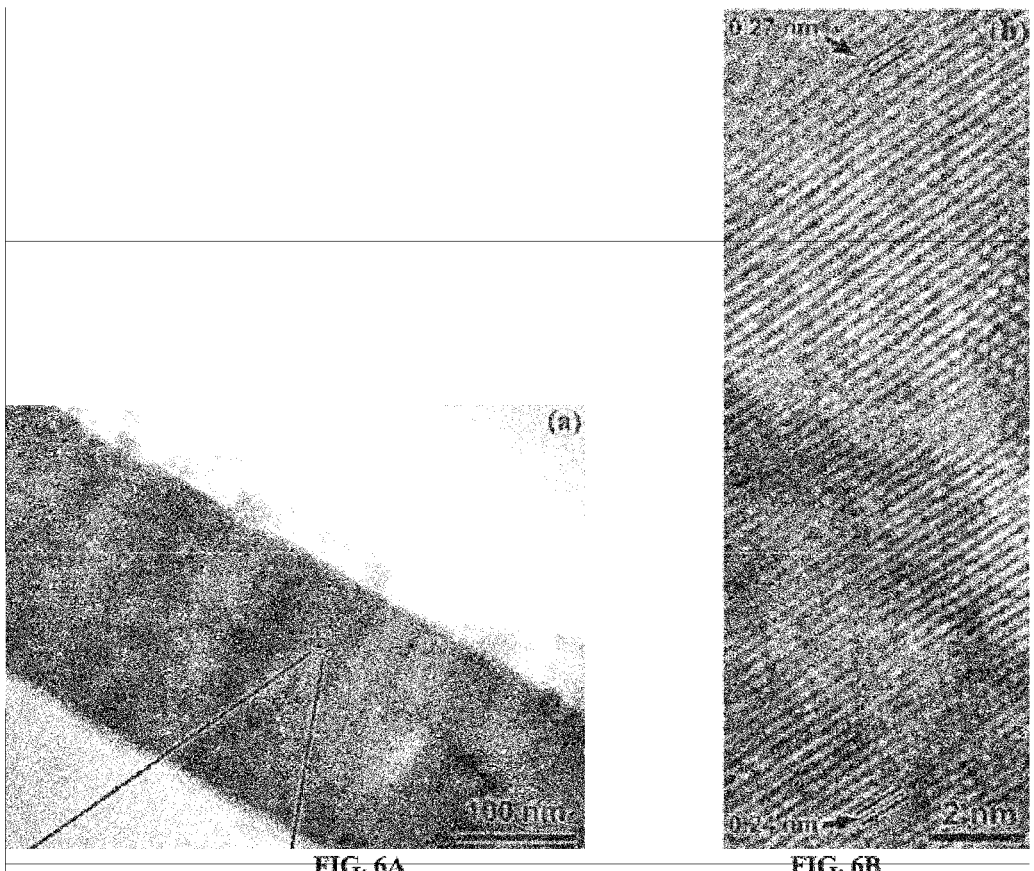
FIG. 6A is a cross-sectional transmission electron microscope image of the full film thickness, showing the interface between (Zr,Y)N and (Zr,Y)$O_2$.
FIG. 6B is a high-resolution transmission electron microscope image of the interface between (Zr,Y)N and (Zr,Y)$O_2$, and diffraction patterns of the same area, demonstrating topotaxy.
Figures 6C, 6D:
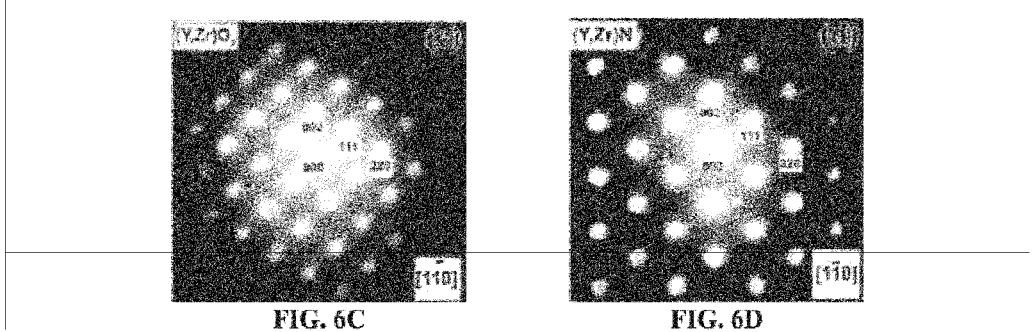
FIG. 6C is an electron diffraction pattern of the (Zr,Y)$O_2$, demonstrating topotaxy with the (Zr,Y)N.
FIG. 6D is an electron diffraction pattern of the (Zr,Y)N in the same area, demonstrating topotaxy.

A second demonstration of topotactic anion exchange is that of epitaxial $Zr_{0.8}Y_{0.2}N$ to $Zr_{0.8}Y_{0.2}O_2$ on biaxially textured nickel and single crystal silicon. The reported textural quality of the resultant films is inadequate for applications. In one example from the prior art, epitaxial $Zr_{0.8}Y_{0.2}N$ was deposited onto biaxially textured nickel (χ rocking curve FWHM=5.5°, φFWHM=8.2°) by magnetron sputtering, and was subsequently transformed to $Zr_{0.8}Y_{0.2}O_2$ using a water-forming gas mixture at temperatures from 500 to 900° C. A known x-ray diffraction analysis, FIG. 5, demonstrated a topotactic transformation. The texture of both the $Zr_{0.8}Y_{0.2}N$ and $Zr_{0.8}Y_{0.2}O_2$ were 3.4 and 4.8° in χ, and 10.5 and 11.0° in φ (FWHM), respectively, similar but slightly worse than that of the substrate (their texture is a convolution of film and substrate texture), and inadequate for superconducting cable applications based on grain boundary misalignment criteria. In a second example from the prior art, epitaxial (Zr,Y)N films grown on silicon were transformed in the same manner to $(Zr,Y)O_2$. These were demonstrated by cross-sectional transmission electron microscopy and diffraction analysis to have a topotactic orientation relationship at the conversion front, shown in the art at FIGS. 6A, 6B, 6C and 6D, but their overall texture was poor.

The yttrium-doped zirconium oxide topotactic anion exchange system, $Zr_{0.8}Y_{0.2}O_2$-$Zr_{0.8}Y_{0.2}N$, possesses the appropriate crystalline structure for successful topotactic conversion, i.e., a rocksalt precursor and a fluorite product, both having an FCC cation sublattice. But, the 50% volume change upon anion exchange (13% difference in lattice parameter) is too large to allow for conversion without the introduction of undesirable mosaic structure. Indeed, films in this system crack and spall due to compressive strain.

Some metals are known to form a thin topotactic film on their surface as they oxidize. If it is possible to deposit epitaxial films of lanthanide metals on desired substrates, and if the change in lattice dimension is small enough upon conversion from Ln to $LnO_z$, then this method could also be technologically useful.

Although topotactic oxygen loss or gain is demonstrated to have limits in single crystals, it is likely that epitaxial thin films will exhibit an extended range of stability for such reactions due to a combination of the physical constraint of epitaxy and the very low thickness of such films.

6. Microstructure and Texture Issues

The preceding sections show some examples of texture evolution through topotactic anion exchange. It is instructive to summarize the textural trends before moving on to a full description of the crystal and chemical systems for which topotactic anion exchange is a viable method of fabrication for epitaxial or textured films.

A common predictor for determining the likelihood of "good-quality" heteroepitaxy in a given oxide system is lattice match. Other factors, such as chemical compatibility, contribute, and this predictor fails in certain cases (for example for the epitaxial growth of lanthanide oxides on (100) silicon, which grow with a (110) orientation, in contrast to a lattice-match prediction of (100) growth) but it is largely accurate, and is suggested to be the primary parameter to use in down-selecting an appropriate composition from those that are compatible with the system under consideration.

The predictor of lattice match is even more effective in predicting the textural "quality" of topotactic anion-exchange systems. Many lanthanide oxide systems have very low changes in lattice dimension upon conversion, making lanthanides the ideal system for successful application of this method. Furthermore, the wide range of cation and anion alloying possible for lanthanides enables further minimization of conversion strain effects (see Sec. I.).

The general microstructural trends for the effects of topotactic misfit are summarized in Table I. Small elastic strains are relaxed by the introduction of dislocations, which cause mosaic texture. Subsequent anion exchanges may not introduce any additional mosaic, due to the existing mosaic structure relieving such stresses. Likewise, a film with some degree of mosaic texture present from film growth may not show an increase in mosaic texture upon conversion. In many reversible reactions, this mosaic is generated upon first conversion, and does not change with further cycling. Product film texture is a convolution of all preceding textures.

Texture is further affected by anisotropy of precursor, product, or both phases. Insufficient demonstrative examples exist, but the effects can be predicted based on crystal chemical and epitaxial growth principles. Orientational variants arise to minimize strain energy. For example, two different topotactic orientations are commonly observed in the NiO-$Al_2O_3$ system.

TABLE I

Microstructural effects of lattice mismatch for topotactic anion exchange systems.

| Condition | Effects |
| --- | --- |
| tension - high | porosity |
|  | cracking |
|  | incomplete exchange |
|  | roughness |
| tension - low | mosaic texture |
| perfect match | none |
| compression - low | mosaic texture |
| compression - high | porosity |
|  | spallation |
|  | pulverization of material |
|  | roughness |

An example of high compression upon topotactic conversion is the reaction of $Ta_2O_5$ to form TaON and $Ta_3N_5$, which results in the formation of a large network of pores, due to the large volume change on transformation.

In a system with moderate compression, $Mg_2SnO_4$ films formed from SnO vapor and a MgO film take on a four-fold mosaic texture, with a characteristic network of dislocations form at the interface and domains tilted approximately 0.8° from the MgO <100>, due to a 2.5% lattice dimension mismatch between parent and product phases. And likewise with $Mg_2TiO_4$ formed from the reaction of MgO and $TiO_2$, characterized by the formation of numerous cation antiphase boundaries. This transformation is reconstructive.

A system with moderateteension, but with a diffusional topotactic reaction, reduction of $CeO_z$ has a lattice expansion of ~2.3 %, and forms coherent domains of ~40 to 400 nm in size. Upon reoxidation, the mosaic disappears, demonstrating that the reaction is diffusional and not reconstructive.

The high tension of dehydration of $Ni(OH)_2$ to NiO and of $Mg(OH)_2$ and $Cd(OH)_2$ are examples of systems which become porous upon topotactic transformation. A second example is the crystal surface of $MgO-Nb_2O_5$, which results in excessive roughness.

F. Crystal Systems for Topotactic Anion Exchange

The requirements for films to be fabricated by the topotactic anion exchange method are that they consist of a rigid cation sublattice, and that they have high anion diffusivities at temperatures which the film and substrate can tolerate (some degree of atom motion occurs at all temperatures, but among epitaxial oxide template materials, those below possess the qualities to the highest degree), thus enabling anion diffusion and exchange while maintaining the orientation and texture of the parent crystal. These types of materials have been known for some time, but have never been applied to thin film technology. The description by Bevan and Summerville (1979) is quite clear:

"There is a host of solid phases of widely differing chemical composition for which a common feature is the stable arrangement of cations, either ordered or disordered, on a sub-lattice which is essentially that of the cations of the fluorite-type structure. The stability of this cation arrangement is then such that the anions of the associated anion sub-lattice can adopt a variety of configurations around individual cations, each of which is the most appropriate for the particular cation/anion ratio combination . . . . Moreover the anion sub-lattices thus produced are clearly very flexible and can adjust within wide limits to changes in cation composition and distribution so long as the cation sub-lattice per se retains its relationship to that of the fluorite-type structure, and gross non-stoichiometry in fluorite-type phases is a direct consequence of this."

This "host of solid phases" consists primarily of crystal structures based on a close-packed face-centered-cubic (FCC) cation sublattice. An FCC cation sublattice is also present in rocksalt-type structures, however, with anions occupying different sites. Other cation arrangements can also exhibit this behavior to a limited extent, for example those with a close-packed hexagonal cation sublattice, or those with a body-centered cubic (BCC) cation sublattice.

1. Face-centered Cubic Cation Sublattice a. Simple Lanthanide Phases With an FCC Cation Sublattice All $LnO_z$ exist in several crystalline forms, most of which consist of a rigid FCC cation sublattice, with oxygens distributed in various manners. These phases exhibit high oxygen mobilities, and it is these phases that can be synthesized through diffusional topotactic anion exchange. Such phases can also be inter-transformed by the same method, dependent upon possible ionization states for a given lanthanon.

Figure 7:
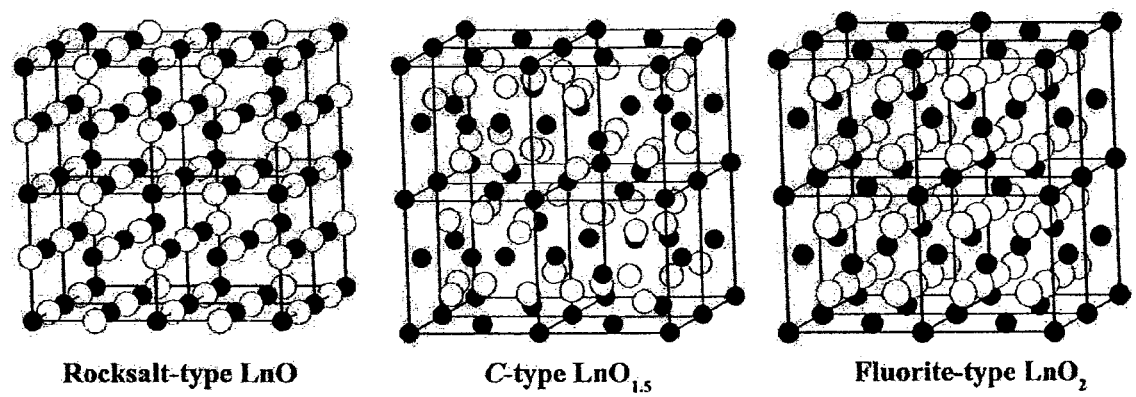
FIG. 7 are unit cells of rocksalt-type, C-type (bixbyite), and fluorite-type lanthanide oxides. The common structural element, an FCC cation sublattice, is clear in the images. Dark circles are Ln, white oxygen. The structures differ only in the distribution of the oxygen ions.

The crystal structural similarity of FCC cation-sublattice-based $LnO_z$ phases is shown in FIG. 7. dark circles represent the lanthanide cations. The unit cells of these phases are all FCC. Oxygens in rocksalt-type $LnO_z$ lie in octahedral sites, and in fluorite-type oxygens lie in tetrahedral sites. The C-type $LnO_{1.5}$ can be considered to be derived from fluorite through the removal of ¼ oxygens. Due to the large cationic radii of the lanthanides, the lattice parameters for the possible $LnO_z$ phases for any given lanthanon vary from 1.8 to 5.5%. The rigid FCC cation lattice defines the structure, unlike typical transition metal oxides. All three of these $LnO_z$ are epitaxially and topotactically compatible. This is a moderate mismatch, and results in the generation of nanodomains with minor mosaic upon topotactic conversion. It will, however, be shown below that this lattice mismatch can be reduced substantially, so that in practice essentially perfect topotactic conversion is possible.

Rocksalt-structured phases of pure lanthanide monoxides exist only for Eu and Yb. Others have typically been found to be nitrogen or carbon-stabilized. All lanthanide sesquioxides can assume the C-type bixbyite, essentially a fluorite structure with ¼ of the oxygens removed, and one half of cation positions distorted by ~12% from FCC. From $Nd_2O_3$ to $La_2O_3$, they may be metastable, but are observed perhaps due to low oxygen diffusivities at those temperatures.

Rocksalt-based, fluorite-based, and mixed lanthanide salts ($LnX_y$) also exist. These include $LnH_2$, $LnH_3$, $LnC_{0.33}$, LnN, LnP, LnS, LnSe, and LnTe, and have wide anion solubility ranges, as demonstrable by perusal of known compounds in materials databases, such as the *Powder Diffraction File* or the *Landolt-Bornstein Numerical Data and Functional Relationships in Science and Technology*. Superstoichiometric phases having oxygen in all octahedral sites, and some interstitials, are also known. Cations in $CeD_{2.29}$, $LaD_{2.30}$, and $PrD_{2.37}$ ($D=^2H$) are displaced slightly from the ideal fluorite, but not enough to form superlattice reflections in XRD patterns. In other words, very slightly, such that a good epitaxial fit is maintained.

"Rocksalt-based" indicates crystal structures comprised of a nominally FCC cation sublattice, with an interpenetrating nominally FCC anion sublattice, typically having a wide range of anion:cation stoichiometries, from about 0.2:1 to 3:1. Anions lie in octahedral sites.

"Fluorite-based" indicates crystal structures comprised of a nominally FCC cation sublattice, with an interpenetrating nominally $½a_0$ cubic anion sublattice, typically having a wide range of anion:cation stoichiometries, from about 1.2:1 to 2.5:1. Anions lie primarily in tetrahedral sites. The structure of C-type $Ln_2O_3$ (bixbyite) is considered fluorite-based.

Alloys also exist, for example lanthanide oxide-fluorides have been known since 1941, with the description of $La(O, F)_y$. The material accommodates an excess of anions as interstitials in a fluorite-type crystal structures. The anions in these phases are highly mobile, as is the case with other fluorites. (In many descriptions of chemical formulae of alloys, subscripts of individual alloy constituents are omitted, as many of these exhibit wide, continuously variable ranges of composition.)

Figure 8:
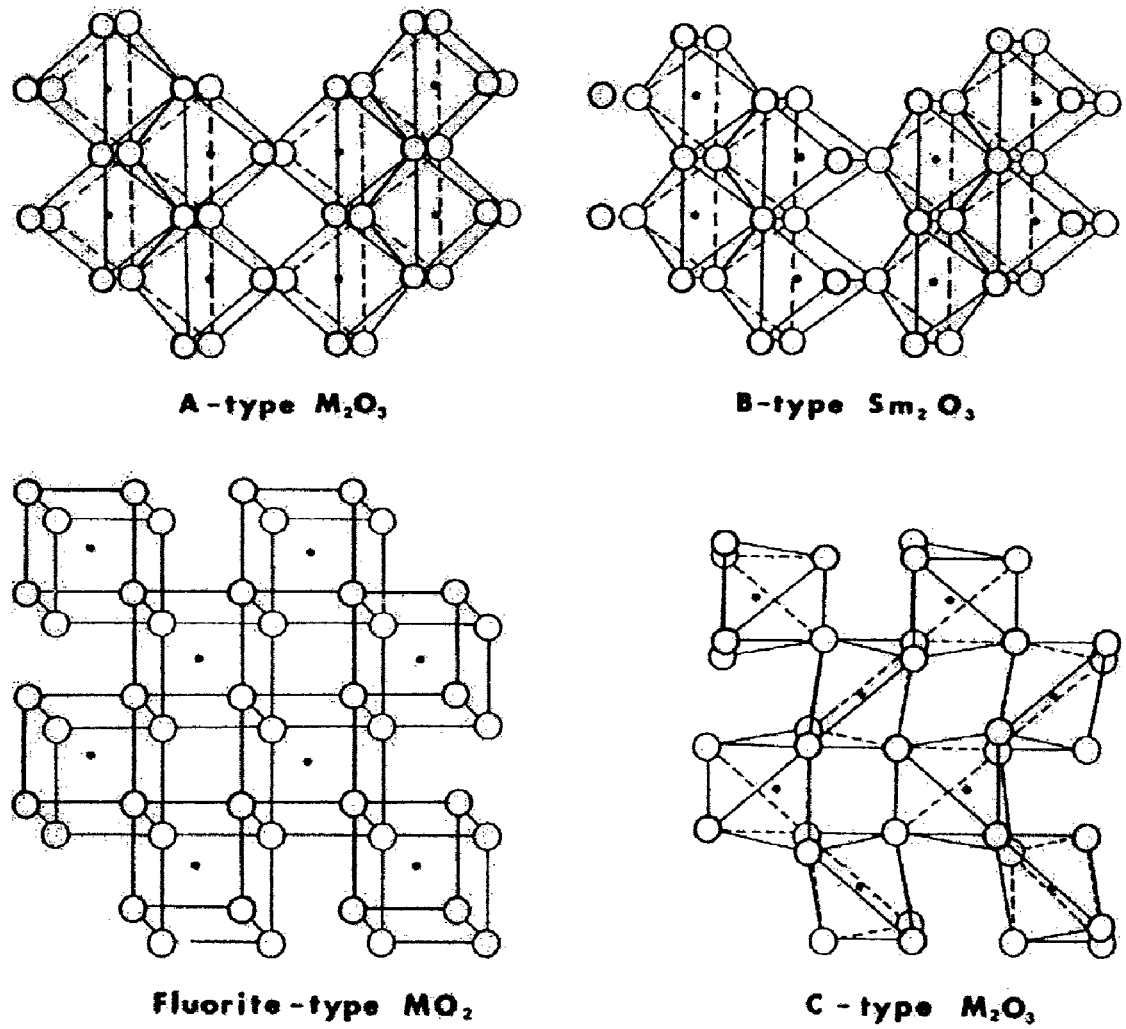
FIG. 8 shows the crystal structures of $Ln_2O_3$ and $LnO_2$. C-type and fluorite-type $LnO_z$ are amenable to the topotactic anion exchange method, but A-type and B-type $Ln_2O_3$ are not.

Not all $LnO_z$ phases are based on FCC cation sublattice. Because the radius ratios of $LnO_z$ are close to critical values, several other structures are observed. For $LnO_{1.5}$, A-type (hexagonal) and B-type phases can be considered to be derived from a fluorite-type parent, with the oxygen lattice preserved and the cation sublattice sheared to form a layer-type of structure, as known and illustrated in the art in FIG. 8. Such a crystal structure is not the most amenable to the topotactic anion exchange method, but in certain cases, such as with mixed high and low-diffusivity anions, is applicable. Epitaxial stabilization and kinetic limitations may act to stabilize the C-type form of some $LnO_z$ that would otherwise exist in the A or B-type form. All lanthanide oxides are stable (or metastable) at room temperature in the cubic form. At temperatures up to 1000° C., some undergo phase transitions to other forms, but the distortion is slight enough that epitaxy could stabilize the fully cubic form, or that the distortions would be low enough to avoid the introduction of domain boundaries in such a film.

b. Ordered Anion Phases

In some lanthanide oxides, many phases of composition intermediate between $Ln_2O_3$ and $LnO_2$ exist. The many different phases are members of a homologous series, $Ln_mO_{2m-m}$, first described for the $Pr_nO_{2n-2}$ system in 1965 (more specifically, the $Ln_mO_{2n-2m}$ homologous series). The FCC cation sublattice is essentially identical for all of them, such that the differences in structure are due to various arrangements of oxygen within this rigid FCC cation lattice. The different homologues form by the ordered introduction or removal of oxygen vacancies, with no cation interstitials required for the transformation.

Figure 9:
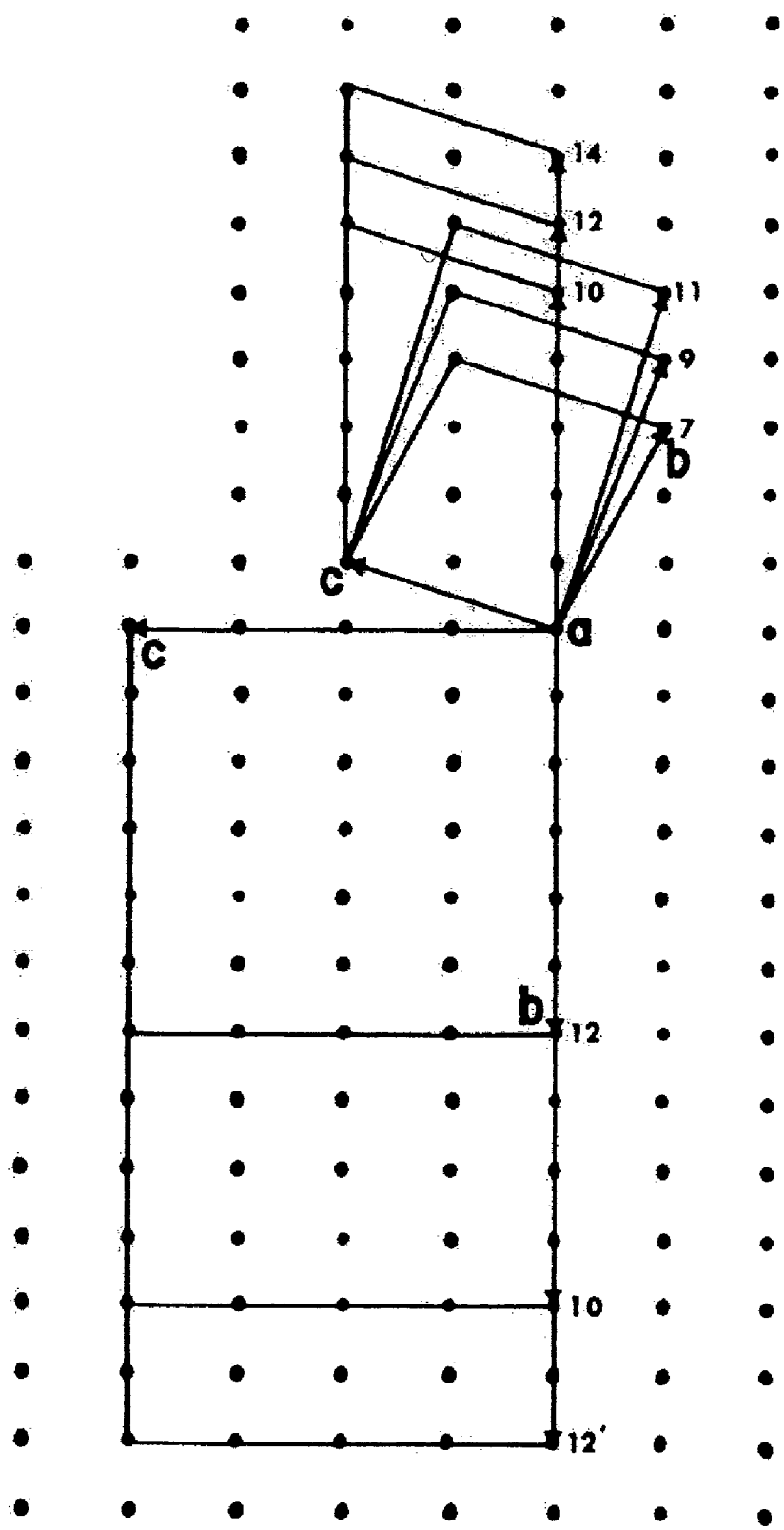
FIG. 9 demonstrates the multitude of monoclinic and other complex unit cells for $Ln_mO_{2n-2m}$ are all based on a nearly undistorted cation sublattice, as demonstrated here by the superposition of several monoclinic unit cells over a mesh of FCC cations, viewed here along <110>.

These many phases have a wide variety of monoclinic, triclinic, and rhombohedral unit cells that appear deceptively different from one another. They are all, in fact, essentially an FCC cation sublattice, each with a different ordering of the anions, and require no diffusional movement of the cations. This is shown schematically in the art in FIG. 9, which shows the Ln cations as black dots, viewed along [110] of the FCC cation sublattice. The unit cells for several different m are overlain this lattice, demonstrating the similarity they all share.

The various possible anion excess stoichiometries result in numerous different crystalline phases, called vernier phases. The structures of these phases are all derived from the same parent prototype structure, and differ only in anion stoichiometry, anion site ordering, and slight displacements of the cations, and slight distortions from the prototype cubic unit cell.

A great many composite modulated structures are known for anion alloys as well, such as Ln-O-F, Ln-O-N, and Ln-N-F systems. These are all based upon the fluorite structure, and differ only in the ordering of the anions through the rigid FCC cation lattice. For example, in the system Y-O-F, distinct phases exist for $Y_5O_4F_7$, $Y_6O_5F_8$, $Y_7O_6F_9$, $Y_{17}O_{14}F_{23}$, and so on. All of these have the same rigid FCC cation lattice, and differ in their cube-side-equivalent unit cell dimension by less than 0.4%. This is a very small mismatch, and indeed these phases intergrow readily. They consist only of ordering of the anions, due to high mobility of the anions.

Figure 10:
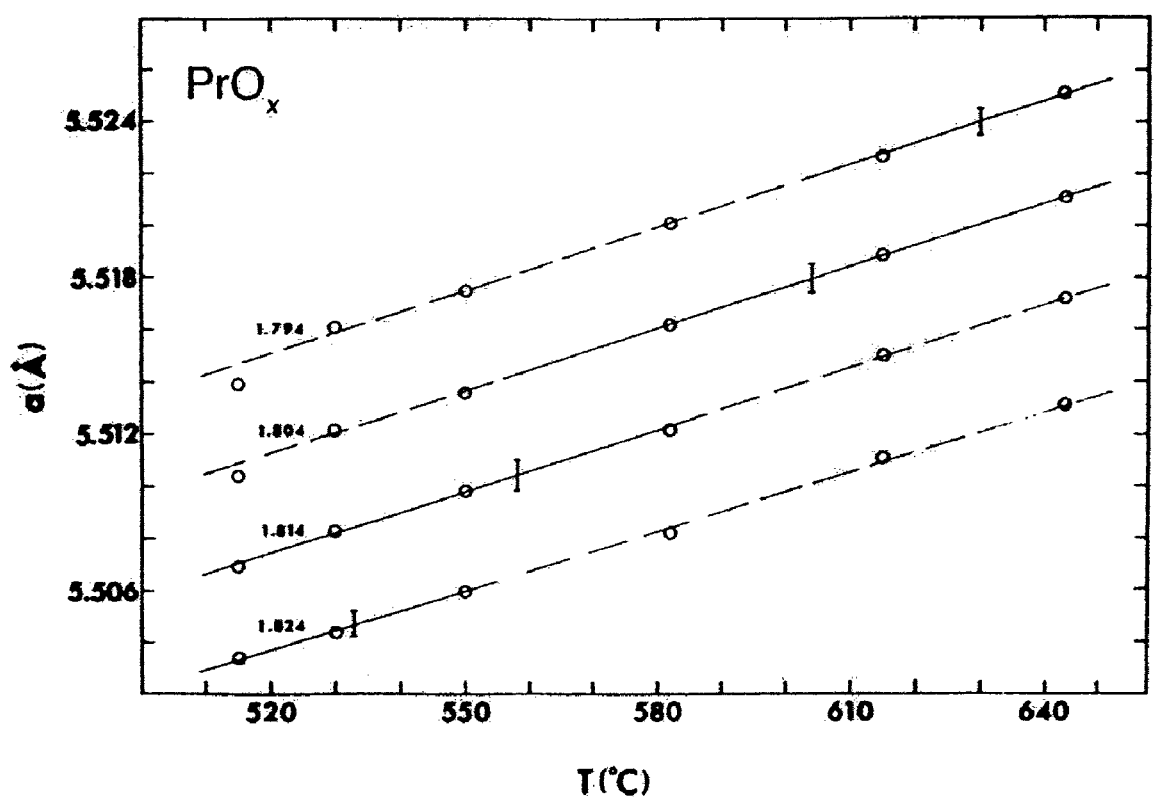
FIG. 10 is a plot of the lattice parameter of several $Ln_mO_{2n-2m}$, showing that transformation between the phases is smooth, with no sharp changes in lattice dimension that would induce dislocations, pores, or cracking, demonstrated here for $Pr_mO_{2m-m}$ (a subset of the $Ln_mO_{2n-2m}$ homologous series).

Anion exchange is a continuous process, as evidenced by the smooth change in lattice parameter with changing anion stoichiometry, having no abrupt, discrete shifts, which would tend to introduce defects, as shown in the art in FIG. 10. Changing anion stoichiometry does not necessitate any reordering of the cations, and thus topotactic oxygen exchange is not disruptive to an epitaxial film or single crystal. The reactions used to form various compositional variants of lanthanide oxides involve only a reaction with gaseous oxygen at elevated temperature.

The structural compatibility of $LnO_z$ phases is demonstrated by their topotactic coexistence in a single crystal, as observed by high-resolution transmission electron microscopy (HRTEM). An example is shown for the $PrO_z$ system in the art in FIG. 2, a HRTEM image of three domains in a single crystal of $PrO_{1.8}$. These domains have monoclinic, triclinic, and an undetermined unit cell, all with the same parent FCC cation sublattice, and have compositions of $PrO_{1.833}$, $PrO_{1.778}$, and $PrO_{1.833}$, respectively. Topotaxy is demonstrated by the electron diffraction patterns from the different regions. A second example is shown in the art in FIG. 1, where six different homologues are present in a single crystalline region of $TbO_z$ in an area less than $30\times15$ nm$^2$.

The situation of topotactic phase boundaries (or contiguous microdomains) of different compositions and structures is commonly encountered in materials involving reduced lanthanide oxides. It is important to note that macroscopic techniques such as powder x-ray diffraction are insensitive to these multiphasic microdomains.

c. Ordered Cation Phases

Many lanthanide-containing oxides having ordered cation arrays exist, and synthesis of these phases is amenable to the topotactic anion exchange method. Pyrochlore phases are essentially fluorite phases, with ordering of cations of differing valence on different sites in the FCC-based cation sublattice. Order tends to decrease anion diffusivities for a given composition that forms fluorite-type and ordered pyrochlore phases.

Figure 11:
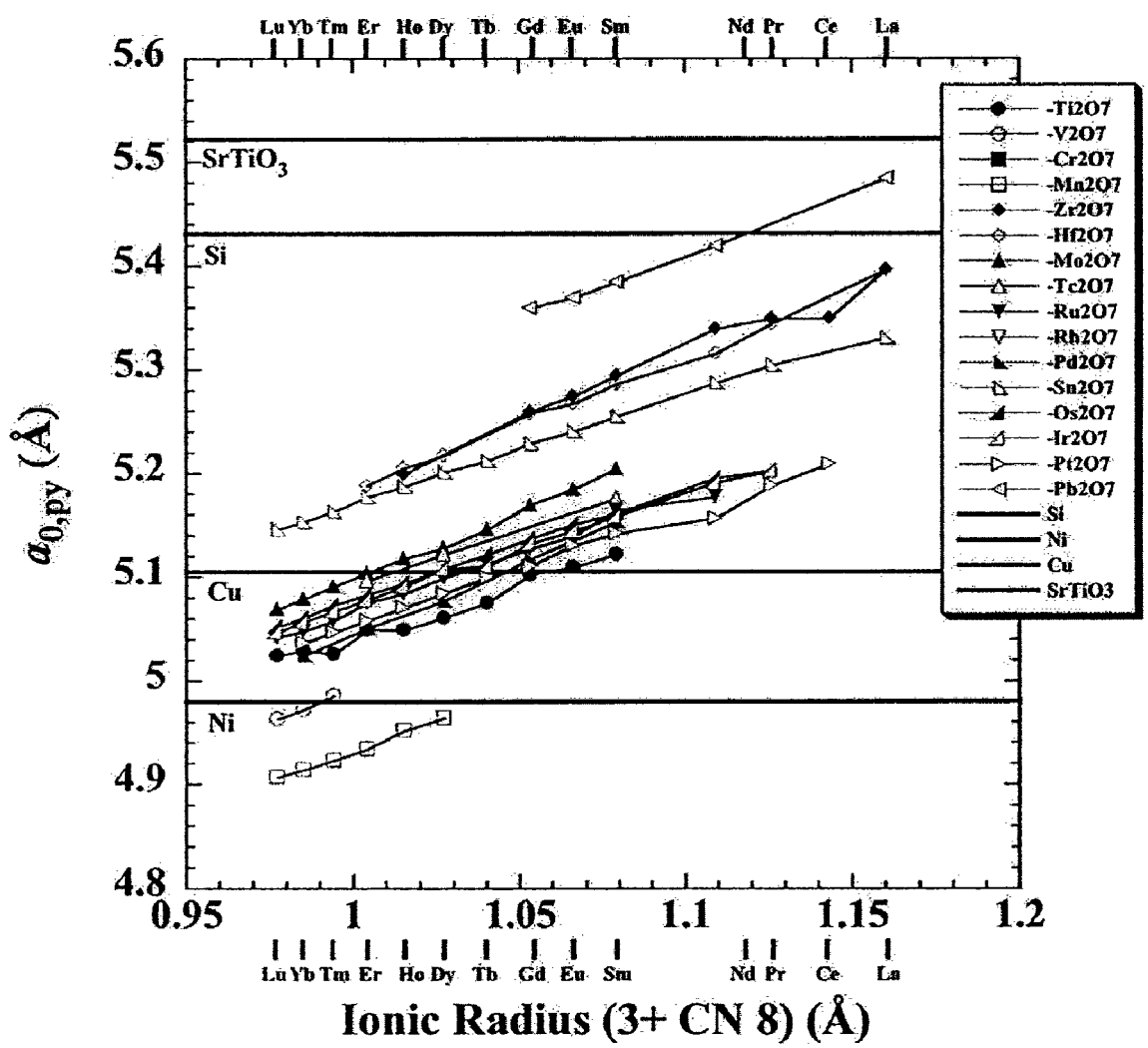
FIG. 11 is a plot of the lattice parameter of the pseudocubic subcell of numerous $Ln_2M_2O_7$. The fit to several typical substrates is also shown.

Crystalline phases comprising a major fraction of lanthanides are also suitable for topotactic anion exchange. As for the pure lanthanide cases, it is preferable but not necessary for both the precursor and product phase to have an FCC cation sublattice. An example of one such family of systems, $Ln_2B_2O_7$ pyrochlore phases. Pyrochlore is a fluorite-type phase, with A and B ordered in octahedral and cubic coordinated lattice sites, and with ⅛ of the oxygens removed. Numerous pyrochlore phases have excellent lattice match with common epitaxy substrates, as shown in FIG. 11. Some of these phases exist in known $Ln_2B_2X_m$ phases, but the literature record is incomplete. It is possible to predict, on the basis of oxygen mobilities in the pyrochlore phases, and on the existence of $LnX_y$ phases, which precursors are likely to exist, and which will best convert favorably to the desired oxide pyrochlore. (It should be noted that similar structures having the same or similar compositions also exist, in the form of numerous fluorite- and pyrochlore-related phases. These phases are nominally identical but with the A and B randomly distributed among the FCC sites.)

Figure 12:
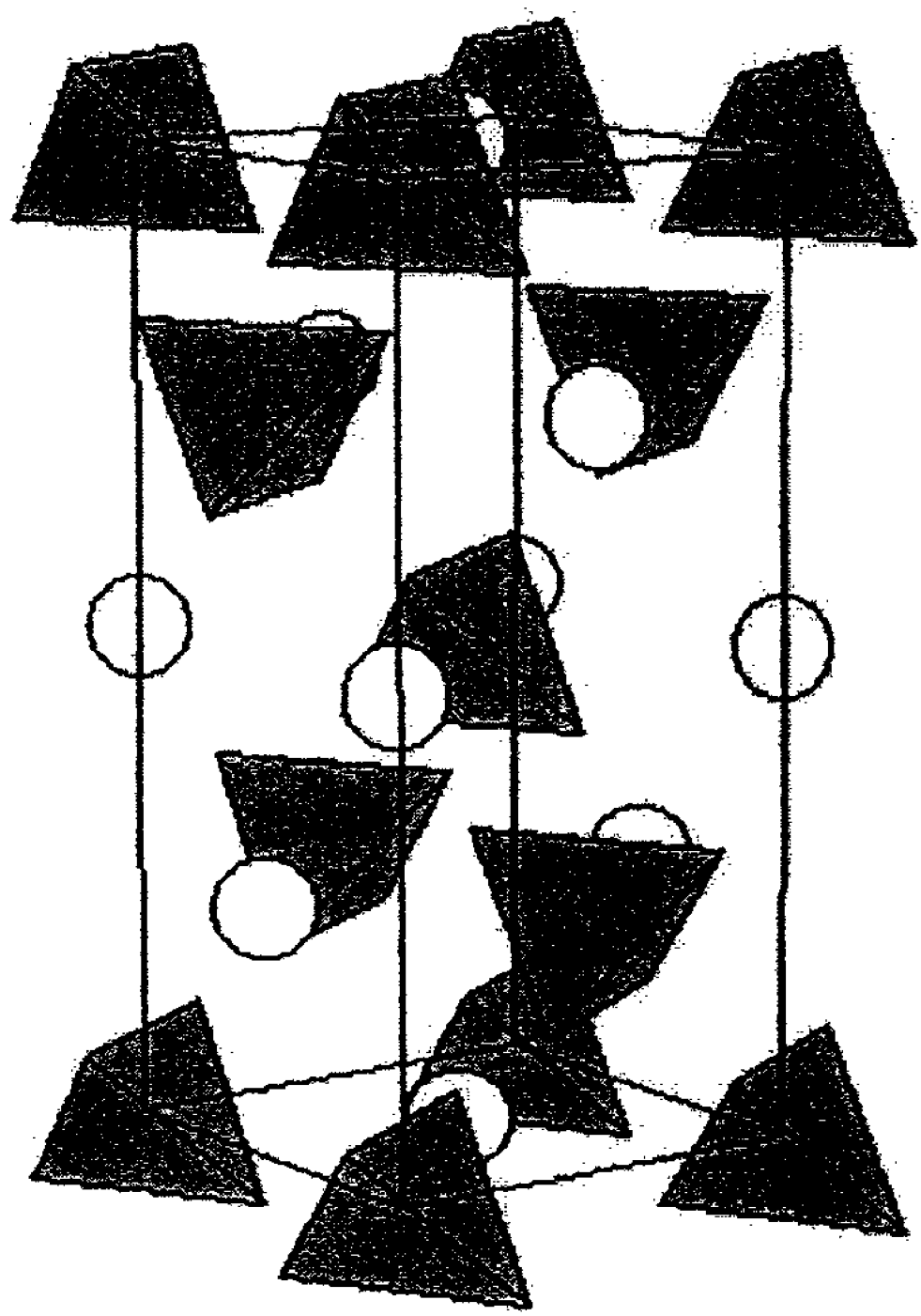
FIG. 12 is the structure of $EuWO_4$, exhibiting the scheelite structure. The cation lattice is FCC, alternating Eu and W along <110>. Tetrahedra are W, with oxygen at apices, and circles are Eu.
Figure 13:
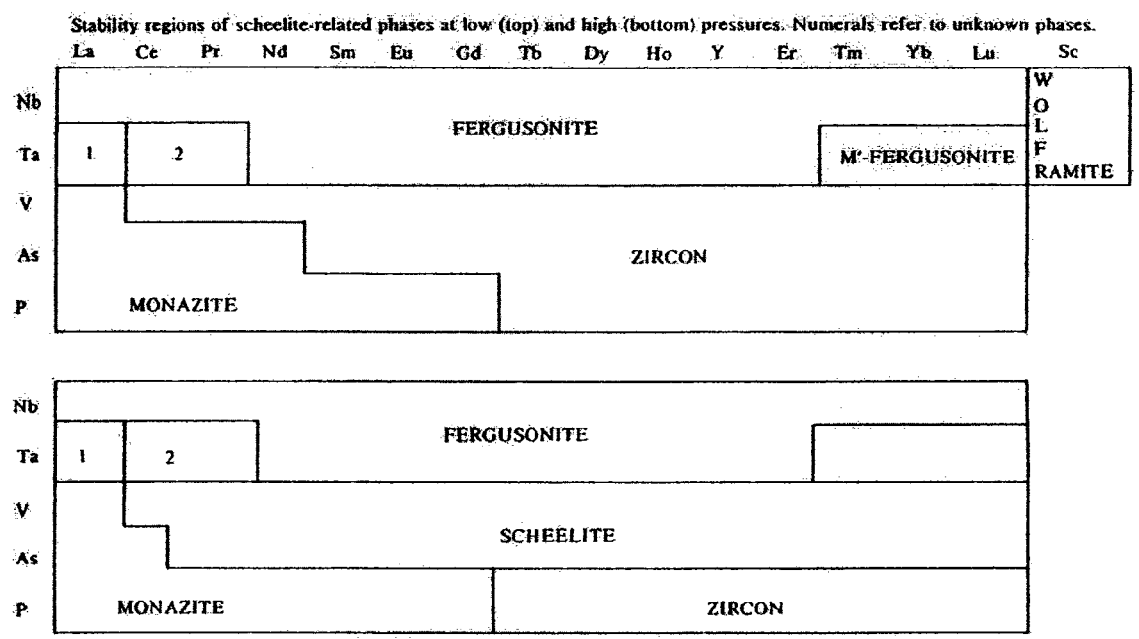
FIG. 13 is the observed $LnTrO_4$ crystal structures. Those having fergusonite, wolframite, or scheelite structures have FCC or slightly distorted FCC cation sublattices, and are amenable to topotactic anion exchange.

Ordered phases of alloys that are not entirely lanthanide-based, such as $LnTrO_4$ Scheelite type phases (Tr=transition metal), observed for Nd through Ho, are also suitable. The cations are alternately layered along <110> of a fluorite-type parent to yield a tetragonal unit cell that is essentially a superstructure of fluorite. An example in the art is shown in FIG. 12, for $EuWO_4$. An epitaxial precursor to a scheelite-type oxide would preferably be c-axis oriented, or less preferably with the c-axis in-plane, such that a domain structure results. Other orientations can also be useful. Distorted variants such as monoclinic Fergusonite may also be synthesized by the method. Zircon and monazite are highly distorted variants of scheelite, and are unlikely to easily yield topotactically converted oxide films without the introduction of significant defects. Other series of cation-ordered and fluorite-based lanthanide oxides are those with the wolframite structure. A diagram of the observed oxide phases for several $LnTrO_4$ is known and shown in FIG. 13.

For any of these oxide phases having ordered cation arrays to be formed by the topotactic anion exchange method, a suitable precursor having the same cation ordering is necessary. The ternary, quaternary, and higher systems that would yield such phases have not been fully explored. It is expected that such phases can be synthesized under the appropriate conditions, especially with appropriate selection of anions (Sec. I.1).

d. Layered-structure Materials

Layered phases can be used in a straightforward manner to present the desired surface. For example, a layered phase having a nominally square a-b, but a long c axis can be grown in a c-axis orientation on a substrate, and subsequently converted. Changes in the c dimension upon conversion are typically irrelevant to the process, because it is changes in the dimension of the a-b plane through conversion that are important for preservation of a functioning template layer. Anisotropy of candidate phases are both permanent and transitional.

Some permanent layered phases are the Ruddlesden-Popper series of phases, $A_{n+1}B_nO_{3n-1}$, based upon n number of perovskite-like subcells interleaved with rock-salt-type oxide double layers. The prototype structure of the n=1 compositions is $K_2NiF_4$. Numerous combinations of lanthanide oxides and other cationic species with oxygen, nitrogen, fluorine, and other anions are known. The rigidity of the lanthanide component of the cation lattice is sufficient in many cases to yield a topotactically transformable system. Anion diffusivities in many of these systems are unknown, but can be estimated based on their composition and structural families. Additionally, Ruddlesden-Popper phases have a BCC-based cation sublattice (see Sec. 0).

Transitional layered phases are those for which the precursor is highly anisotropic, but the product phase more closely approximates a cubic phase. An example of this is $LnC_2$ phases, which have an a-b mesh that closely matches that of analogous $Ln_2O_3$, but for which the c axis is expanded by about 65%. A c-axis $LnC_2$ film will convert topotactically to $LnO_z$ via evaporation of C in the form of CO, with a deflation in the c dimension of the lattice as the conversion front proceeds. $LnC_2$ have a-b plane lattice parameters, (Å), which closely match those for materials of technological importance, as shown in Table II.

It is possible to transform some perovskite-like ($ABO_3$) precursors to oxide perovskite-based phases. In these, the cation lattice is BCC, or two interpenetrating simple cubic cation sublattices. The cations can be all lanthanides, in the case of $DyScO_3$, can have one component be a lanthanide, $LaAlO_3$, or either of these can be alloyed to some degree with other cationic species of either lanthanide or other metals, such as transition metals or alkaline earth metals. Many of these phases are slightly distorted from cubic. Although most known lanthanide-containing perovskites are oxides (based on the strongly covalently bonded $BO_6^{2-}$ octahedra), some non-oxides and other partial oxides are known to exist.

Recent work has shown that perovskite-type $LnBO_3$ may have extremely high potential as barrier layers. Anion diffusivities in $ABO_3$ are typically much lower than for FCC-based phases. In fact, it has been demonstrated recently that single layers of oxygen vacancies can be trapped during growth of epitaxial $SrTiO_3$, at 760° C. An implication of this is that a lanthanide-containing perovskite-based (BCC-type cation sublattice) precursor only a few atoms thick can be sufficient to act as a barrier to oxygen diffusion to a sensitive substrate such as silicon, when only the top one or two atom layers is converted to oxide due to kinetic constraints. This is sufficient for templating action of the epitaxial barrier layer as well.

G. Lattice Match

1. Epitaxial Quality

For epitaxial growth of highly ionic materials such as oxides, if structure and bonding at the interface are compat-

TABLE II

Basal lattice parameter (a0) of LnC2 phases (Å).

| | $ScC_2$ | $YC_2$ | $LaC_2$ | $CeC_2$ | $PrC_2$ | $NdC_2$ | $SmC_2$ | $GdC_2$ | $TbC_2$ | $DyC_2$ | $HoC_2$ | $ErC_2$ | $TmC_2$ | $YbC_2$ | $LuC_2$ |
|---|---|---|---|---|---|---|---|---|---|---|---|---|---|---|---|
| $a_0$ | 3.99 | 3.644 | 3.92 | 3.88 | 3.85 | 3.82 | 3.76 | 3.718 | 3.690 | 3.669 | 3.643 | 3.620 | 3.600 | 3.637 | 3.563 |
| $\sqrt{2}a_0$ | 5.64 | 5.18 | 5.54 | 5.49 | 5.44 | 5.40 | 5.32 | 5.26 | 5.22 | 5.19 | 5.15 | 5.12 | 5.09 | 5.14 | 5.04 | e. Stuffed Structures

Stuffed structures, those with double layers of anions, are not amenable to the topotactic anion exchange method. In these phases, the lattice is defined to a great extent by the anion lattice. Thus, although a topotactic transformation is possible, it will be reorganizational. Examples of such systems include LnCl, LnBr, $Ln_2N_2S$, and $Ln_2O_2S$. ZrCl and ZrBr have graphite-like layered structures and take up oxygen interstitials easily.

f. Silicates

Some silicates exist, having crystal structures derived a distorted FCC lattice, and are likely to be amenable to the topotactic anion exchange method. Moreover, such phases are stable in contact with silicon. Appropriate Ln-Si-X phases remain to be identified. An example is olivine, $M_2SiO_4$. Silicon atoms are present in an alternating fashion between half of the neighboring M cations, such that the result is an orthorhombic phase, for which the oxygen lattice presents a square lattice on (011) and equivalent surfaces. This square lattice matches up nominally with that of $Ln_2O_3$ and perovskite phases.

2. Body-centered Cubic Cation Sublattice

The extreme resistance of lanthanide cations to diffusional migration in oxide LnX crystalline phases allows extension of the method to other structures that are not based on an FCC cation sublattice, and that have lanthanides as a major cationic component, namely ones having a body-centered cubic (BCC) -based cation sublattice.

ible, lattice match with the substrate is a major determinant of the quality of epitaxial film that can be grown. Thus, after chemical stability, lattice match is the main selection criterion useful for down-selecting the number of candidate systems for production of an epitaxial template layer via topotactic anion exchange.

Good lattice match minimizes defects. Misfit strain induces the formation of misfit dislocations, leading to mosaic spread in an epitaxial film. A high degree of misfit can lead to strain-induced surface roughening.

Figure 14:
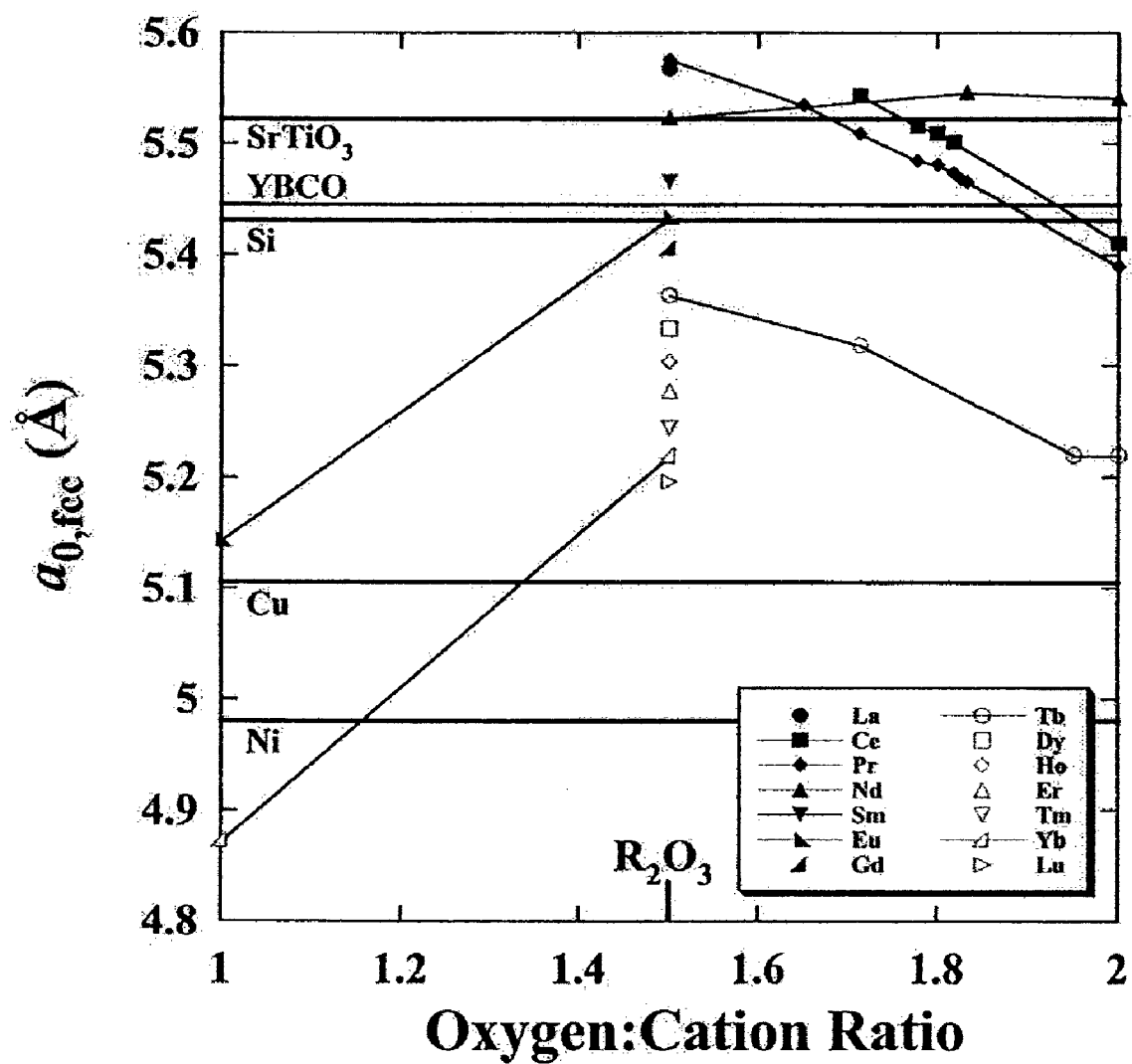
FIG. 14 is a plot of the lattice parameter of the pseudocubic subcell of $LnO_z$. The fit to several typical substrates is also shown.

The lattice parameter of the pure lanthanide oxides varies with oxygen content, as demonstrated in FIG. 14, a plot of the pseudocubic FCC cation sublattice dimension versus oxygen content for the lanthanides. The horizontal axis represents the cation radii, and all of the lanthanides are marked on that axis. All lanthanides are observed as $Ln_2O_3$ bixbyite (C-type) at room temperature. Under oxidizing or reducing conditions, some will form higher or lower oxides, such as rocksalt-structured EuO and YbO, or fluorite-type $NdO_2$, $CeO_2$, $PrO_2$, or $TbO_2$. Several intermediate phases in a homologous series lie between $Ln_2O_3$ and $LnO_2$ for the latter, consisting of variations in the ordering of the oxygens in the FCC cation sublattice. These phases readily transform topotactically from one homologous series member to another. The retention of crystalline integrity with changing oxidation states indicates the suitability of these phases for the topotactic conversion method.

Figure 15:
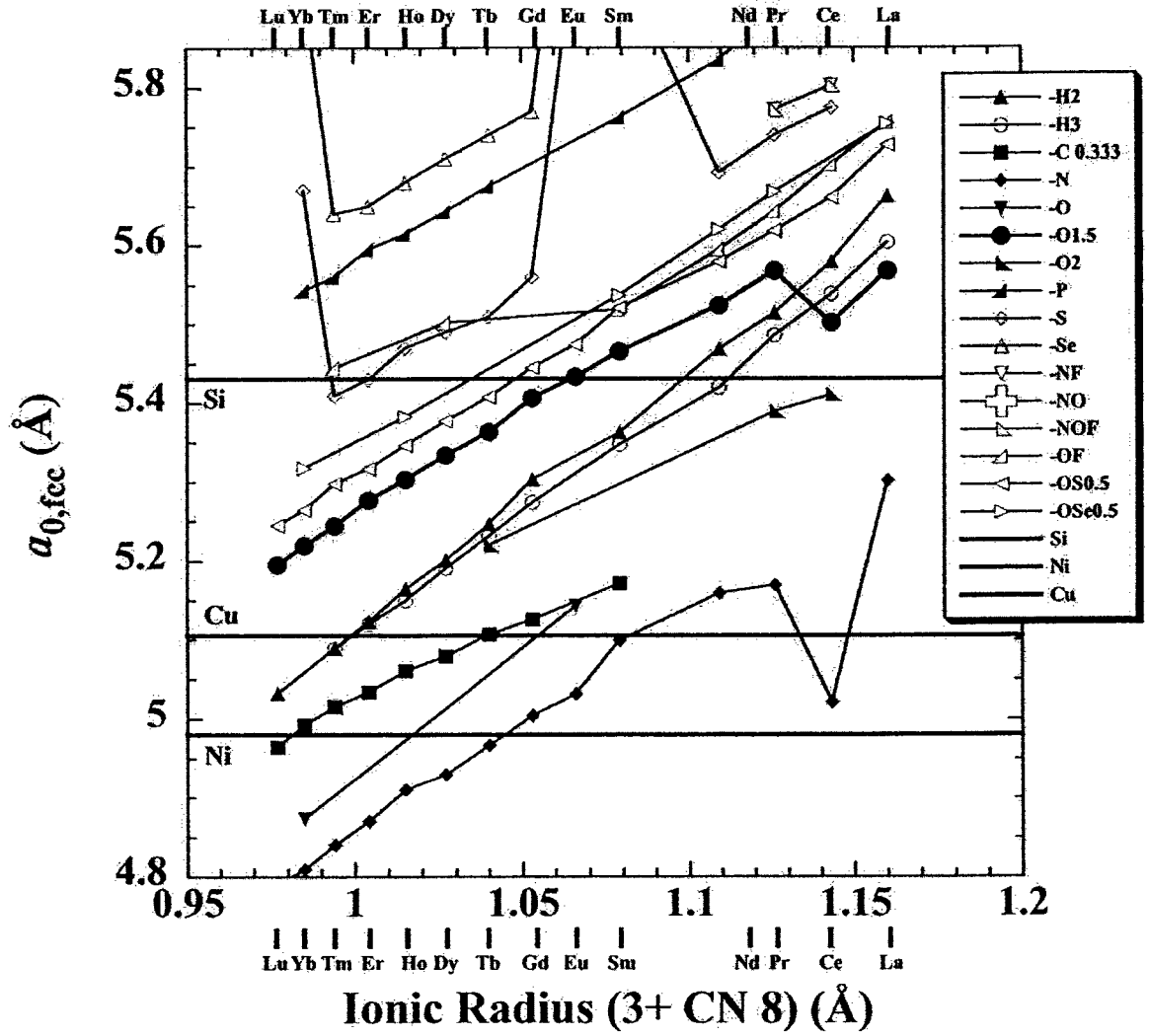
FIG. 15 is a plot of the lattice parameter of the pseudocubic subcell of numerous $LnX_y$. The fit to several typical substrates along a structurally-compatible axis is also shown.

To maximize the quality of film epitaxy, for both the $LnO_z$ and for any epitaxial film which will be deposited on the $LnO_z$ template layer, it is necessary to select a $LnX_y$ composition that has a suitable lattice match with the substrate (and for $LnO_z$ to the templated film). The lattice parameter of a large number of $LnX_y$ are shown in FIG. 15, along with the lattice parameter of some common substrates used for epitaxial deposition, for comparison. Each data point indicates a specific lanthanon and a specific anion for an $LnX_y$ (e.g., the filled diamond at the bottom left represents YbN, with $a_0$=4.81 Å). All of these phases have crystalline structures based on an FCC cation sublattice, although a few of them take hexagonal form at elevated temperatures, which epitaxial strain can stabilize the C-type form. Many $LnO_z$ have been reported and later shown to be nitrogen-stabilized rock-salt-structured Ln(N,O), or occasionally hydrogen, carbon, or sulfur stabilized. These are not included in the plot due to uncertainties in reported values available in the literature, but they are certainly viable candidates for the method. An infinite variety of compositions exists by cation substitution, cation doping, cation alloying, anion substitution, anion doping, anion alloying, and partial or excess anion site filling, such that it is not possible to enumerate all of the possibilities.

Figure 16:
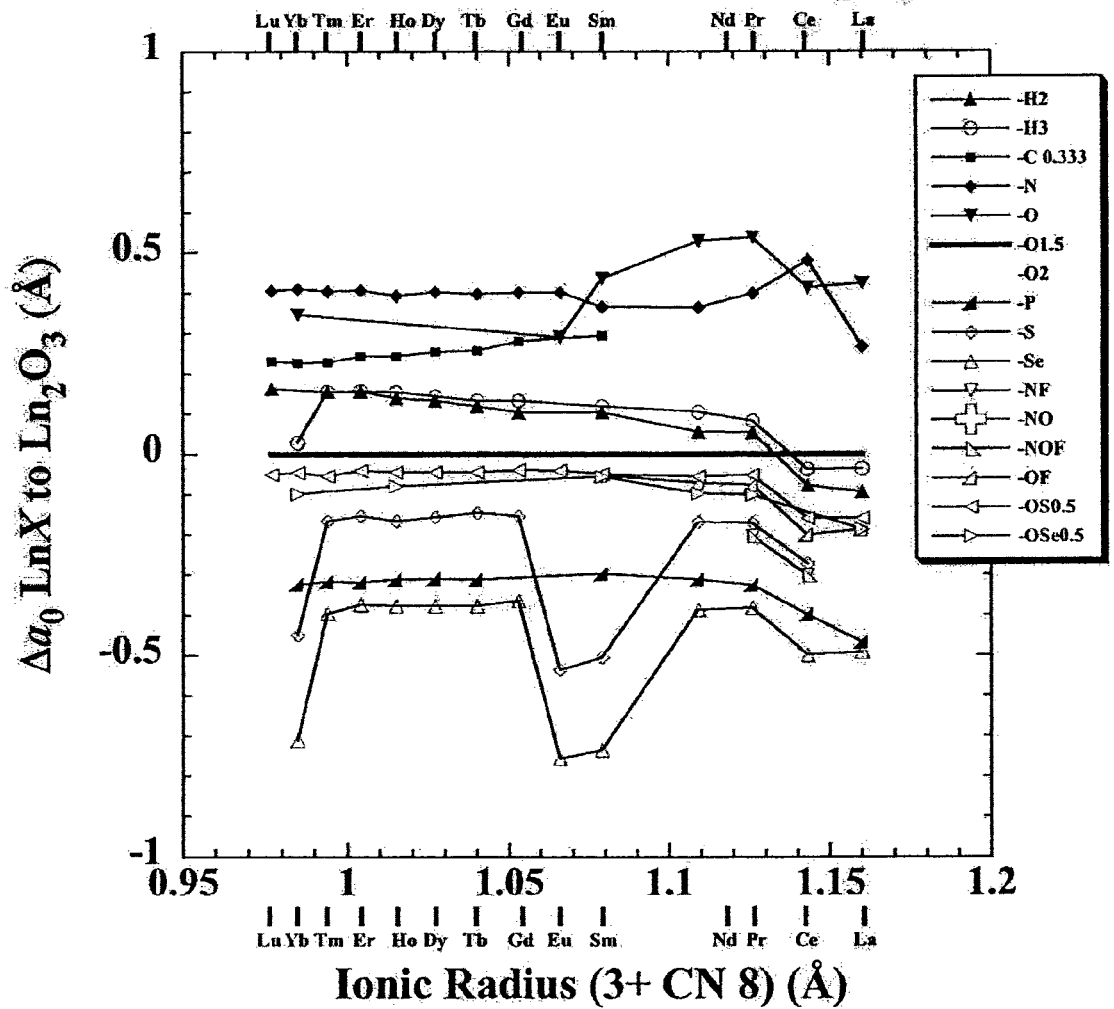
FIG. 16 is a plot of the change in lattice parameter of the pseudocubic subcell of numerous $LnO_z$ upon topotactic conversion from $LnX_y$.

Once several compositions are selected for potential use with a particular substrate-film system, it is useful to further consider the magnitude of the change in lattice parameter upon conversion to oxide. In general, the greater the change in lattice parameter from $LnX_y$ to $LnO_z$, the greater will be the mosaic spread introduced into the film texture upon conversion. Additionally, for more severe lattice dimension changes, defects such as cracks, domain boundaries, trapped vacancies, or even spallation of the film can occur. Thus, it is most reasonable to select a system having the smallest possible change in lattice parameter upon conversion, while taking into consideration all other potential factors as well such as chemical compatibility, electrical behavior, etc. To aid in selection, the absolute change in the lattice parameter (Å) of the pseudocubic subcell for a large number of $LnX_y$ are shown in FIG. 16. An average value for the pseudocubic lattice parameter is used for those phases with slightly differing parameters for the pseudocubic a, b, and c axes, such as those with a slight tetragonal distortion. Depending upon the lattice dimension of the substrate, these films may have domain structures and therefore the actual change in lattice parameter may vary slightly, on the order of a few tenths of a percent, variation which in any case is to be expected for processes involving different deposition conditions, film qualities, etc. The anion stoichiometry can be adjusted so that the change in lattice parameter is zero, for example by an appropriate mixture of N and F, N and S, or perhaps N, F, and S together, with or without the addition of oxygen, as may be allowed for a given chemical system.

Figure 17:
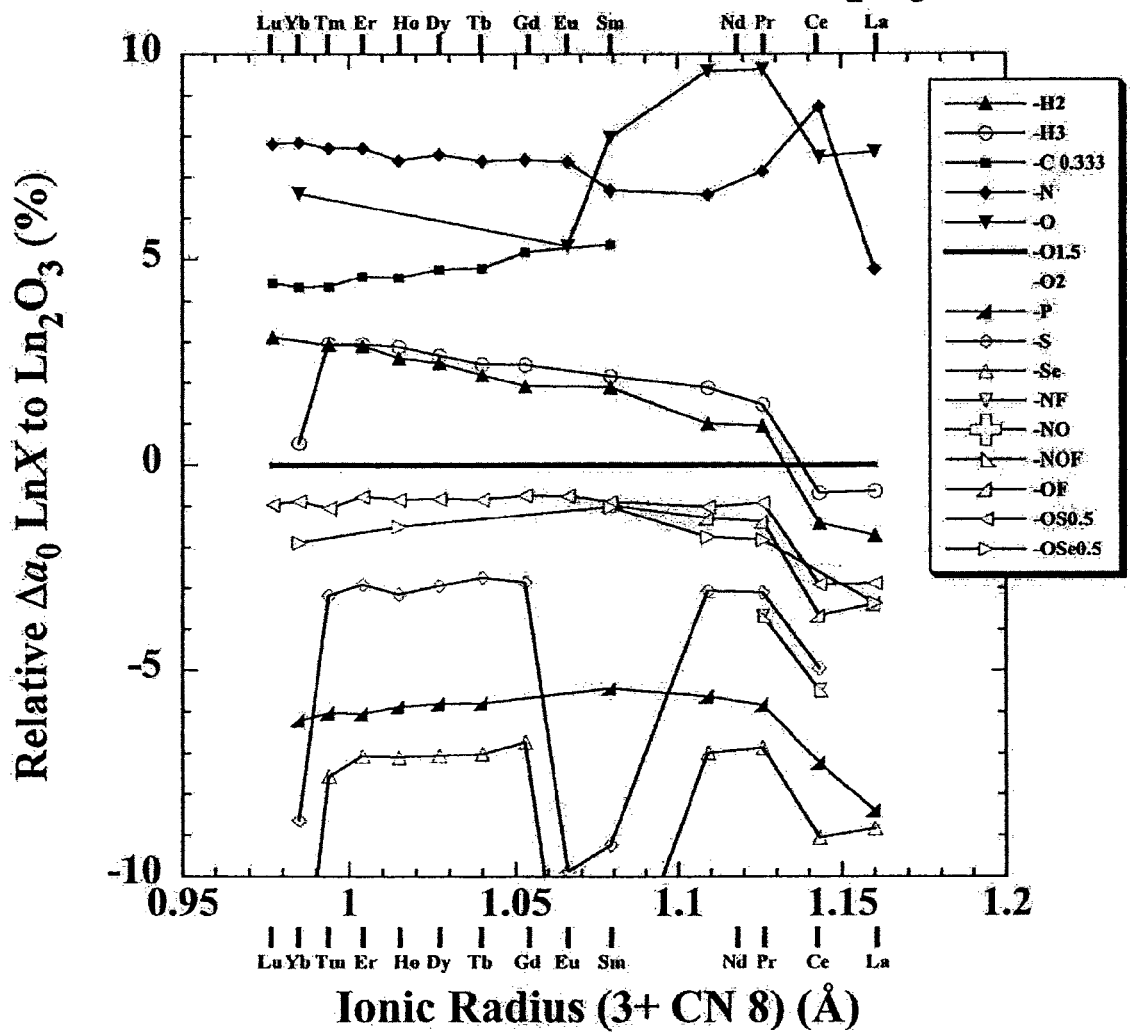
FIG. 17 is a plot of the relative change in lattice parameter of the pseudocubic subcell of numerous $LnO_z$ upon topotactic conversion from $LnX_y$.

It is further useful to consider the relative change in the lattice parameter of the pseudocubic subcell with conversion. This data is shown in FIG. 17. A smaller change is preferred, but this will not always be possible. A general rule of thumb is to keep this misfit below 5% to minimize the introduction of defects.

The process is also applicable for biaxially textured, fiber textured, and polycrystalline films.

2. Strain Affects Lattice Parameter

Bulk and single crystals of lanthanide oxides undergo polymorphic transformations, and frequently shatter on cooling from very high temperatures, particularly for displacive transformations. Such problems are mitigated or absent in epitaxial films, which are very thin in one dimension, and are clamped at the film/substrate interface.

3. Epitaxial Stabilization and Topotactic Stabilization

The power of topotactic stabilization likely exceeds that of epitaxial stabilization. In epitaxial stabilization, tensile or compressive strain energy tips the energy balance to stabilize one phase in preference to another, when thermochemical conditions for an unstrained material would otherwise favor only one.

The lattice constraint of epitaxy allows a fine degree of control over the energetics of phase formation, because it allows the control of strain energy, which is not a possible mode of control in bulk systems. This can allow the formation of materials impossible to synthesize by conventional means. Because material undergoing a topotactic reaction is constrained in three dimensions, not the two dimensions of a surface, cases exist wherein a greater strain can be tolerated before strain relief mechanisms begin to act. Moreover, the reduced dimensionality of the thin film form can reduce the build-up of three-dimensional strain which causes mosaic or disintegration of three-dimensional single crystals.

For example, the topotactic dehydration of $MO_3 \cdot \frac{1}{3}H_2O$, M=W or Mo, yields hexagonal $MO_3$, which cannot be formed by conventional methods. The transformation is topotactic and transformational, progressing by oriented nucleation and growth to yield a product with an orientation relationship of $(001)_{parent} \parallel (100)_{product}$ and $[100]_{parent} \parallel [100]_{product}$. Dehydration of $MoO_3 \cdot \frac{1}{3}H_2O$ yields a metastable monoclinic $MoO_3$ with a distorted $ReO_3$ structure. This transforms irreversibly at ~370° C. to the stable orthorhombic form.

4. Thermal Expansion

In choosing a film to obtain optimal lattice match, it is important to consider the coefficient of thermal expansion of the substrate, and of the precursor and product films. Rare earth sesquioxides have thermal expansion coefficients ranging from 8.3 to 10.8 ppm/° C., over approximately room temperature to 800° C. Because this parameter does not vary much between systems, it is considered a minor consideration.

H. Cation Selection

Lanthanides having similar valence behave similarly. These are shown in Table III. $LnO_z$ with multiple valence are considered most amenable to topotactic anion exchange. On the other hand, $LnO_z$ with only a single valence, three, will be the least likely to have high concentrations of electronically active defects, but these can be pacified to some extent by hydrogen anneal, after complete conversion.

TABLE III

Observed valence states of lanthanide elements.

| Lanthanide | Valence States | | | |
|---|---|---|---|---|
| | 2, 3 | 3 | 3, 4 | 4 |
| Sc | | Sc | | |
| Y | | Y | | |
| Zr | | | | Zr |
| La | | La | | |
| Ce | | | Ce | |
| Pr | | | Pr | |
| Nd | | Nd | | |
| Pm | | Pm | | |
| Sm | Sm | | | |
| Eu | Eu | | | |
| Gd | | Gd | | |
| Tb | | | Tb | |
| Dy | | Dy | | |
| Ho | | Ho | | |
| Er | | Er | | |
| Tm | Tm | | | |

TABLE III-continued

Observed valence states of lanthanide elements.

| Lanthanide | Valence States | | | |
|---|---|---|---|---|
| | 2, 3 | 3 | 3, 4 | 4 |
| Yb | Yb | | | |
| Lu | | Lu | | |
| Hf | | | | Hf |

I. Anion Selection

1. Lattice Sizes and Chemistry

Smaller anions, Row II of the periodic table, are most amenable to the method. Hydrogen has been observed to stabilize many rocksalt $LnX_y$, through incorporation into the tetrahedral sites. It is also possible to fill half of the tetrahedral voids with transition elements such as Ni and Pt. These are sometimes referred to as filled-up rocksalt-type phases, and are candidates for the topotactic anion exchange process. Diffusion of anionic components would be expected to be greatly slowed, with intermediate diffusivities on partial filling-up.

Ionic radius and charge must be considered in selecting appropriate anions. Preferred anion constituencies are those that most closely approximate both the charge and ionic radius of oxygen, as an average of the constituents. For example, a 50:50 mixture of $N^{3+}$ and $F^-$ is highly preferred, as their charges average to −2 (that of oxygen), their average ionic radius matches that of oxygen, and their individual ionic radii differ from that of oxygen by only 4%. Furthermore, because lanthanide phases based on an FCC cation sublattice (and also perovskites) can accommodate appreciable deficiency or excess of anionic components, the ratio can adjusted appreciably, and optimized experimentally. Another highly preferred anion constituency is one containing sulfur. The charge and ionic radius closely match that of oxygen. Sulfur's covalent bonding characteristics do differ from those of oxygen, so it cannot be substituted for oxygen without regard to this difference, as anion-rich lanthanide oxysulfides tend to have layered structures. Here, it is important to note the power of topotactic stabilization and kinetic limitations, such that a Ln-S metal-nonmetal compound may be successfully converted to a Ln-O metal-oxide compound and retain its FCC cation sublattice, as the temperature for topotactic anion exchange is far below that necessary for appreciable cationic rearrangement. Also, the interface between the Ln-S and Ln-O, where conversion is occurring, is constrained in three dimensions, placing further energetic limitations on the formation of phases which would be thermodynamically preferred in an unconstrained state. It is expected that these principles can be applied by one skilled in the art to determine further anion constituencies that will also approximate oxide, such as combinations of N, F, and S.

An infinite variety of anion stoichiometries exists, such that it is not possible to enumerate all possibilities. The nonmetal constituents of the metal-nonmetal film are preferably chosen from the group consisting of: H, C, N, F, P, S, Cl, Se, Br, Te, and combinations thereof. The nonmetal constituents of the metal-nonmetal film are more preferably chosen from the group consisting of: H, C, N, F, P, S, Cl, and combinations thereof The nonmetal constituents of the metal-nonmetal film are most preferably chosen from the group consisting of: N, F, S, and combinations thereof.

2. Exchange Mechanisms (C->CO)

It is important to consider the chemical species involved in anion exchange for the various systems, very large vapor species are prone to pore formation. For oxides, nitrides, and fluorides, exchange is by ionic diffusion to the surface and evaporation of diatomic elemental species. This may also be the case for phosphides, chlorides, selenides, and tellurides. For anion exchanges involving sulfur, formation of $SO_4^{2-}$ can be suppressed or reversed by ammonia gas. For anion replacement of carbon by oxygen, carbon is in some cases evolved as CO, dependent upon oxygen activity.

3. Partial Oxides

Compositions intermediate between $LnX_y$ and $LnO_z$ are also candidate compositions for the precursor. A partial oxide, $Ln(O,X)_y$, is deposited at a lower oxygen partial pressure than the pure oxide, such that the substrate is not oxidized, and is then topotactically converted to the full oxide. For example, if $Ln_2O_3$ cannot be deposited on a substrate without substrate oxidation, it may be possible to deposit $Ln_2(N,F,O)_y$, where the N:F:O stoichiometries vary with deposition conditions (gas background pressures), and which would require a lower oxygen partial pressure during growth, perhaps low enough to avoid substrate oxidation. For a given system, there will exist a maximum oxygen content (or deposition process $p_{O2}$, $H_2/H_2O$ ratio, etc.) at which substrate surface oxidation will be prevented. Specific parameters must be evaluated for each case. Likewise, post-deposition conversion to a full oxide is not always necessary, depending upon the specifics of a particular application and system. In general, oxygen content in precursor films is preferably 0 to 80%, more preferably 0 to 50%, and most preferably 0 to 20%.

4. Multistep Processes

An important consideration for a topotactic anion exchange process is that an anion stoichiometry exchange pathway that must allow the integrity of the single crystal to remain. For example, although direct reduction of $CeO_2$ for to $CeO_{1.67}$ results in a reversible topotactic reaction, more extensive reduction to $CeO_{1.5}$ ($Ce_2O_3$) results in disintegration of the single crystal, and the formation of a polycrystalline product. $Ce_2O_3$ assumes the A-type form at the temperatures of oxygen anion exchange used for that experiment, so this is not an unexpected result. The same type of exchange for a $LnO_z$ which assumes the C-type or fluorite-type structure at the exchange temperature is considered more likely to undergo the exchange successfully. Epitaxial constraint could also play a role in stabilizing a form having an FCC cation sublattice. Alternatively, it is possible that a pathway involving other anions would allow the FCC cation lattice to be maintained through the entire transition. Perhaps nitrogen of fluorine. There is a minimum concentration of various anions required for maintenance of the rigid cation sublattice. These can be determined from phase diagrams, and may be interpolated from the phase diagrams for anion alloys that have not been experimentally investigated.

J. Alloying

1. Cation

Wide intersolubility is observed for $LnX_y$ solid solutions of two or more differing Ln cations. This can be used to advantage to tailor the lattice parameter for a given system. It is also useful for controlling electronic and other properties of the films. Those with more similar radii are more likely to form continuous solid solutions across the range of compositions. An infinite variety of cation stoichiometries exists, such that it is not possible to enumerate all possibilities. The following provides guidance in selecting an appropriate stoichiometry.

a. Other Ln

Figure 18:
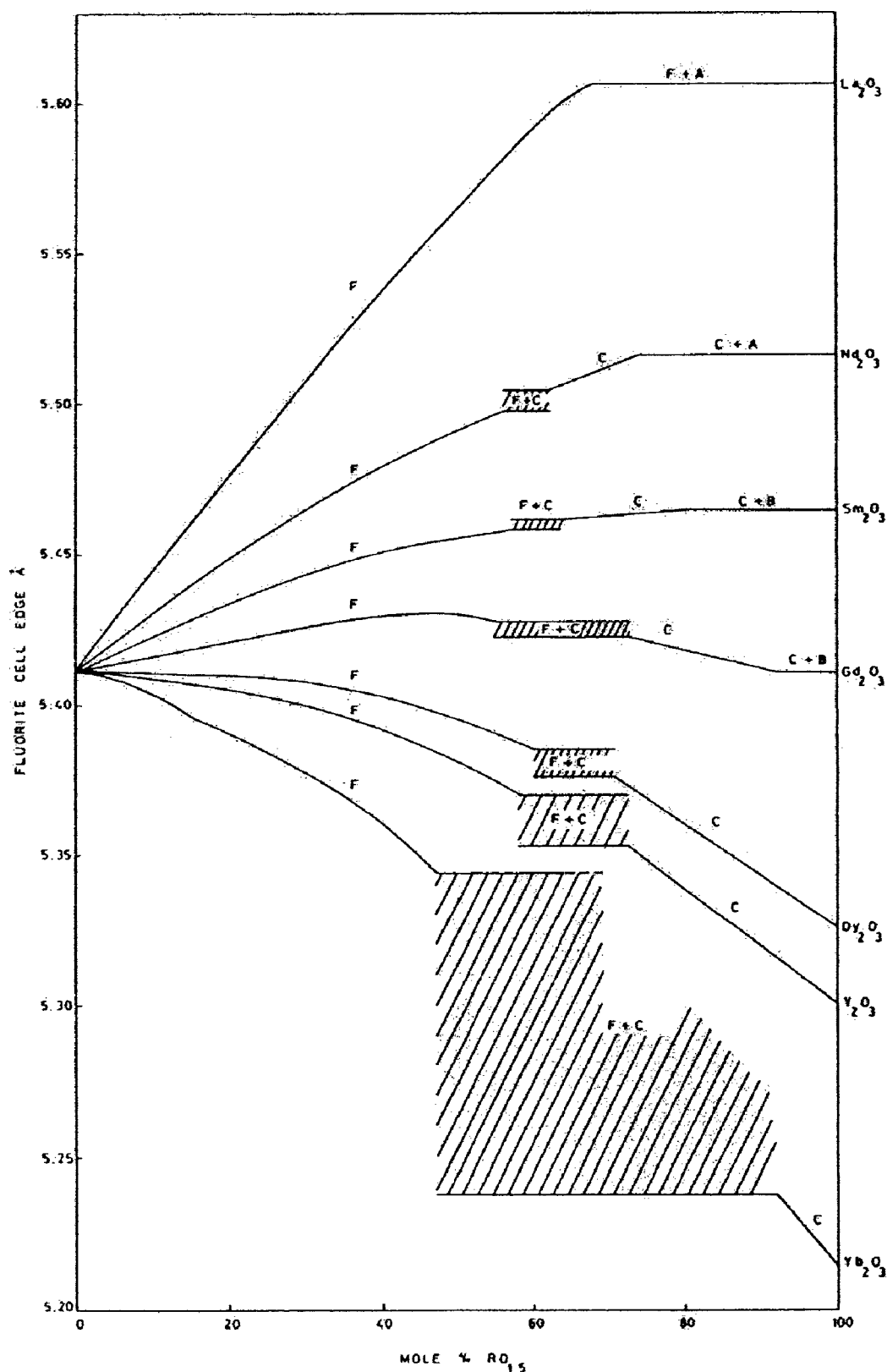
FIG. 18 is a plot of the lattice parameter of the pseudocubic subcell of $CeO_2$-$Ln_2O_3$ alloys, demonstrating the continuously variable range of lattice parameters achievable using the approach. Most of the two-phase regions are topotactically compatible.

Fluorite and bixbyite-structured oxides have wide solid solution ranges, and correspondingly widely varying lattice parameters and are topotactically compatible. Extensive solid solubilities of $LnO_2$-$Ln'_2O_3$ systems are observed to have fluorite or C-type structures, and to display a widely variable range of lattice parameters. The lattice parameter of solid solutions of $CeO_2$ with several $Ln'_2O_3$ are shown in the art in FIG. 18. These cover a range of 0.4 Å, with some systems covering a range of 0.2 Å between $CeO_2$ and $Ln'_2O_3$. It is important to note that, over almost the entire range, either fluorite or C-type oxide is the observed phase, indicating topotactic compatibility over this wide range. For systems that have not been measured, the lattice parameter of mixed oxides ($A_xB_{2-x}O_3$) having the same structure can be predicted using Vegard's law, which predicts a linear relationship with x. Similar trends are observed for $LnX_y$.

b. Other Metals

Figure 19:
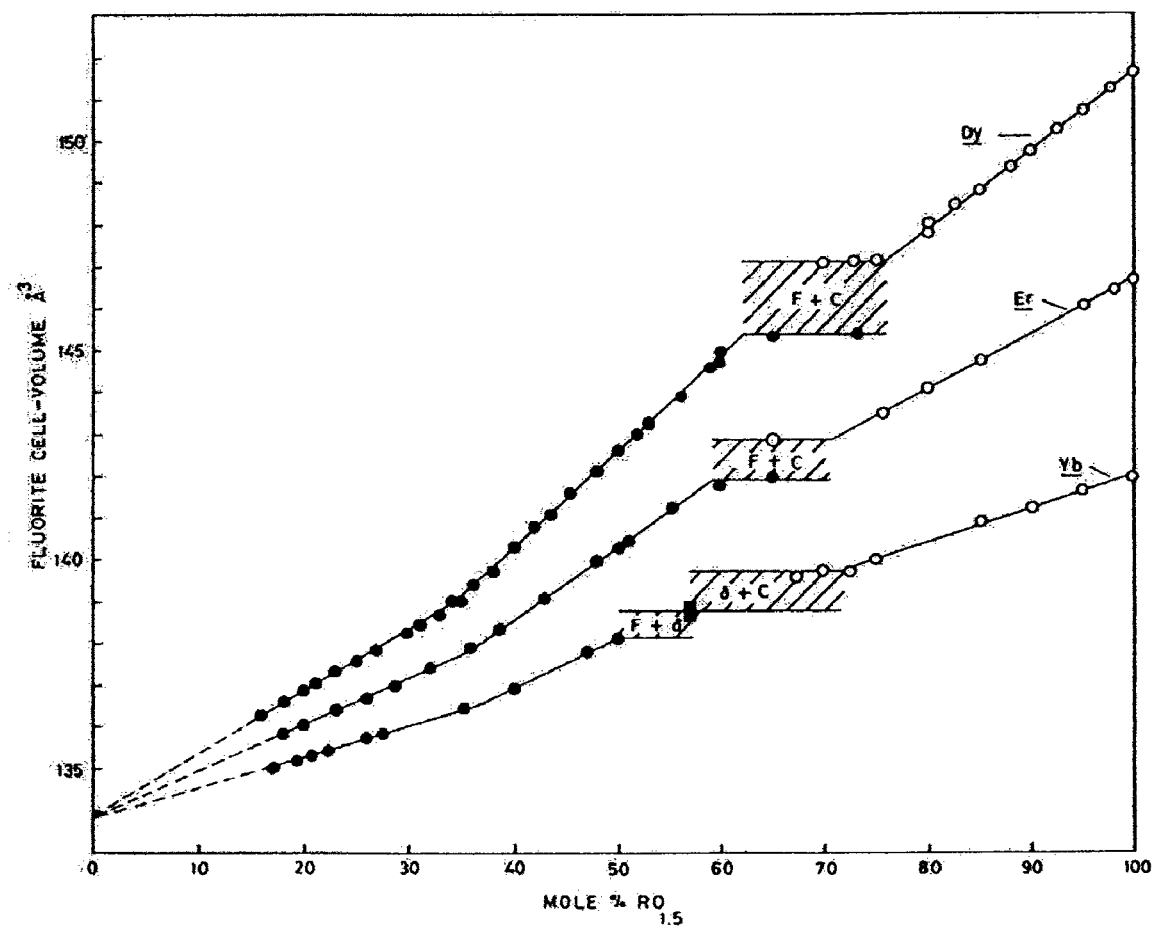
FIG. 19 is a plot of the lattice parameter of the pseudocubic subcell of $ZrO_2$-$Ln_2O_3$ alloys, demonstrating the continuously variable range of lattice parameters achievable using the approach. Most of the two-phase regions are topotactically compatible.

Other dopants, alloy components, and additives that might be added to an oxide can be incorporated in the precursor composition. For example, scandium can be added to ZrN, to yield scandium-stabilized cubic zirconia, which has the highest anion conductivity of all single dopant $ZrO_2$ systems. The lattice parameter of three $ZrO_2$-$Ln_2O_3$ cation alloy systems are shown in the art in FIG. 19. Note that either fluorite, C-type, or delta (fluorite-type) are observed over the entire composition range, indicating complete topotactic compatibility.

Numerous other ternary and higher lanthanide-containing crystalline phases are known to have structures having an FCC cation sublattice. These are also candidates for topotactic anion exchange. As halide unit cells increase in size through alloying, $(Ca,Ln)F_2$, unit cell volumes increase linearly, and also defect concentrations increase. Aliovalent cation dopants can also be used to alter electronic and atomic mobilities.

Examples of other functionality that can be provided by doping and alloying are as follows. Alloying can be used to minimize the deposition temperature required for a film, especially in cases where a low-melting-temperature substrate is used. Aliovalent doping can be used to alter the electrical conductivity of product films, and also to affect the anion mobilities in both precursor and product. This may be done to decrease mobilities, as in the case of ultra-thin films, or to increase mobilities, as in cases where the product phase will be used as an electrode. Generally, cation alloying is preferably 0 to 55%, more preferably 0 to 30%, and most preferably 2 to 20%. Cation alloying with Group IVA metals (Ti, Zr, and Hf) is preferably 0 to 75%, more preferably 0 to 49%, and most preferably 0 to 25%.

Compatible phases are not limited to those described. The method is extensible to include related structures. For example, structural compatibility of alkaline earth elements with lanthanide elements indicates that phases such as $BaZrN_2$, $K_2NiF_4$-type compounds, $LiTiO_2$ (close-packed anions, rocksalt-type structure), and other related phases can by synthesized from a LnX precursor. The incorporation of other cations are also possible, as long as the integrity of the FCC lanthanide cation sublattice is maintained. Manners in which the FCC cation sublattice could be broken are, for example, the insertion of an extra layer of alkaline earth ions every third cation layer, or the replacement of some of the lanthanide cations in their FCC sites by other cations, or the replacement of every n layers of lanthanide cations with a substituent cation, in the FCC cation sublattice.

The topotactic anion exchange process can be used for the production of perovskite films, which are desirable for many applications. Perovskites consist of two interpenetrating cubic cation sublattices, resulting in a BCC cation lattice. A perovskite precursor can be transformed under the proper thermal and oxidizing conditions to yield an epitaxial perovskite film. In particular, because oxygen mobility in some perovskites is limited, a metal-nonmetal perovskite ($LnBX_3$ or other BCC-cation lattice) precursor can be partially converted to a metal-oxide perovskite product, such that a layered structure of $LnBO_3$/$LnBX_3$/substrate results. This can provide the benefit of having a conductive bottom electrode, $LnBX_3$, topotactic with an insulating top layer ($LnBO_3$). Furthermore, this effect can be exploited for systems where different cationic constituencies are desired in the $LnBX_3$ and $Ln'B'O_3$ films, by depositing a $Ln'B'O_3$ film epitaxially on a $LnBX_3$ film. The likely result would be a topotactic $LnBO_3$ in between the epitaxial $Ln'B'O_3$ and the $LnBX_3$.

Selection of anions for a BCC-cation-sublattice system is more critical than for an FCC-cation-sublattice system, because the cation sublattice is not close-packed, and is stabilized in large part by the anions. BCC-based layered structures, such as the Ruddlesden-Popper phases, $Ln_{n+1}B_nO_{3n+1}$, can be synthesized by the same approach. The preferred anions will have both average charge and average ionic radius closely approximating that of oxygen, as described above. The tolerance factor, t, is an effective tool for predicting compositions that can form a specific phase. For perovskites of the formula $ABX_3$, the tolerance factor equation is $R_X + R_A = 1.414 \ast t \ast (R_X + R_B)$, there R is the ionic radius for 12-coordinated A, 6-coordinated B, or 6-coordinated X, and cubic perovskites are observed for values of t from 0.90 to 1.0. For values of t less than 0.90, down to 0.72 or less, perovskites having slight distortion from cubic are observed, either orthorhombic or monoclinic. Table IV lists the calculated tolerance factors for 3-3 perovskites, where A is the Ln having the greatest ionic radius, La ($R_A$=1.36 Å) in 12-coordination, for anionic components oxygen, 50:50 nitrogen-fluorine, and sulfur. Table V lists the calculated tolerance factors for 3-3 perovskites, where A is the Ln having the least ionic radius, Lu ($R_A$=1.03 Å) in 12-coordination, for anionic components oxygen, 50:50 nitrogen-fluorine, and sulfur. Table VI lists the calculated tolerance factors for 4-2 perovskites where A is Ce ($R_{Ce}$=1.14 Å) for anionic components oxygen, 50:50 nitrogen-fluorine, and sulfur.

TABLE IV

Tolerance factors (t) for 3-3 $LaBX_3$ compositions, where $R_{La}$ = 1.36, X = O, (N, F), or S, and $R_B$ is the ionic radius of the cation in Å. the existence of perovskite phases is predicted for t having values in the range of at least 0.72 to 1.0. Note that $LaAlO_3$, with a t = 1.01, is known to exist as a distorted perovskite.

| B | $R_B$ | t O | t N, F | t S |
|---|---|---|---|---|
| Al | 0.54 | 0.89 | 0.89 | 0.85 |
| Co | 0.58 | 0.87 | 0.87 | 0.84 |
| Ni | 0.58 | 0.87 | 0.87 | 0.84 |
| Fe | 0.60 | 0.86 | 0.86 | 0.83 |
| Cr | 0.62 | 0.85 | 0.85 | 0.83 |
| Mn | 0.62 | 0.85 | 0.85 | 0.83 |
| Ga | 0.62 | 0.85 | 0.85 | 0.83 |
| V | 0.64 | 0.84 | 0.84 | 0.82 |
| Ti | 0.67 | 0.83 | 0.83 | 0.81 |
| Rh | 0.67 | 0.83 | 0.83 | 0.81 |
| Ru | 0.68 | 0.83 | 0.83 | 0.81 |
| Ir | 0.68 | 0.83 | 0.83 | 0.81 |
| Mo | 0.69 | 0.82 | 0.82 | 0.80 |
| Nb | 0.72 | 0.81 | 0.81 | 0.79 |
| Sc | 0.75 | 0.80 | 0.80 | 0.78 |
| Pd | 0.76 | 0.80 | 0.80 | 0.78 |
| In | 0.80 | 0.78 | 0.78 | 0.77 |

TABLE IV-continued

Tolerance factors (t) for 3-3 LaBX$_3$ compositions, where R$_{La}$ = 1.36, X = O, (N, F), or S, and R$_B$ is the ionic radius of the cation in Å. the existence of perovskite phases is predicted for t having values in the range of at least 0.72 to 1.0. Note that LaAlO$_3$, with a t = 1.01, is known to exist as a distorted perovskite.

| B | R$_B$ | t O | t N, F | t S |
|---|---|---|---|---|
| Lu | 0.86 | 0.76 | 0.76 | 0.75 |
| Yb | 0.87 | 0.76 | 0.76 | 0.75 |
| Tm | 0.88 | 0.75 | 0.75 | 0.75 |
| Tl | 0.89 | 0.75 | 0.75 | 0.74 |
| Er | 0.89 | 0.75 | 0.75 | 0.74 |
| Y | 0.90 | 0.75 | 0.75 | 0.74 |
| Ho | 0.90 | 0.75 | 0.75 | 0.74 |

TABLE V

Tolerance factors (t) for 3-3 LuBX$_3$ compositions, where R$_{Lu}$ = 1.03, X = O, (N, F), or S, and R$_B$ is the ionic radius of the cation in Å. the existence of perovskite phases is predicted for t having values in the range of at least 0.72 to 1.0.

| B | R$_B$ | t O | t N, F | t S |
|---|---|---|---|---|
| Al | 0.54 | 1.01 | 1.01 | 0.95 |
| Co | 0.58 | 0.99 | 0.99 | 0.94 |
| Ni | 0.58 | 0.99 | 0.99 | 0.94 |
| Fe | 0.60 | 0.98 | 0.98 | 0.93 |
| Cr | 0.62 | 0.97 | 0.97 | 0.92 |
| Mn | 0.62 | 0.97 | 0.97 | 0.92 |
| Ga | 0.62 | 0.97 | 0.97 | 0.92 |
| V | 0.64 | 0.96 | 0.96 | 0.91 |
| Ti | 0.67 | 0.94 | 0.94 | 0.90 |
| Rh | 0.67 | 0.94 | 0.94 | 0.90 |
| Ru | 0.68 | 0.94 | 0.94 | 0.90 |
| Ir | 0.68 | 0.94 | 0.94 | 0.90 |
| Mo | 0.69 | 0.93 | 0.93 | 0.89 |
| Nb | 0.72 | 0.92 | 0.92 | 0.88 |
| Sc | 0.75 | 0.91 | 0.91 | 0.87 |
| Pd | 0.76 | 0.90 | 0.90 | 0.87 |
| In | 0.80 | 0.89 | 0.89 | 0.86 |
| Lu | 0.86 | 0.86 | 0.86 | 0.84 |
| Yb | 0.87 | 0.86 | 0.86 | 0.84 |
| Tm | 0.88 | 0.86 | 0.86 | 0.83 |
| Tl | 0.89 | 0.85 | 0.85 | 0.83 |
| Er | 0.89 | 0.85 | 0.85 | 0.83 |
| Y | 0.90 | 0.85 | 0.85 | 0.83 |
| Ho | 0.90 | 0.85 | 0.85 | 0.83 |

TABLE VI

Tolerance factors (t) for 4-2 CeBX$_3$ compositions, where R$_{Ce}$ = 1.14, X = O, (N, F), or S, and R$_B$ is the ionic radius of the cation in Å. the existence of perovskite phases is predicted for t having values in the range of at least 0.72 to 1.0.

| B | R$_B$ | t O | t N, F | t S |
|---|---|---|---|---|
| Fe | 0.69 | 0.86 | 0.86 | 0.83 |
| Ni | 0.69 | 0.86 | 0.86 | 0.83 |
| Co | 0.70 | 0.86 | 0.86 | 0.83 |
| Cu | 0.73 | 0.84 | 0.84 | 0.82 |
| Zn | 0.74 | 0.84 | 0.84 | 0.82 |
| Mn | 0.75 | 0.84 | 0.84 | 0.81 |
| Cr | 0.77 | 0.83 | 0.83 | 0.81 |
| V | 0.79 | 0.82 | 0.82 | 0.80 |
| Pt | 0.80 | 0.82 | 0.82 | 0.80 |
| Pd | 0.86 | 0.79 | 0.79 | 0.78 |
| Cd | 0.95 | 0.76 | 0.76 | 0.76 |
| Hg | 1.00 | 0.75 | 0.75 | 0.74 |
| Pb | 1.20 | 0.69 | 0.69 | 0.69 | g. Substrate Components for Chemical Stability

It is important that the precursor is stable in contact with the substrate, either kinetically, but preferably chemically. The chemical compatibility of most candidate systems has not been determined, so this must be done either experimentally or through calculation. It is likely, however, that because the cation sublattice is observed to be rigid, it will likely have low reactivity.

The precursor composition can preferably have a cationic component that is the same as the substrate. For example, silicon-containing phases for a film on silicon. Specifically, silicon-containing oxynitrides such as CaFe$_2$O$_4$-type, Scheelite, pseudowollastonite, and garnet have been predicted to exist. The addition of the substrate cationic component to the precursor and product LnMO$_x$ film increases the likelihood of interfacial thermodynamic stability. Oxygen has been demonstrated to be at least partially replaced by nitrogen in olivine-type and beta-K$_2$SO$_4$-type oxides.

2. Anion

Rocksalt-based and fluorite-based LnX$_y$ and some rocksalt-based TrX$_y$ have very high intersolubility, so extensive anion alloying is possible. For example, in a TrX$_y$ system, a single solid solution Hf(C,N,O) phase exists for HfC+HfN~<=30% (combined). Above this, a two-phase mixture of HfO and Hf(N,C) is observed, but these two phases are topotactically compatible, such that they consist only regions with differing anion ordering. An infinite variety of anion stoichiometries exists, such that it is not possible to enumerate all possibilities. The following gives guidance for the selection of appropriate anion stoichiometry for a given system.

The most important aspect of this is that the lattice parameter can be tailored to minimize the change in lattice dimension upon conversion to full oxide. Note that the relative changes in lattice dimension are mostly for pure compounds. For anion alloys, this can be reduced. For example, the nitrogen to fluorine ratio of nitrofluorides also can be tailored to yield a nearly zero change in lattice dimension upon conversion. Nitride fluorides can be regarded as pseudo-oxides, because the charge of a fluoride and a nitride is equivalent to two oxides, and all have similar ionic radii. Many nitride-oxide-fluorides have been found, all having very similar fluorite-derived crystalline structures, and very similar cube-lattice dimensions. Carbon can be further substituted for nitrogen. Anion doping can also control anion mobilities in the precursor. Nitrogen in ZrO$_2$ creates oxygen vacancies.

3. Optimization

It is clear from the preceding that it is possible to tailor the lattice parameter to an appreciable extent for both precursor and product (oxide) phase. It is possible for one skilled in the art and using this method to devise a good lattice fit to many different substrates and films for both precursor and product, eliminating strain-related defects that may be introduced during conversion if the change in lattice dimension is otherwise large.

K. Conversion Process

The anionic diffusivities of compositions can typically be found in the literature, as the result of computer simulation studies of oxygen migration, or can be interpolated from knowns or predicted based on empirical rule sets. In any case, films resulting from a particular process will exhibit some variation due to microstructural differences, and these must be taken into account. For any given system, parameters must be optimized.

The topotactic oxidation reaction for a given system must take place within a certain temperature range in order to maximize the crystalline quality of the product. If the temperature is too low, pores or cracks may form, for example if the mobility of one anionic component is significantly larger than that of the other. At excessively high temperatures, the reaction may occur too quickly for a topotactic oxidation front to be maintained. Or, excessive amounts of oxygen may diffuse through the oxidized layer to react with the oxidation-sensitive substrate. Additionally, there is a critical thickness below which stress-induced mosaic is less likely to form.

Electrical resistivity is a good primary measure of the appropriate temperature for transformation. In log σ vs 1/T plots, a break is observed around 550-600° C. for lanthanide oxides. This is the region where ionic conductivities begin to contribute appreciably to the electrical conductivity. Anion exchange takes place preferably between 0 and 1000° C., more preferably between 200 and 800° C., and most preferably between 300 and 600° C.

L. $LnO_z$ Properties

1. Electrical

Lanthanide oxides are fairly electrically conductive. Thus, they can serve as a bottom electrode in many devices It may be necessary in other cases to treat the product films in an oxygen ambient, and the consequences of high temperature vacuum annealing on these materials is a process consideration. At very low pressures, sesquioxides are n-type semiconductors, with σ proportional to $p_{O2}^{-1/6}$, determined from the reaction: $P_0^{2-} <--- > \frac{1}{2}O_2 (g) + []_0 + 2 e^-$.

It is important to note the electrical conductivity of $LnO_z$ films in relation to the conditions for processing of functional films. It is this final oxygen content that will determine the resistivity of a template film, which may or may not be used as a conductive bottom electrode. An example from the art of the wide range of resistivities observed in a $LnO_z$ film as a function of oxygen content is shown in the art in FIG. 20 for $CeO_2$. Hysteresis of the oxygen content and thus resistivity of $LnO_z$ films must also be taken into account in relation to the processing conditions for functional oxide films using said $LnO_z$ layers. Trapped charge is relaxed out at ~350° C., and oxygen mobility begins to contribute appreciably to charge transport at ~500° C.

Figure 20:
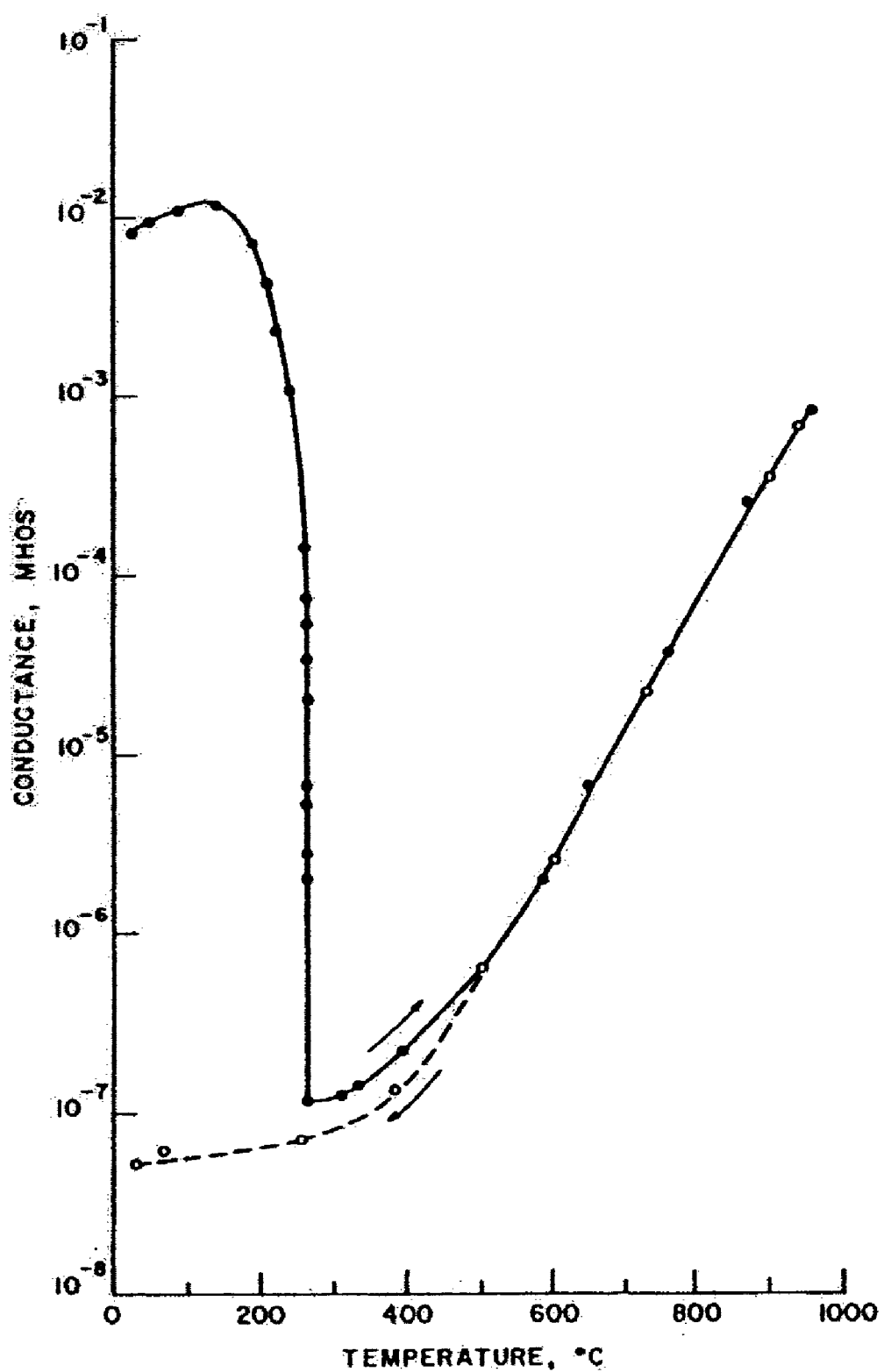
FIG. 20 is a plot of the change in electrical conductance with temperature for reduced $CeO_2$. Electronic defects are relaxed after anneal. This type of measurement is ideal for determining the temperature appropriate for topotactic anion exchange for a given system.

Electrical conductivity in $Ln_nO_{2n-2}$ single crystals varies greatly with n, over eight orders of magnitude. $LnO_z$ phases are mixed valence semiconductors, p-type from z=1.5-1.75, and n-type from z=1.75-2. Conductivity is highest in $LnO_z$ compositions nearest z=1.75, for both ordered and disordered phases, which would have a roughly equal distribution of $Ln^{3+}$ and $Ln^{4+}$ ions and a maximum of electronic disorder. p-type conductivity arises from oxygen excess, with σ proportional to $p_{O2}^{+1/5.4\pm0.1}$ for Ln=Ho, Eu, and Y. The electrical conductivity or $LnO_z$ shows a knee at 550-600° C. in σ vs 1/T plots, indicating a significant ionic contribution to transport above those temperatures. FIG. 20 shows a change in room-temperature conductance of five orders of magnitude for a $CeO_2$ crystal reduced by heating in vacuum. Electrical transport properties of an epitaxial $LnO_z$ film are controlled strongly by the processing conditions. It is expected that in most cases, a separate oxygen anneal will not be required to stabilize the properties of the $LnO_z$ template film.

For visual indication, color may be a good indication of the oxidation state of the product films. Stoichiometric lanthanide sesquioxides are light pastel in color, except for $PrO_2$ and $TbO_2$, which are black and red. Mixed valence intermediate oxides, and the higher oxides of Ce, Pr and Tb, are all deep colors.

Precursor conductivity may also be important. $LnH_2$ are metallic conductors (except $EuH_2$ and $YbH_2$). Better conductors than the metals by at least 2× each. Nitrides are known to be good electrical conductors.

2. Thermodynamic Stability of $LnO_z$

Figure 21:
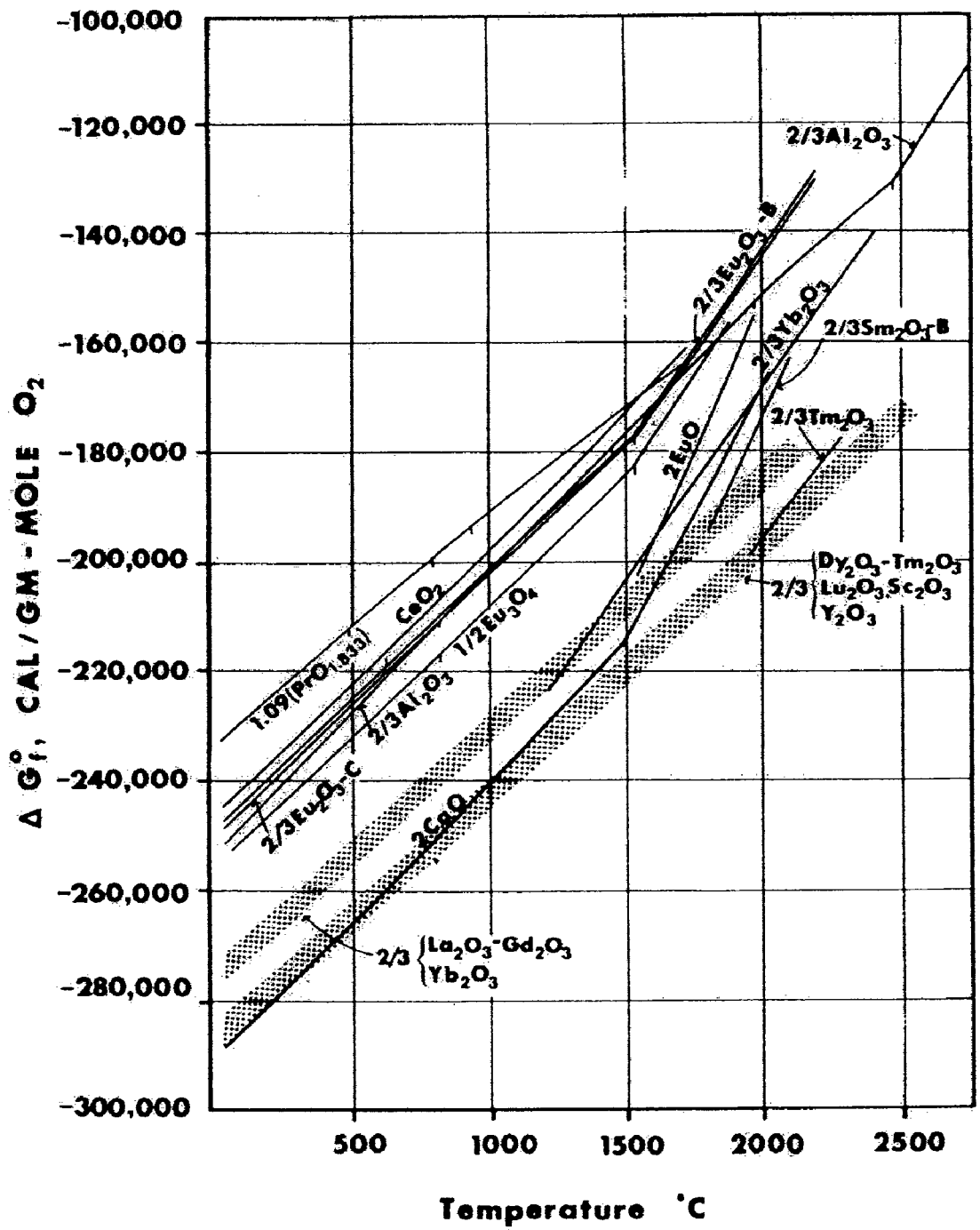
FIG. 21 is an abbreviated plot of formation energies for some $LnO_z$, in comparison to common oxides. They are similar in this respect to calcium or aluminum.

The lanthanide oxides are some of the most thermodynamically stable oxide compounds known. Their free energies of formation are on the order of those of $Al_2O_3$ and CaO, as is known and shown in the art in FIG. 21. This implies that it may be possible in many cases to grow lanthanide oxides or reduced lanthanide oxides directly on elemental or other oxidation-sensitive substrates, although this is always determined by the specifics of a given film deposition process. It is also possible to grow an anion-alloyed oxide on a sensitive substrate, which can later be topotactically transformed to the full oxide.

3. Magnetism

Most $LnX_y$ have a nonzero magnetic moment, which may be an important factor in selecting an appropriate composition for a given application. It is likely that the preferred elements for use in the creation of explicitly nonmagnetic layers will be lanthanum and lutetium, and their alloys with scandium, yttrium, zirconium, and hafnium. This does not exclude, however, the other lanthanides, as a template film created by this technique may be so thin as to obviate the consideration, or alternatively magnetism may not be a concern in some cases of the use of such a template layer. It is considered that only an ultra-thin film may be needed in order to obtain the oxide templating functionality. In such cases, adverse impact of the magnetic susceptibility of the template layer are mitigated.

Magnetic moments don't change appreciably on hydridization, indicating that the f electrons don't take part in bonding with hydrogen. But, decreased magnetic ordering upon hydridization indicates removal of conduction band electrons. For example, all $LnH_2$ and $LnH_3$ are magnetic, except for La and Lu, and Yb, with low magnetic susceptibilities.

4. Orientation Control

The orientation of films during deposition is controlled via the usual means for epitaxial deposition. Some additional concerns exist. Orientation control of nitrides through deposition conditions is possible, regardless of substrate orientation, due to surface energetics. $LnO_z$ are known to grow (110) on (100) silicon, even though (100) would be a better lattice fit. The topotactic anion exchange method may be an easy route to (100) $LnO_z$/(100) Si.

5. Electronic Defect Relaxation $CeO_2$ crystals retain a high electrical conductivity and high concentration of color centers after re-oxidation. But, on heating to 350° C. or higher in air is required to relax the trapped charge, reducing electrical conductivity and removing color centers. See FIG. 20.

6. Atmospheric Stability

Reduced lanthanide oxides are very hygroscopic. For example, $CeO_{1.67}$ exposed to air at room temperature reoxidized to nearly $CeO_2$ in a rapid exothermic reaction. The same reaction in a high-humidity atmosphere results in disintegration of the crystal into powder perhaps due to the formation of a hydroxide, or more likely because the stable form is A-type. Thus, it is anticipated that the most reasonable implementations of the method will involve in situ anion exchange.

7. Tell-signs

It is possible to detect whether a device has been manufactured using the topotactic anion exchange method, versus a modified direct oxide deposition technique. The major tell-sign is that there will be some fraction of the original anionic component remaining in the film. This will vary with the exact cationic composition and lattice structure of a film in question, but the value can be determined from the stoichiometry of the cationic components, as determined experimentally, considering the solubility limits for the particular system. In some cases, the anionic remainder may vary, based on the thermal and atmospheric history of a film. Even in the case of thermal and atmospheric treatments designed to mask the process by which a film was grown and converted, trace amounts of the initial anionic species will remain, and these can be detected by a chemical probe technique having high spatial resolution. Other microstructural tell-signs are also left behind after the conversion process, and a microstructural examination of such a film, for example by transmission electron microscopy, specifically using a chemical analysis technique such as electron energy dispersive spectroscopy, will reveal these features.

The presence or absence of an FCC cation sublattice can be detected by standard x-ray or electron diffraction techniques, specifically, by the presence or absence of certain reflections. Intensity is dominated by the cation sublattice. Lanthanides have a much higher scattering cross-section than oxygen or other nonmetal components, and diffracted intensity is modulated more strongly by the lanthanide components than by the lighter, nonmetal (anionic) components. In some cases, slight lattice distortions will also modulate diffracted intensity, and the effects can be separated, as diffraction physics are well understood. Additionally, the applicable crystal structures are known, and others can be deduced or determined from diffraction data.

M. General Method of Fabrication

Those skilled in the art of thin film deposition techniques can duplicate the method by using the appropriate source materials, and by controlling the timing of non-metallic species bearing gas delivery. The general method of fabrication differs from the usual methods of oxide thin film deposition in the composition of source materials, and in the timing of delivery of material containing the non-metallic components of the film, and in the subsequent thermal treatment under oxidative conditions to exchange the non-metallic species for oxygen in the film. The usual methods of oxide film fabrication are chemical vapor deposition (CVD), pulsed laser deposition (PLD), chemical solution deposition (CSD), molecular beam epitaxy (MBE), sputtering, and so on.

Depending upon the specific film growth technique, an overpressure of the appropriate vapor source bearing non-metallic species will be required to stabilize the non-oxide or low-oxide precursor material, which will vary according to the deposition technique and deposition temperature. For embodiments of this invention, an infinite variety of possible precursor and product compositions exists, such that it is not possible to enumerate all of the possibilities, but a given system can be optimized by one skilled in the art. The lanthanide and other metals are delivered in the fashion usual for each given technique, and in ratios chosen to result in a film of the desired stoichiometry. A wide range of process parameters is applicable for this variety of compositions. The non-metallic components can be delivered together with the metallic components from the same source or separate from them, or in some cases both. Generally, thermodynamic considerations and direct experimentation will be required to determine the optimal process parameters, such as substrate temperature for deposition, substrate temperature for topotactic anion exchange, cation stoichiometry, non-metallic stoichiometry, feed gas overpressures, if any, vacuum level for various stages, time required for anion exchange, and the process parameters specific to the techniques. The approximate process parameters for the deposition stage via each given deposition technique will be apparent to those skilled in the art, and ample examples of deposition parameters for oxide and non-oxide films are available in the literature.

A film deposition system typically consists of a vacuum chamber, a heated substrate stage, and a vapor source. The substrate is mounted on the heated stage. The air is evacuated from the system to a vacuum level appropriate to the deposition method, which can range from ambient pressures for CSD to about 6b 1E-10 Torr for some MBE. The substrate stage is heated to the desired temperature, and sometimes some type of pre-deposition thermal and chemical treatment is performed on the substrate, usually to remove surface impurities. An appropriate background gas feed is begun prior to deposition, if desired, in order to stabilize the desired product film phase. This can consist of any of a number of gases, for example oxygen, nitrogen, fluorine, or carbon monoxide. The lanthanide and other metals, and in some cases also some portion of the non-metallic components, are then delivered to the target by an appropriate vaporization technique—for example by laser ablation of a solid target puck, by sputtering of a solid target puck, by evaporation and delivery of a chemical vapor source, or by evaporation from elemental sources. Once deposition has completed, the sources are terminated or closed, and the substrate stage is cooled, typically with an overpressure of gases that stabilizes the desired product phase. In some methods, the substrate is quenched.

Topotactic anion exchange occurs subsequent to film deposition, preferably in the same chamber, but sample storage between deposition and anion exchange is possible. The substrate is heated to the desired temperature, preferably in an ambient that maintains the stability of the precursor, but heating may also be in some other ambient, such as an oxidizing one. Once the desired temperature is reached, feed gases of appropriate ratios are introduced into the chamber, such that topotactic anion exchange occurs to result in the desired oxide film. In a preferred embodiment, the topotactic anion exchange is performed immediately after deposition, once the substrate is cooled to the desired exchange temperature. In yet another preferred embodiment, the background gases are changed smoothly over a period of time from those for which the precursor is stable to ones for which the product oxide is stable, such that the exchange takes place in a continuous, rather than an abrupt, manner.

It is important to note that low oxides of lanthanides and most lanthanide salts are susceptible to reaction with air and water, so that for analysis of precursors, such as by x-ray diffraction, must be performed after either applying a capping layer, or under inert gas or vacuum. Such methods will be familiar to those skilled in the art. For feed gases bearing the non-metallic film components, overpressures spanning a very wide array of pressures are possible, and will depend on the chemistry of a given situation. In some cases, more active gases than elemental gases may be required.

N. Possible Embodiments of the Invention

Figure 22:
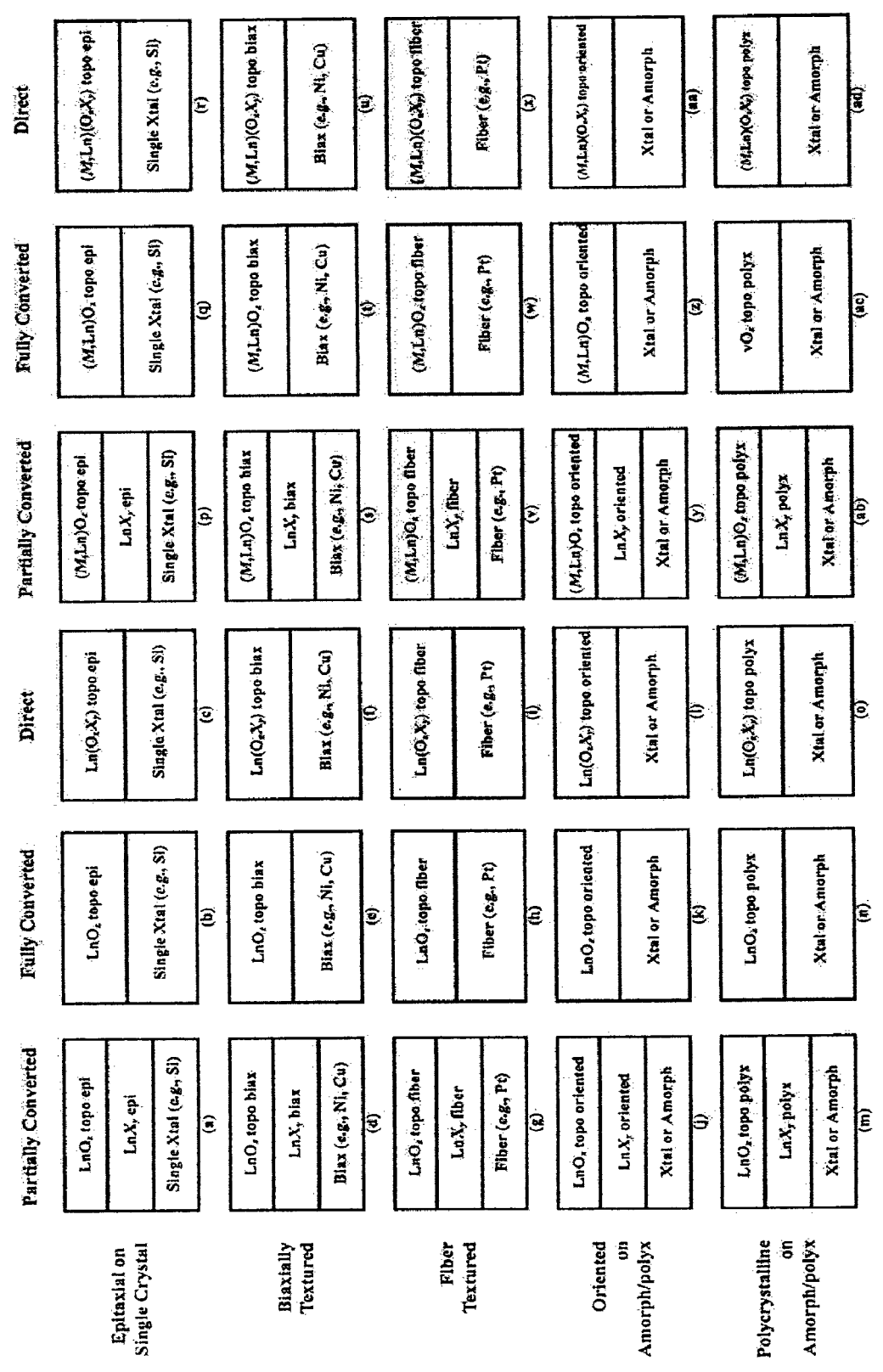

The mechanism of topotactic anion exchange is broadly applicable in a wide variety of applications, and enables a large number of new devices, consisting of layers of specific composition and morphology. This invention entails typically a single deposition of a layer that is chemically stable in contact with the substrate at the time of barrier-layer deposition, and after a brief oxidation anneal, is stable in contact with the epitaxial oxide film deposited thereon at the time of its deposition. Individual crystalline grains of precursor material converted to the product oxide retain their crystalline texture and orientation. Thus, precursors of many different crystalline textures can be used for the fabrication of devices. A matrix of some possible device geometries is shown in FIG. 22. These are given by way of illustration of the invention, and not by way of limitation thereof The method of fabrication and compositions of matter used here to fabricate such devices are in all cases believed to be covered by this disclosure, to the extent that fabrication utilizes anion exchange topotaxy. Figure abbreviations are as follows: amorph—amorphous, biax—biaxially textured, epi—epitaxial, fiber—fiber textured, Ln—lanthanide or lanthanides, M—metal or metals, polyx—polycrystalline, single xtal—single crystalline, topo—topotactic, X—anion or anions, xtal—crystalline.

Note that for purposes of a substrate surface, an epitaxial film is equivalent to a single crystal. All of the devices are believed to be useful as an oxide template and barrier layer for subsequent deposition of oxides, and in some cases have separate functionality themselves. Some items are left blank but this is not an indication of absence of particular embodiments, rather, because the number of possible embodiments and their utility is effectively infinite, no attempt to enumerate every possibility is attempted, and specific functionality is noted only for selected items. Many embodiments, or the functionality they provide, are applicable to many others, as will be obvious to one skilled in the art. For example, (t.1) would also be useful with a single crystal surface, or in some cases a polycrystalline surface. Many embodiments are also useful on non-metal surfaces, for example as an oxygen barrier on a previously-deposited but oxygen-permeable oxide layer.

A description of some possible embodiments is listed below. Note that the brief descriptions are given for only selected embodiments, and are meant to indicate the general usefulness of the method, and to describe some specific device geometries.

(a) Partially converted epitaxial lanthanide oxide film on a single crystal surface
- (a.1) $Ln_2O_3/Ln(N,O,F)/Si$
  - (a.1.ii) $EU_2O_3/Eu(N,O,F)/Si$—epitaxial fit of precursor and product for an oxide template layer on silicon. Precursor can be used as an electrode
  - (a.1.iii) Eu2O3/EuO/Si—Eu2O3 as converted from EuO (b) Fully converted epitaxial lanthanide oxide film on a single crystal surface
- (b.1) Gd(O,F)/Si for epitaxial fit for both precursor and product
- (b.2) $Eu_2O_3$/Si—as converted from EuO/Si
- (b.3) Eu2O3/Si—as converted from Eu(N,O,F)/Si
- (b.4) La2O3/Si—as a gate oxide, or epitaxial template layer for deposition of functional oxides
- (b.5) Ln2O3/Si—useful for fabrication of Ln2O3 MEMS devices, or for epitaxial template layer for oriented-oxide MEMS devices
- (b.6) Ln2O3/Si—for fabrication of oxide membranes
- (b.7) Ln2O3/Si—from Ln(N,P) to minimize change in lattice parameter upon conversion
- (b.8) Ln2O3/Si—from Ln(N,F) to minimize change in lattice parameter upon conversion
- (b.9) Ln2O3/Si—from Ln(C,N,O,F,P,S), as a component in an all-oxide electronic device stack
- (b.10) Ln2O3 (001)/Si (001)—as a method to achieve (001) Ln2O3 on (001) Si without the need for employing a vicinal surface
- (b.11) Ln2O3/Si—as an epitaxial oxide template for deposition of a ferroelectric material for an epitaxial ferroelectric capacitor structure.

(c) Directly deposited epitaxial reduced lanthanide oxide-salt film on a single crystal surface (d) Partially converted biaxially textured lanthanide oxide film on a biaxially textured surface
- (d.1) $CeO_2$/CeN/Ni—good epitaxial fit for precursor and surface, and for product oxide and YBCO for subsequent deposition thereon
- (d.2) $CeO_2$/CeN/Cu—good epitaxial fit for precursor and surface, and for product oxide and YBCO for subsequent deposition thereon (e) Fully converted biaxially textured lanthanide oxide film on a biaxially textured surface
- (e.1) $CeO_2$/Ni—from CeN, good epitaxial fit for precursor and surface, and for product oxide and YBCO for subsequent deposition thereon
- (e.2) $CeO_2$/CeN/Cu—from CeN, good epitaxial fit for precursor and surface, and for product oxide and YBCO for subsequent deposition thereon
- (e.3) $Lu_2O_3$/Lon/Ni or $Lu_2O_3$/Lon/Cu—good epitaxial fit of product to substrate (f) Directly deposited biaxially textured reduced lanthanide oxide-salt film on a biaxially textured surface (g) Partially converted fiber-textured lanthanide oxide film on a fiber textured surface (h) Fully converted fiber-textured lanthanide oxide film on a fiber textured surface
- (h.1) $Lu_2O_3$/Pt—from Lon, fiber textured platinum present on the surface of a three-dimensional object, such as a turbine blade, provides an epitaxial template and adhesion layer to oriented thermal barriers, such as $ZrO_2$ or layered perovskite-based materials having low thermal conductivity, providing good epitaxial fit to $ZrO_2$ and orientation control of layered oxide.
- (h.2) $Dy_2O_3$/Pt—from $DyC_2$, fiber textured platinum present on the surface of a three-dimensional object, such as a turbine blade, provides an epitaxial template and adhesion layer to oriented thermal barriers, such as $ZrO_2$ or layered perovskite-based materials having low thermal conductivity, providing good epitaxial fit to $ZrO_2$.

(i) Directly deposited fiber-textured reduced lanthanide oxide-salt film on a fiber textured surface (j) Partially converted oriented lanthanide oxide film on a polycrystalline or amorphous (non-templating) surface
- (j1) Oriented precursor films of Ln(C,N,F,P,S), etc. can be deposited by techniques such as ion beam assisted deposition (IBAD), or by controlling deposition parameters such that the precursor adopts a certain orientation due to process parameters, as is observed for some nitrides. The product gains have the same orientation as the grains of the precursor from which they are converted.

(k) Fully converted oriented lanthanide oxide film on a polycrystalline or amorphous (non-templating) surface
- (k.1) Oriented precursor films of Ln(C,N,F,P,S), etc. can be deposited by techniques such as IBAD, or by controlling deposition parameters such that the precursor adopts a certain orientation due to process parameters, as is observed for some nitrides. The product gains have the same orientation as the grains of the precursor from which they are converted.

(l) Directly deposited oriented reduced lanthanide oxide-salt film on a polycrystalline or amorphous (non-templating) surface
- (l.1) Oriented precursor films of Ln(C,N,O,F,P,S), etc. can be deposited by techniques such as ion beam assisted deposition (IBAD), or by controlling deposition parameters such that the precursor adopts a certain orientation due to process parameters, as is observed for some nitrides. The product gains have the same orientation as the grains of the precursor from which they are converted.

(m) Partially converted polycrystalline lanthanide oxide film on a polycrystalline or amorphous (non-templating) surface (n) Partially converted polycrystalline lanthanide oxide film on a polycrystalline or amorphous (non-templating) surface (n.1) $Ln_2O_3$ from, e.g., LnSe, as a fuel cell electrode. A composition having a large change in lattice parameter through conversion, to intentionally introduce porosity, can increase the surface area and enhance the efficiency of such a layer.

(o) Directly deposited polycrystalline reduced lanthanide oxide-salt film on a polycrystalline or amorphous (non-templating) surface (p) Partially converted epitaxial lanthanide-metal oxide film on a single crystal surface (p.1) $ABO_3/ABX_y/Si$—Perovskite precursor and product as an epitaxial buffer layer and oxygen barrier, cation barrier, and potentially bottom electrode. Oxygen vacancy diffusion in some perovskites has been demonstrated to be very low. Only the surface must be oxidized, perhaps as little as a single monolayer, or several unit cells. Some nitride perovskites are known.

(q) Fully converted epitaxial lanthanide-metal oxide film on a single crystal surface (q.1) $(La,Y)_2O_3/Si$ as a nonmagnetic epitaxial oxide template or as a surface for silicon-on-insulator silicon deposition (q.2) $LnMnO_3/Si$—as an epitaxial multiferroic (q.3) $LnMn_2O_5/Si$—as an epitaxial multiferroic (q.4) $(Ln,W)_2O_3/Si$—to enable integration of epitaxial phosphor materials and laser hosts with silicon and other single crystal substrates (q.5) $(Ln,Si)_2O_3/Si$—to enhance chemical stability of film with substrate (r) Directly deposited epitaxial reduced lanthanide-metal oxide-salt film on a single crystal surface (r.1) $(La,Zr)(N,O/Si$—useful as a bottom electrode and epitaxial oxide template (s) Partially converted biaxially textured lanthanide-metal oxide film on a biaxially textured surface (s.1) $(La,Zr)_3O_7/(La,Zr)N/Ni$—good epitaxial fit of product to YBCO for subsequent deposition thereon.

(t) Fully converted biaxially textured lanthanide-metal oxide film on a biaxially textured surface (t.1) $(Ce,Ca)_2O_3/Ag$—from $(Ce,Ca)_2(C,N,O,F,P,S)$ to minimize temperature required for deposition, for substrates with low melting temperatures (t.2) $(Ce,Y)_2O_3/Ni$—from $(Ce,Y)_2(C,N,O,F,P,S)$ to utilize doping to suppress phase transitions in product phase, stabilizing the cubic form (u) Directly deposited biaxially textured reduced lanthanide-metal oxide-salt film on a biaxially textured surface (v) Partially converted fiber-textured lanthanide-metal oxide film on a fiber textured surface (w) Fully converted fiber-textured lanthanide-metal oxide film on a fiber textured surface (x) Directly deposited fiber-textured reduced lanthanide-metal oxide-salt film on a fiber textured surface (y) Partially converted oriented lanthanide-metal oxide film on a polycrystalline or amorphous (non-templating) surface (z) Fully converted oriented lanthanide-metal oxide film on a polycrystalline or amorphous (non-templating) surface (aa) Directly deposited oriented reduced lanthanide-metal oxide-salt film on a polycrystalline or amorphous (non-templating) surface (bb) or (ab) Partially converted polycrystalline lanthanide-metal oxide film on a polycrystalline or amorphous (non-templating) surface (cc) or (ac) Partially converted polycrystalline lanthanide-metal oxide film on a polycrystalline or amorphous (non-templating) surface (dd) or (ad) Directly deposited polycrystalline reduced lanthanide-metal oxide-salt film on a polycrystalline or amorphous (non-templating) surface Other embodiments not related to specific substrate orientations are listed below:

(1) Backscatter reduction in electron beam lithography (2) LnOz as an oxide surface for the deposition of epitaxial films on silicon, especially for the purpose of allowing smaller features to be patterned through the reduction in backscattering of electrons used for electron beam lithography. This is achieved through the use of an ultrathin oxide template film. The electron backscattering cross-section of silicon is much lower than that of many oxides that are used as single crystalline substrates for the deposition of epitaxial oxide films. This benefit can also be realized in other cases, not described in detail here, for which a biaxially textured, polycrystalline, or even amorphous film is desired. The proximity effect of electron beam lithography using this technique is also commensurately reduced. LnOz as an oxide surface can be used in the reverse manner for metallic or other substrates which have a high electron backscattering cross-section. A thick LnOz film of such a thickness that the intensity of backscattered electrons is reduced over that which would occur for bare metal, can be used to remove limitations on resolution of backscattered electrons for films on such substrates, including epitaxial, biaxially textured, polycrystalline, and amorphous. The proximity effect of electron beam lithography using this technique is also commensurately reduced.

(3) A textured substrate for the deposition of an oxide template, on which a layered complex oxide will grow with its long axis perpendicular to the surface at all points on the surface of a complex three-dimensional object. The most significant application for such an oxide template film would be for use as a thermal protection barrier for turbine blades. The structure would consist of a complex three-dimensional object such as a turbine blade as the substrate. On this substrate surface, some combination of layers that would yield a fiber textured layer on the surface would be deposited, for example a bond-coat of Cr or MoCrAlY, with platinum deposited over that. Annealing Pt under specific thermal conditions reproducibly yields a Pt layer having (111) surface texture. Previous work has demonstrated that a pseudocubic oxide, SrRuO3, can be grown on (111) Pt to adopt the texture of the Pt through local epitaxy, and that a layered complex oxide will grow epitaxially on it. Other methods of obtaining surface texture are possible. This can be exploited in this example through the growth of a LnX precursor, converting it to LnOz, and depositing an appropriate layered complex oxide having the desired thermal and other properties. Namely, in the case of thermal protection for turbine blades, it should be stable at elevated temperatures and have an appropriately low thermal conductivity. Layer order: Layered complex oxide/fiber textured LnOz/fiber textured Pt/bond coat/3D object. The layered complex oxide need not necessarily be oriented with its layering axis perpendicular to the substrate surface, although this would provide the best thermal protection. Even a 45°- oriented film would provide better thermal protection than a polycrystalline protective film, both due to the preferred orientation of the layers, and also due to the elimination of randomly oriented grain boundaries, which are paths for diffusion and transport. The basis for choice of layered complex oxides for thermal protection is based upon phonon scattering. Each layer in the layered complex oxide acts as a scatterer for phonons (lattice vibrations), which are a prime carrier of heat. This theory of thermal resistance was developed by Kapitza. A second carrier of heat is electrons, and this should also be taken into consideration in selecting an appropriate layered complex oxide for thermal protection. Additionally, it may in some cases be advantageous to fabricate a structure that will conduct heat very well in the direction perpendicular to a substrate surface, but not parallel to it, for example in the case of heat sources near thermally sensitive components. Another possible use of this templating technique would be to design a structure that yielded a layered complex oxide film having its layering axis in the plane of the surface at all points of the surface of a complex three-dimensional object. An additional benefit of this technique is that having a fine grain size of platinum in the fiber-textured platinum film, and thus of the template oxide film on it, is that this would serve to limit the grain size of the layered complex oxide film grown thereon. This can be an important functionality because layered complex oxides tend to have highly anisotropic growth rates, which can lead to roughness in a film with the layering axis tilted away from the surface normal.

(4) $Ln2O3$ can be present as the dielectric layer in a capacitor, can function as an epitaxial oxide template layer for deposition of a ferroelectric layer in an epitaxial stack structure such as a capacitor.

(5) When a template surface is a cubic perovskite or other structure presenting the same type of oxygen coordination on the surface, epitaxy is facilitated.

(6) It is well known that layered crystalline phases and superlattices possess much lower thermal conductivity than isotropic and homogenous phases. It is also known that grain boundaries decrease thermal migration as well. The mechanism for all of these phenomena is called the Kapitza resistance, and is the result of scattering of phonons by internal interfaces. Superlattices and layered phases have extremely high densities of interfaces, and thus lowered thermal conductivity. It is also well known that a polycrystalline thin film of platinum (and other noble metals) will adopt a preferred surface plane orientation, and thus biaxial texture, after appropriate thermal treatment. It is also known that it is possible to use this biaxially textured platinum surface for the deposition of a biaxially textured film, which adopts its texture via local epitaxy with individual grains. Thus, it is possible to deposit a LnX film on a complex three-dimensional object that has a specific crystalline surface orientation at all points on the three-dimensional surface. This can be used to deposit a layered phase or superlattice material, on the object surface, that has the same orientation with respect to the local surface tangent at all points. The primary use for this device is in the application of a thermal barrier coating on a device such as a turbine blade. Layered phase are used for their low thermal conductivity. This device would allow for the preferred orientation of a layered phase, such as a Ruddlesden-Popper phase, with a resultant dramatic increase in thermal insulative performance. It may also be possible to deposit a lanthanide oxide, transition metal oxide, or other metal oxide film directly on a textured platinum surface. The oxide film would preferably have a component of platinum or other noble metal, for example $La2Pt2O7$. It may also be possible to deposit the superlattice phase in the desired oriented fashion directly on a textured platinum layer, although an adhesion layer is likely to improve performance.

(7) Epitaxial, rocksalt-structured TrN (Tr=transition metal) films have been investigated as barrier metals in devices on silicon, particularly for ferroelectric capacitors, due to their low electrical resistivity and low Schottky barrier. In typical investigations of these barrier layers, efforts were made to avoid oxidation of the nitride surface. Such layers could be present beneath the devices described in the claims, to act as barriers.

(8) Tungsten-doped LnOz have uses as phosphors and as laser hosts. Many lanthanide tungstates are known to have fluorite-type structures, many with slightly distorted symmetry, which could possibly be stabilized in a cubic form by epitaxy. Even transformation to a non-cubic form could be acceptable, as it could result in for example an oriented tetragonal structure with c perpendicular to the substrate surface, or with a domain structure in-plane, such as mixed tetragonal a and c, or slight monoclinic distortions. With either of these domain structures would probably be effectively equivalent to a cubic film, as the distortions are small and they are not displacive, so that domain walls should not have transport properties appreciably different than the domains.

While the specific embodiments have been illustrated and described, numerous modifications can be made to the present invention, as described, by those of ordinary skill in the art without significantly departing from the spirit of the invention. The breadth of protection afforded this invention should be considered to be limited only by the scope of the accompanying claims.

What is claimed is:

1. A functional laminate structure, comprising:
a substrate having a surface;
a crystalline metal-nonmetal layer, comprising a metal and a nonmetal; and
a first crystalline metal-oxide layer, comprising a metal constituent, wherein
the metal-nonmetal layer is selected from the group consisting of $AX_{0.3}$, AX, $AX_2$, $AX_3$, and compounds consisting of combinations of said materials,
the first metal-oxide layer is topotactic with said metal-nonmetal layer;
wherein the metal-nonmetal layer is located between the surface and the metal-oxide layer and X comprises a member from the group consisting of H, C, OH, F, P, S, Cl, Se, Br, Te, and combinations thereof.

2. The structure of claim 1, wherein the surface is substantially silicon.

3. The structure of claim 1, wherein the metal-nonmetal layer has a first lattice parameter and the first metal-oxide layer has a second lattice parameter wherein the relative difference between the first and second lattice parameters is less than approximately 5% for minimizing defects.

4. The structure of claim 1, wherein the first metal-oxide layer is substantially free of mosaic spread.

5. The structure of claim 1, wherein the metal constituents of the metal-oxide layer are those of the metal-nonmetal layer.

6. The structure of claim 1, wherein X comprises a member from the group consisting of H, C, F, S, Cl, Se, Br, Te, and combinations thereof.

7. The structure of claim 1, wherein X comprises at least two members from the group consisting of N, F and S.

8. The structure of claim 1, wherein X comprises a combination of at least two elements from the group consisting of H, C, N, F, S, Cl, Se, Br and Te.

9. The structure of claim 1, wherein
A is selected from the group consisting of the lanthanide elements (Ln): Sc, Y, La, Ce, Pr, Nd, Sm, Eu, Gd, Tb, Dy, Ho, Er, Tm, Yb, and Lu, and combinations, alloys, and doped substituents thereof.

10. The structure of claim 9, wherein X comprises between 0 and 80% oxygen.

11. The structure of claim 9, wherein the metal constituents of the metal-nonmetal layer are not those of the first metal-oxide layer.

12. The structure of claim 9, wherein a second metal-oxide layer is formed epitaxially over said first metal-oxide layer.

13. The structure of claim 9, wherein the first metal-oxide layer comprises a metal-oxide, the metal-oxide is selected from the group consisting of AO, $A_2O_3$ and $AO_2$, doped substituents thereof, and oxygen deficient versions thereof.

14. The structure of claim 9, wherein the first metal-oxide layer is selected from the group consisting of: $Ln_2Tr_2O_7$, $LnTrO_4$, $(Ln,Tr)_2O_3$, $(Ln,Tr)O_2$, $(Ln,Tr)O_{2-d}$, and compounds consisting of combinations of said materials, wherein d=0 to 0.5, Tr represents a transition metal, LN represents a lanthanide element and fractions of Ln and Tr may be any values summing to one.

15. The structure of claim 9, wherein the metal-nonmetal layer is less than two nanometers in thickness.

16. The structure of claim 9, wherein the interface between the metal-nonmetal layer and the first metal-oxide layer is diffuse.

17. The structure of claim 9, wherein the interface between the metal-nonmetal layer and the first metal-oxide layer is diffuse, such that only a compositional gradient of nonmetal constituent concentrations exists through the thickness of the structure.

18. The structure of claim 9, wherein the surface is substantially monocrystalline.

19. The structure of claim 9, wherein the surface is substantially biaxially textured or fiber textured.

20. The structure of claim 9, further comprising at least one functional electromagnetic layer.

21. The structure of claim 9, further comprising an epitaxial oxide layer.

22. The structure of claim 9, wherein X comprises at least two of the group consisting of N, F, O, S, and combinations thereof.

23. The structure of claim 9, wherein the first metal-oxide layer is epitaxial with the surface.

24. A laminate structure for use as a precursor film to a topotactic oxide structure, comprising:
a substrate having a surface;
a crystalline metal-nonmetal layer, comprising a metal and a nonmetal, wherein
the metal-nonmetal is selected from the group consisting of $AX_{0.3}$, AX, $AX_2$, $AX_3$, and compounds consisting of combinations of said materials; and
A is selected from the group consisting of the lanthanide elements: Sc, Y, La, Ce, Pr, Nd, Sm, Eu, Gd, Tb, Dy, Ho, Er, Tm, Yb, and Lu, and combinations, alloys, and doped substituents thereof; and
X comprises a member from the group consisting of H, C, P, S, Cl, Se, Br, Te, and combinations thereof;
wherein the metal-nonmetal layer is epitaxial with the surface.

25. The structure of claim 24, wherein X further comprises the element F.

26. The structure of claim 24, wherein X comprises at least two of the group of elements consisting of: N, F, O, and S.

27. The structure of claim 24, wherein X comprises between 0 and 80% oxygen.

28. The structure of claim 24, wherein the surface comprises a (001) silicon surface.

29. The structure of claim 24 wherein X comprises Te.

30. The structure of claim 24 wherein X comprises a member from the group consisting of Te and Se and a member from the group consisting of S, O, and F.

31. The structure of claim 24 wherein A comprises Sc and X further comprises N.

32. The structure of claim 24 further comprising an electromagnetic device layer.

33. The structure of claim 24, wherein X comprises a member from the group consisting of H, C, S, Cl, Se, Br, Te, and combinations thereof.

34. The structure of claim 24, wherein X comprises at least two members from the group consisting of N, F, and S.

35. The structure of claim 24, wherein X comprises a combination of at least two elements from the group consisting of H, C, N, F, S, Cl, Se, Br and Te.

36. A functional laminate structure, comprising:
a substrate having a surface, the surface being substantially a (001) silicon surface; and
a crystalline metal-oxide layer;
wherein the metal-oxide is selected from the group consisting of $A_2O_3$ and $AO_2$, and A comprises a member selected from the group consisting of the lanthanide elements: Sc, Y, La, Pr, Nd, Sm, Eu, Gd, Tb, Dy, Ho, Er, Tm, Yb, and Lu, and combinations, alloys, and doped substituents thereof, and
wherein the metal-oxide layer is epitaxial to the silicon surface and has a (001) orientation.

37. The structure of claim 36, wherein the metal-oxide layer is part of an electromagnetic device.

38. The structure of claim 36, wherein the metal-oxide layer is part of a field effect transistor.

39. The structure of claim 36, wherein the metal-oxide layer functions as a gate dielectric oxide.

40. The structure of claim 36, wherein the metal-oxide layer is an epitaxial buffer layer.

41. The structure of claim 36, wherein the metal-oxide layer is ultra thin.

42. The structure of claim 36, wherein the metal-oxide layer has a fluorite, bixbyite or fluorite-derived structure.

43. The structure of claim 36, wherein the metal-oxide layer is directly on the surface.

44. The structure of claim 36, wherein the metal-oxide layer is substantially free of mosaic spread.

45. The structure of claim 36, wherein A comprises a member from the group consisting of Sc, Pr, Sm, Eu, Gd, Tb, Dy, Ho, Er, Tm, Yb, and Lu, and combinations, alloys, and doped substituents thereof.

46. The structure of claim 36, further comprising a functional device layer deposited on the metal-oxide layer.

47. The structure of claim 46, wherein the functional device layer is epitaxial and has a wurtzite structure.

48. The structure of claim 46, wherein the functional device layer is a ferroelectric oxide material.

49. The structure of claim 46, wherein the functional device layer is an epitaxial oxide material.

50. A functional laminate structure, comprising:
a substrate having a surface, the surface being substantially a (001) silicon surface; and
a crystalline metal-oxide layer;
wherein the metal-oxide is selected from the group consisting of AO, $A_2O_3$ and $AO_2$, and A comprises a member selected from the group consisting of the lanthanide elements: Sc, Y, La, Pr, Nd, Sm, Gd, Tb, Dy, Ho, Er, Tm, Yb, and Lu, and combinations, alloys, and doped substituents thereof, and
wherein the metal-oxide layer is epitaxial to the silicon surface and has a (001) orientation.

51. The structure of claim 50, wherein the metal-oxide is selected from the group consisting of AO and $A_2O_3$.

52. A functional laminate structure, comprising:
a substrate having a surface, the surface being substantially a (001) silicon surface; and
a crystalline metal-oxide layer;
wherein the metal-oxide is selected from the group consisting of AO, $A_2O_3$ and $AO_2$, and A comprises a member selected from the group consisting of the lanthanide elements: Sc, Y, La, Pr, Nd, Sm, Eu, Gd, Tb, Dy, Ho, Er, Tm, Yb, and Lu, and combinations, alloys, and doped substituents thereof, and
wherein the metal-oxide layer is epitaxial to the silicon surface and has a (001) orientation and the metal-oxide layer is directly on the surface.

* * * * *